US012108655B2

(12) United States Patent
Lee et al.

(10) Patent No.: US 12,108,655 B2
(45) Date of Patent: Oct. 1, 2024

(54) ORGANOMETALLIC COMPOUND AND ORGANIC LIGHT-EMITTING DEVICE INCLUDING THE SAME

(71) Applicant: Samsung Display Co., Ltd., Yongin-si (KR)

(72) Inventors: Hyunjung Lee, Yongin-si (KR); Soobyung Ko, Yongin-si (KR); Haejin Kim, Yongin-si (KR); Sujin Shin, Yongin-si (KR); Jaesung Lee, Yongin-si (KR); Junghoon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 689 days.

(21) Appl. No.: 17/318,711

(22) Filed: May 12, 2021

(65) Prior Publication Data

US 2021/0399241 A1 Dec. 23, 2021

(30) Foreign Application Priority Data

May 26, 2020 (KR) ........................ 10-2020-0063269

(51) Int. Cl.
*H10K 85/30* (2023.01)
*C07F 15/00* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC ................. C09K 11/06; C07F 15/0006; C07F 15/0086; H10K 85/346; H10K 85/344;
(Continued)

(56) References Cited

U.S. PATENT DOCUMENTS 6,303,238 B1 * 10/2001 Thompson ........... H10K 50/828 428/917
9,318,725 B2 4/2016 Li
(Continued)

FOREIGN PATENT DOCUMENTS

CN 111087414 A * 5/2020 ................ C07F 1/08
JP 2009-267244 A 11/2009
(Continued)

*Primary Examiner* — Amanda C. Walke
(74) *Attorney, Agent, or Firm* — Lewis Roca Rothgerber Christie LLP

(57) ABSTRACT

An organometallic compound represented by Formula 1 and an organic light-emitting device including the same. The substituents of Formula 1 are the same as described in the specification.

Formula 1

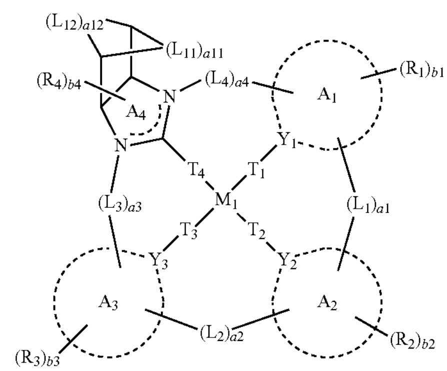

20 Claims, 4 Drawing Sheets

(51) Int. Cl.

| | |
|---|---|
| ***C09K 11/06*** | (2006.01) |
| *H10K 50/11* | (2023.01) |
| *H10K 50/15* | (2023.01) |
| *H10K 50/16* | (2023.01) |
| *H10K 50/17* | (2023.01) |
| *H10K 50/18* | (2023.01) |
| *H10K 101/10* | (2023.01) |

(52) U.S. Cl.
CPC .. *C07B 2200/05* (2013.01); *C09K 2211/1048* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02)

(58) Field of Classification Search
CPC .. H10K 85/342; H10K 85/348; H10K 85/372; H10K 85/341
See application file for complete search history.

(56) References Cited

U.S. PATENT DOCUMENTS

| | | | | |
|---|---|---|---|---|
| 9,461,254 | B2 | 10/2016 | Tsai et al. | |
| 11,228,004 | B2 * | 1/2022 | Layek | C09K 11/06 |
| 2013/0048963 | A1 | 2/2013 | Beers et al. | |
| 2013/0168656 | A1 | 7/2013 | Tsai et al. | |
| 2014/0364605 | A1 | 12/2014 | Li et al. | |
| 2015/0008419 | A1 | 1/2015 | Li | |
| 2017/0012224 | A1 * | 1/2017 | Li | H10K 85/346 |
| 2020/0152891 | A1 | 5/2020 | Li et al. | |
| 2020/0216481 | A1 | 7/2020 | Chen et al. | |
| 2020/0295280 | A1 * | 9/2020 | Jeon | H10K 85/346 |
| 2020/0350505 | A1 * | 11/2020 | Ahn | H10K 85/346 |
| 2022/0112231 | A1 * | 4/2022 | Han | H10K 85/346 |

FOREIGN PATENT DOCUMENTS

| | | | |
|---|---|---|---|
| KR | 10-2015-0043225 | A | 4/2015 |
| KR | 10-2019-0000812 | A | 1/2019 |

* cited by examiner

10

20

30

ORGANOMETALLIC COMPOUND AND ORGANIC LIGHT-EMITTING DEVICE INCLUDING THE SAME

CROSS-REFERENCE TO RELATED APPLICATION

This application claims priority to and the benefit of Korean Patent Application No. 10-2020-0063269, filed on May 26, 2020, in the Korean Intellectual Property Office, the disclosure of which is incorporated herein in its entirety by reference.

BACKGROUND

1. Field

One or more embodiments relate to an organometallic compound and an organic light-emitting device including the same.

2. Description of Related Art

Organic light-emitting devices (OLEDs) are self-emission devices that, as compared with related art devices, have wide viewing angles, high contrast ratios, short response times, and/or suitable (e.g., excellent) characteristics in terms of luminance, driving voltage, and/or response speed, and produce full-color images.

OLEDs may include a first electrode located on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

SUMMARY

Aspects according to one or more embodiments are directed toward novel organometallic compounds and organic light-emitting devices including the same.

Additional aspects will be set forth in part in the description which follows and, in part, will be apparent from the description, or may be learned by practice of the presented embodiments of the disclosure.

According to an embodiment, an organometallic compound is represented by Formula 1.

Formula 1

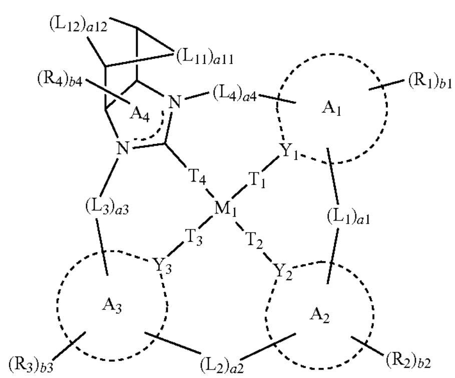

wherein, in Formula 1, $M_1$ may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), Terbium (Tb), and thulium (Tm), $Y_1$ to $Y_3$ may each independently be N or C, $T_1$ to $T_4$ may each independently be a chemical bond, O, S, B(R'), N(R'), P(R'), C(R')(R"), Si(R')(R"), Ge(R')(R"), C(=O), B(R')(R"), N(R')(R"), or P(R')(R"), when $T_1$ is a chemical bond, $Y_1$ and $M_1$ directly bond to each other, when $T_2$ is a chemical bond, $Y_2$ and $M_1$ directly bond to each other, when $T_3$ is a chemical bond, $Y_3$ and $M_1$ directly bond to each other, and when $T_4$ is a chemical bond, $A_4$ and $M_1$ directly bond to each other, two bonds selected from a bond between $M_1$ and $Y_1$ or $T_1$, a bond between $M_1$ and $Y_2$ or $T_2$, a bond between $M_1$ and $Y_3$ or $T_3$, and a bond between $M_1$ and C or $T_4$ may each be a coordination bond, and the other two bonds may each be a covalent bond, $A_1$ to $A_3$ may each independently be selected from a $C_5$-$C_{60}$ carbocyclic group and a $C_1$-$C_{60}$ heterocyclic group, $L_1$ to $L_4$ may each independently be selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*—Se—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', and *—C≡C—*', a1 to a4 may each independently be an integer from 0 to 3, and, when a1 is 0, $A_1$ and $A_2$ are not linked to each other, when a2 is 0, $A_2$ and $A_3$ are not linked to each other, when a3 is 0, $A_3$ and $A_4$ are not linked to each other, and when a4 is 0, $A_4$ and $A_1$ are not linked to each other, $L_{11}$ and $L_{12}$ may each independently be selected from *—C($R_{11}$)($R_{12}$)—*', *—C($R_{11}$)=*', *=C($R_{11}$)—*', and *—C($R_{11}$)=C($R_{12}$)—*', a11 and a12 may each independently be an integer from 1 to 3, R', R", $R_1$ to $R_6$, and $R_{11}$ to $R_{12}$ may each independently be selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$) —P(=S)($Q_1$)($Q_2$), =O, =S, =N($Q_1$), and =C($Q_1$)($Q_2$), b1 to b3 may each independently be an integer from 0 to 20, b4 may be an integer from 0 to 6, neighboring groups of R', R", $R_1$(s) in the number of b1, $R_2$(s) in the number of b2, $R_3$(s) in the number of b3, $R_4$(s) in the number of b4, $R_5$, $R_6$, $R_{11}$, and $R_{12}$ may optionally be linked to each other to form a substituted or unsubstituted $C_5$-$C_{60}$ carbocyclic group or a substituted or unsubstituted $C_1$-$C_{60}$ heterocyclic group,

* and *' may each indicate a binding site to a neighboring atom, at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{30}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$), and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_2$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, —Cl, —Br, —I, and a cyano group, a $C_6$-$C_{60}$ aryl group substituted with at least one selected from deuterium, —F, —Cl, —Br, —I, and a cyano group, a biphenyl group, and a terphenyl group.

According to another embodiment, an organic light-emitting device includes a first electrode, a second electrode, and an organic layer including an emission layer located between the first electrode and the second electrode, wherein the organic light-emitting device includes at least one of the organometallic compound represented by Formula 1.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
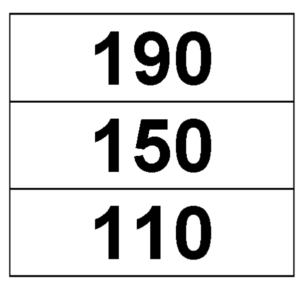
FIG. 1 is a schematic cross-sectional view of an embodiment of an organic light-emitting device.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

According to an embodiment of the present disclosure, an organometallic compound is represented by Formula 1 below:

Formula 1

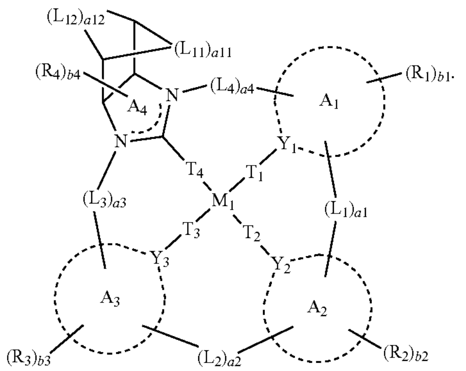

The energy level ($E_{3MC}$) of the triplet metal centered state ($^3$MC state) of the organometallic compound may be higher than the energy level ($E_{3MLCT}$) of triplet metal-to-ligand charge transfer state ($^3$MLCT state) of the organometallic compound.

For example, the energy level of the $E_{3MC}$ of $^3$MC state of the organometallic compound may be about 0.41 kcal/mol or more. For example, $E_{3MC}$ may be about 0.81 kcal/mol or less, and, for example, from about 0.41 kcal/mol to about 0.81 kcal/mol.

When the organometallic compound satisfies the above described range of $E_{3MC}$, the organometallic compound may less likely transition from the $^3$MCLT state to the non-emission state, that is, the $^3$MC state. Therefore, the stability of the organometallic compound in an excited state may be suitable (e.g., excellent), and the efficiency and lifespan of the organic light-emitting device including the organometallic compound may be increased.

For example, $^3$MLCT (%) (the ratio of presence in the $^3$MLCT state) of the organometallic compound may be about 10% or more. For example, $^3$MLCT (%) of the organometallic compound may be about 30% or less.

$M_1$ in Formula 1 may be selected from platinum (Pt), palladium (Pd), copper (Cu), silver (Ag), gold (Au), rhodium (Rh), iridium (Ir), ruthenium (Ru), osmium (Os), titanium ($T_1$), zirconium (Zr), hafnium (Hf), europium (Eu), Terbium (Tb), and thulium (Tm).

In an embodiment, $M_1$ may be selected from Pt, Pd, Cu, Ag, Au, Rh, Ir, Ru, and Os.

In an embodiment, $M_1$ may be Pt, but embodiments of the present disclosure are not limited thereto.

$Y_1$ to $Y_3$ in Formula 1 may each independently be N or C, $T_1$ to $T_4$ may each independently be a chemical bond, O, S, B(R'), N(R'), P(R'), C(R')(R"), Si(R')(R"), Ge(R')(R"), C(=O), B(R')(R"), N(R')(R"), or P(R')(R"), when $T_1$ is a chemical bond, $Y_1$ and $M_1$ directly bond to each other, when $T_2$ is a chemical bond, $Y_2$ and $M_1$ directly bond to each other, when $T_3$ is a chemical bond, $Y_3$ and $M_1$ directly bond to each other, and when $T_4$ is a chemical bond, $A_4$ and $M_1$ directly bond to each other, and two bonds selected from a bond between $M_1$ and $Y_1$ or $T_1$, a bond between $M_1$ and $Y_2$ or $T_2$, a bond between $M_1$ and $Y_3$ or $T_3$, and a bond between $M_1$ and $A_4$ or $T_4$ may each be a coordination bond, and the other two bonds may each be a covalent bond. That is, out of the four bonds including a bond between $M_1$ and $Y_1$ or $T_1$, a bond between $M_1$ and $Y_2$ or $T_2$, a bond between $M_1$ and $Y_3$ or $T_3$, and a bond between $M_1$ and $A_4$ or $T_4$, two of the bonds may each be a coordination bond, and the other two of the bonds may each be a covalent bond.

In an embodiment, $T_1$ to $T_4$ may each be a chemical bond, $Y_1$ may be N, $Y_2$ may be C, and at least one bond selected from a bond between $Y_1$ and $M_1$ and a bond between $Y_2$ and $M_1$ may each be a coordination bond.

For example, $Y_1$ may be N, and $Y_2$ and $Y_3$ may each be C, but embodiments of the present disclosure are not limited thereto.

$A_1$ to $A_3$ in Formula 1 may each independently be selected from a $C_5$-$C_{60}$ carbocyclic group and a $C_1$-$C_{60}$ heterocyclic group.

In an embodiment, $A_1$ to $A_3$ may each independently be selected from a benzene group, a naphthalene group, an anthracene group, a phenanthrene group, a triphenylene group, a pyrene group, a chrysene group, a cyclopentane group, a cyclopentadiene group, a cyclohexane group, a cyclohexene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 1,2,4-triazole group, a tetrazole group, a 2,3-dihydrotriazole group, an azasilole group, a diazasilole group, a triazasilole group, an oxazole group, an isooxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In an embodiment, i) $A_1$ may be selected from a pyridine group, a pyrimidine group, a pyrazine group, a pyridazine group, and a triazine group, and/or ii) $A_2$ may be selected from an indole group, a carbazole group, an indolopyridine group, and an indolopyrimidine group, and/or iii) $A_3$ may be selected from a benzene group, a naphthalene group, an anthracene group, and a phenanthrene group.

For example, $A_1$ may be selected from a pyridine group, a pyrimidine group, a pyrazine group, a pyridazine group, and a triazine group, and $A_2$ may be selected from an indole group, a carbazole group, an indolopyridine group, and an indolopyrimidine group. For example, $A_1$ may be selected from a pyridine group, a pyrimidine group, a pyrazine group, a pyridazine group, and a triazine group, and $A_3$ may be selected from a benzene group, a naphthalene group, an anthracene group, and a phenanthrene group. For example, $A_2$ may be selected from an indole group, a carbazole group, an indolopyridine group, and an indolopyrimidine group, and $A_3$ may be selected from a benzene group, a naphthalene group, an anthracene group, and a phenanthrene group. For example, $A_1$ may be selected from a pyridine group, a pyrimidine group, a pyrazine group, a pyridazine group, and a triazine group, $A_2$ may be selected from an indole group, a carbazole group, an indolopyridine group, and an indolopyrimidine group, and $A_3$ may be selected from a benzene group, a naphthalene group, an anthracene group, and a phenanthrene group.

In an embodiment, ia) $A_1$ may be a group represented by one of Formulae 2A-1 to 2A-5, and/or iia) $A_2$ may be a group represented by one of Formulae 2B-1 to 2B-3, and/or iiia) $A_3$ may be a group represented by Formula 2C-1:

2A-1

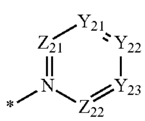

2A-2

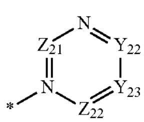

2A-3

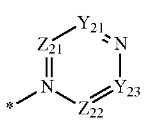

2A-4

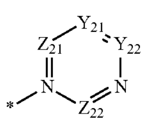

2A-5

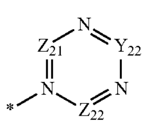

2B-1

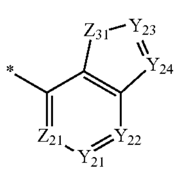

2B-2

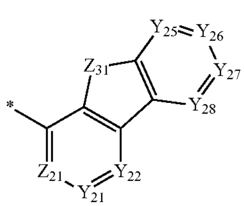

-continued 2B-3

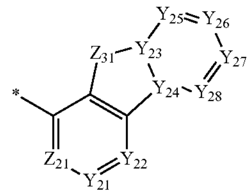

2C-1

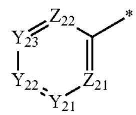

In Formulae 2A-1 to 2A-5, Formulae 2B-1 to 2B-3, and Formula 2C-1, $Y_{21}$ may be N or $C(R_{11a})$, $Y_{22}$ may be N or $C(R_{12a})$, $Y_{23}$ may be N or $C(R_{13a})$, $Y_{24}$ may be N or $C(R_{14a})$, $Y_{25}$ may be N or $C(R_{15a})$, $Y_{26}$ may be N or $C(R_{16a})$, $Y_{27}$ may be N or $C(R_{17a})$, and $Y_{28}$ may be N or $C(R_{18a})$, $Z_{21}$ may be *'—C, $C(R_{21a})$ or N, and $Z_{22}$ may be *'—C, $C(R_{22a})$, or N, $Z_{31}$ may be *'—N or $N(R_{31a})$, $R_{11a}$ to $R_{18a}$, $R_{21a}$ to $R_{22a}$, and $R_{31a}$ are each independently the same as described in connection with $R_1$ in Formula 1,

* indicates a binding site to a neighboring $T_1$, $T_2$, or $T_3$, and *' indicates a binding site to a neighboring Li, $L_2$, $L_3$, or $L_4$.

For example, $Y_{22}$ in Formulae 2A-1 to 2A-5 and 2C-1 may be $C(R_{12a})$.

For example, $R_{12a}$ may be hydrogen, a $C_1$-$C_{20}$ alkyl group, or a $C_1$-$C_{20}$ alkyl group substituted with at least one $C_1$-$C_{20}$ alkyl group.

For example, in Formulae 2B-1 to 2B-3, $Y_{21}$ may be $C(R_{11a})$ and $Y_{23}$ may be $C(R_{13a})$. For example, $R_{11a}$ and $R_{13a}$ may each be hydrogen.

For example, in Formulae 2A-1 to 2A-5, $Z_{21}$ may be $C(R_{21a})$ and $Z_{22}$ may be *'—C. For example, $R_{21a}$ may be hydrogen.

For example, in Formulae 2B-1 to 2B-3, $Y_{21}$ may be $C(R_{11a})$, $Y_{22}$ may be $C(R_{12a})$, $Y_{23}$ may be $C(R_{13a})$, $Y_{24}$ may be $C(R_{14a})$, $Y_{25}$ may be $C(R_{15a})$, $Y_{26}$ may be $C(R_{16a})$, $Y_{27}$ may be $C(R_{17a})$, and $Y_{28}$ may be $C(R_{18a})$. For example, $R_{11a}$ to $R_{18a}$ may each be hydrogen.

For example, in Formulae 2A-1 to 2A-5, $Z_{21}$ may be *'—C, and $Z_{31}$ may be *'—N.

For example, in Formula 2C-1, $Y_{21}$ may be $C(R_{11a})$, and $Y_{23}$ may be $C(R_{13a})$. For example, $R_{11a}$ may be hydrogen or a $C_6$-$C_{20}$ aryl group substituted with at least one deuterium. For example, $R_{13a}$ may be hydrogen.

For example, in Formulae 2A-1 and 2A-4, when $Y_{21}$ is $C(R_{11a})$, $Y_{22}$ is $C(R_{12a})$, and $R_{12a}$ is a $C_1$-$C_{20}$ alkyl group, $R_{11a}$ may be a $C_3$-$C_{20}$ aryl group substituted with at least one deuterium.

For example, in Formula 2C-1, $Z_{21}$ may be *—C and $Z_{22}$ may be *'—C.

For example, $A_1$ may be a group represented by one of Formulae 2A-1 to 2A-5 and $A_2$ may be a group represented by one of Formulae 2B-1 to 2B-3. For example, $A_1$ may be a group represented by one of Formulae 2A-1 to 2A-5 and $A_3$ may be a group represented by Formula 2C-1. For example, $A_2$ may be a group represented by one of Formulae 2B-1 to 2B-3 and $A_3$ may be a group represented by Formula 2C-1. For example, $A_1$ may be a group represented by one of Formulae 2A-1 to 2A-5, $A_2$ may be a group represented by one of Formulae 2B-1 to 2B-3, and $A_3$ may be a group represented by Formula 2C-1.

$L_1$ to $L_4$ in Formula 1 may each independently be selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—Se—*', *—C(═O)—*', *—S(═O)—*', *—S(═O)$_2$—*', *—C($R_5$)═*', *═C($R_5$)—*', *—C($R_5$)═C($R_6$)—*', *—C(═S)—*', and *—C≡C—*', and * and *' each indicates a binding site to a neighboring atom.

In an embodiment, $L_1$ to $L_4$ may each independently be a single bond or *—O—*'.

a1 to a4 in Formula 1 may each independently be an integer from 0 to 3, and, when a1 is 0, $A_1$ and $A_2$ are not linked to each other, when a2 is 0, $A_2$ and $A_3$ are not linked to each other, when a3 is 0, $A_3$ and $A_4$ are not linked to each other, and when a4 is 0, $A_4$ and $A_1$ are not linked to each other.

In an embodiment, a1 to a3 may each be 1, a4 may be 0, $L_1$ and $L_3$ may be a single bond, and $L_2$ may be *—O—*'.

$L_{11}$ and $L_{12}$ in Formula 1 may each independently be selected from *—C($R_{11}$)($R_{12}$)—*', *—C($R_{11}$)═*', *═C($R_{11}$)—*', and *—C($R_{11}$)═C($R_{12}$)—*'.

a11 and a12 in Formula 1 may each independently be an integer from 1 to 3. a11 indicates the number of groups represented by $L_{11}$, and a12 indicates the number of groups represented by $L_{12}$, and, when a11 is 2 or more, $L_{11}$(s) in the number of a11 may be identical to or different from each other and when a12 is 2 or more, $L_{12}$(s) in the number of a12 may be identical to or different from each other.

In an embodiment, a11 and a12 may each independently be 1 or 2.

In an embodiment, i) $L_{11}$ and $L_{12}$ may each be *—C($R_{11}$)($R_{12}$)—*', a11 may be 2, and a12 may be 1, ii) $L_{11}$ may be *—C($R_{11}$)═C($R_{12}$)—* $L_{12}$ may be *—C($R_{11}$)($R_{12}$)—*', and a11 and a12 may each be 1, or iii) $L_{11}$ may be *—C($R_{11}$)($R_{12}$)—*', $L_{12}$ may be *—C($R_{11}$)═C($R_{12}$)—*', and a11 and a12 may each be 1.

R', R", $R_1$ to $R_6$, and $R_{11}$ to $R_{12}$ in Formula 1 may each independently be selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{30}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), —P(═S)($Q_1$)($Q_2$), ═O, ═S, ═N($Q_1$), and ═C($Q_1$)($Q_2$)

b1 to b3 may each independently be an integer from 0 to 20, b4 may be an integer from 0 to 6, neighboring groups of R', R", $R_1$(s) in the number of b1, $R_2$(s) in the number of b2, $R_3$(s) in the number of b3, $R_4$(s) in the number of b4, $R_5$, $R_6$, $R_{11}$, and $R_{12}$ may optionally be linked to each other to form a substituted or unsubstituted $C_5$-$C_{60}$ carbocyclic group or a substituted or unsubstituted $C_1$-$C_{60}$ heterocyclic group.

In an embodiment, R', R", $R_1$ to $R_6$, $R_{11}$, and $R_{12}$ may each independently be selected from: hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a cyclopentyl group, a cyclohexyl group, a phenyl group, a naphthyl group, a pyridinyl group, a pyrimidinyl group, a pyrazinyl group, a pyridazinyl group, a pyrrolyl group, an indolyl group, an isoindolyl group, an indazolyl group, a quinolinyl group, an isoquinolinyl group, a quinoxalinyl group, a quinazolinyl group, a cinnolinyl group, and a triazinyl group;

a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$);

a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from a $C_1$-$C_{20}$ alkyl group, a $C_1$-$C_{20}$ alkoxy group, a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$; and —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, —$P(=O)(Q_0(Q_2)$, —$P(=S)(Q_0(Q_2)$, =O, =S, =$N(Q_1)$, and =$C(Q_1)(Q_2)$, wherein $Q_1$ to $Q_3$ and $Q_{31}$ to $Q_{33}$ are each independently selected from hydrogen, deuterium, —F, —Cl, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group.

In an embodiment, when $L_{12}$ is *—$C(R_{11})=C(R_{12})$—*' and a12 is 1, $R_{11}$ and $R_{12}$ may be linked to each other to form a substituted or unsubstituted $C_5$-$C_{60}$ carbocyclic group or a substituted or unsubstituted $C_1$-$C_{60}$ heterocyclic group.

In an embodiment, the organometallic compound represented by Formula 1 may be a group represented by one of Formulae 1-1 to 1-6:

Formula 1-1

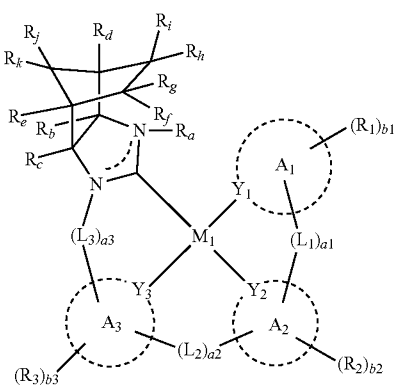

Formula 1-2

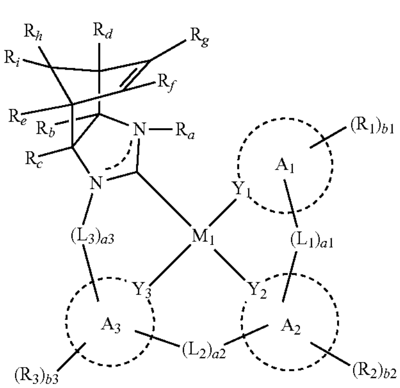

-continued

Formula 1-3

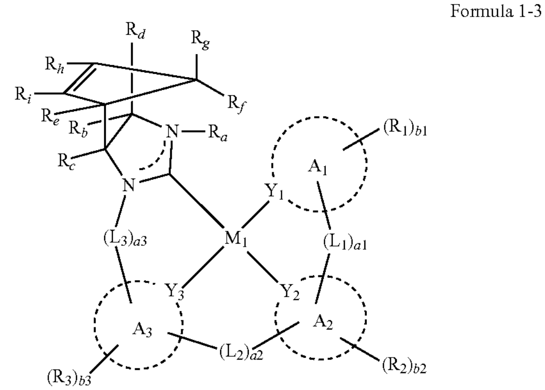

Formula 1-4

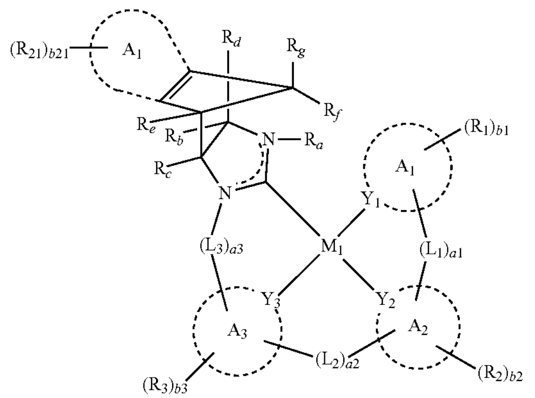

Formula 1-5

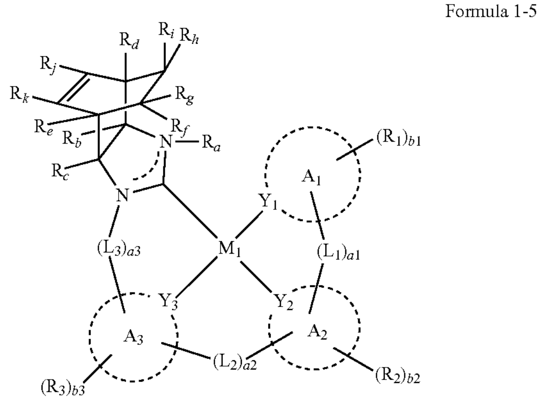

Formula 1-6

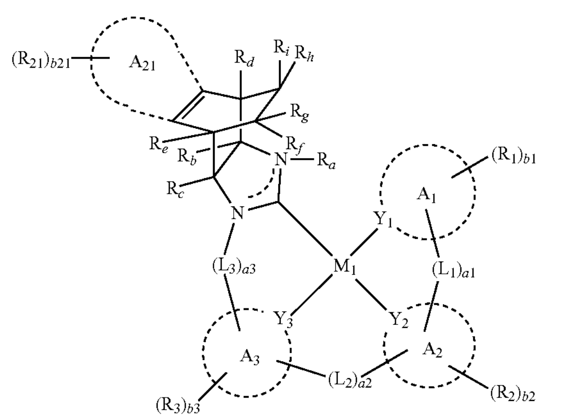

wherein, in Formulae 1-1 to 1-6, $M_1$, $A_1$ to $A_3$, $Y_1$ to $Y_3$, $L_1$ to $L_3$, a1 to a3, $R_1$ to $R_3$, and b1 to b3 are each independently the same as respectively described above, $A_{21}$ is the same as described in connection with $A_1$, $R_a$ to $R_k$ and $R_{21}$ are each independently the same as described in connection with $R_1$, and b21 is the same as described in connection with b1.

For example, $A_{21}$ may be a benzene group.

For example, $R_a$ may be a $C_1$-$C_{20}$ alkyl group substituted with at least one deuterium, a $C_6$-$C_{20}$ aryl group substituted with at least one deuterium, or a $C_6$-$C_{20}$ aryl group substituted with at least one $C_6$-$C_{20}$ aryl group substituted with at least one deuterium.

In an embodiment, the organometallic compound represented by Formula 1 may be represented by Formula 1A:

Formula 1A

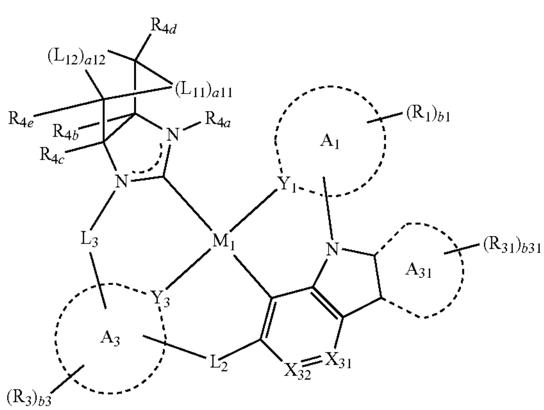

wherein, in Formula 1A, $M_1$, $A_1$, $A_3$, $Y_1$, $Y_3$, $L_2$ to $L_3$, $L_{11}$ and $L_{12}$, a11 and a12, $R_1$, $R_3$, b1, and b3 are each independently the same as described above, $X_{31}$ to $X_{32}$ may each independently be N or $C(R_{32})$, $A_{31}$ is the same as described in connection with $A_1$, $R_{4a}$ to $R_{4e}$, $R_{31}$, and $R_{32}$ are each independently the same as described in connection with $R_1$, and b31 is the same as described in connection with b1.

In an embodiment, the organometallic compound represented by Formula 1 may include at least one deuterium.

In an embodiment, the organometallic compound represented by Formula 1 may include at least one selected from a $C_1$-$C_{20}$ alkyl group substituted with at least one deuterium and a $C_6$-$C_{20}$ aryl group substituted with at least one deuterium.

In an embodiment, the organometallic compound represented by Formula 1 may be selected from Compounds 1 to 44, but embodiments of the present disclosure are not limited thereto:

1

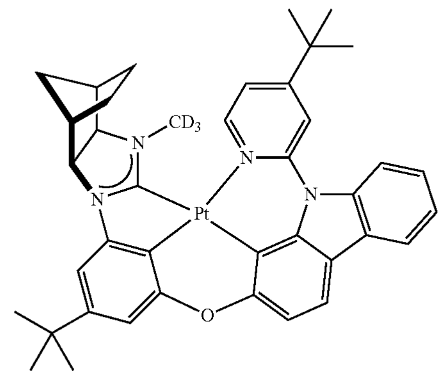

2

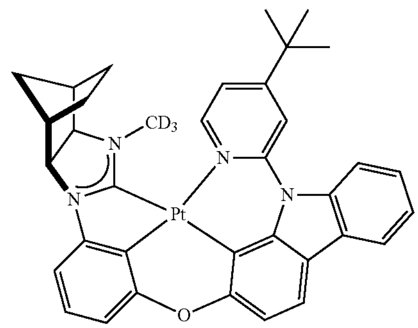

3

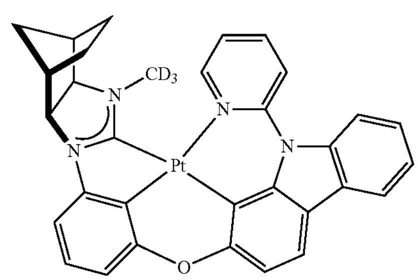

4

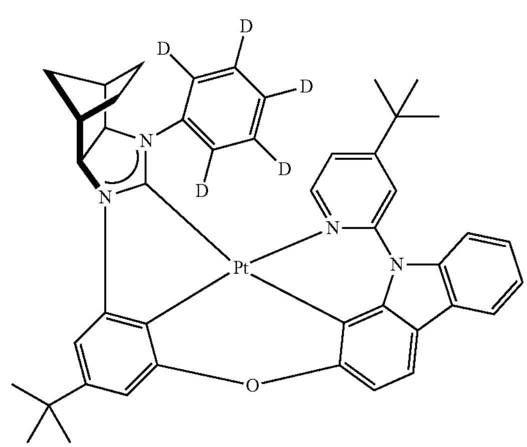

-continued
5
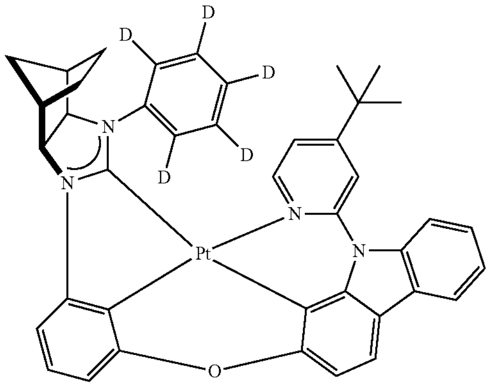
6
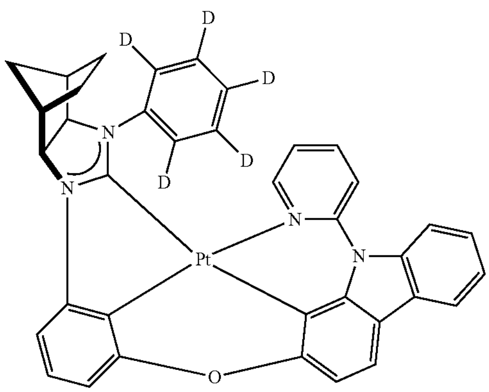
7
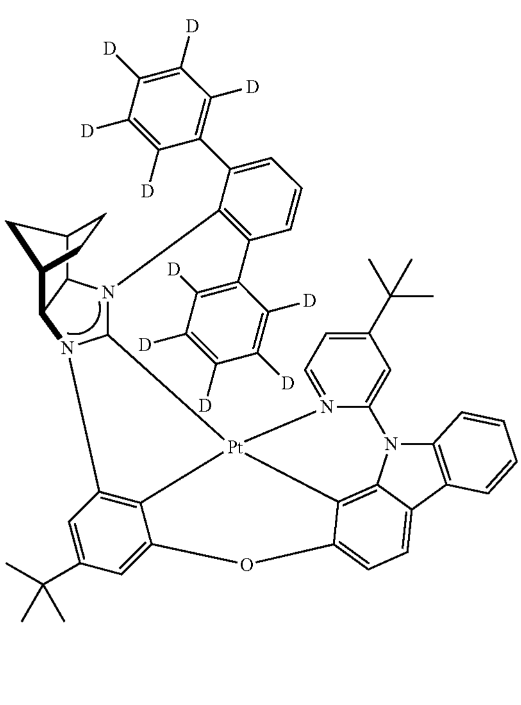
-continued
8
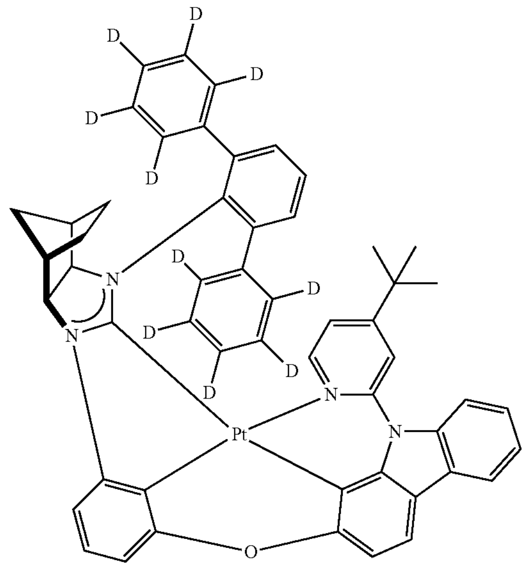
9
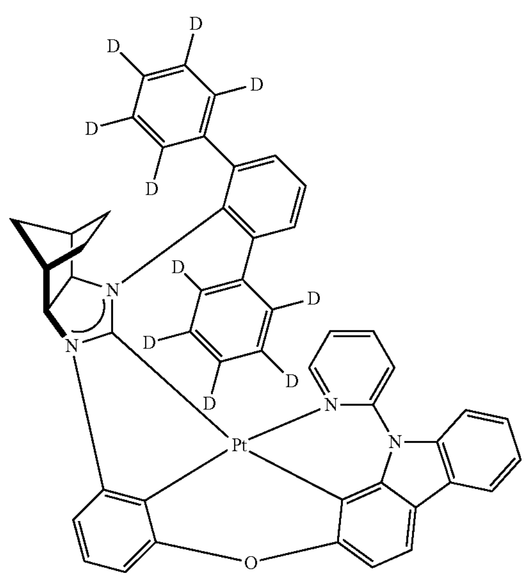

-continued
10
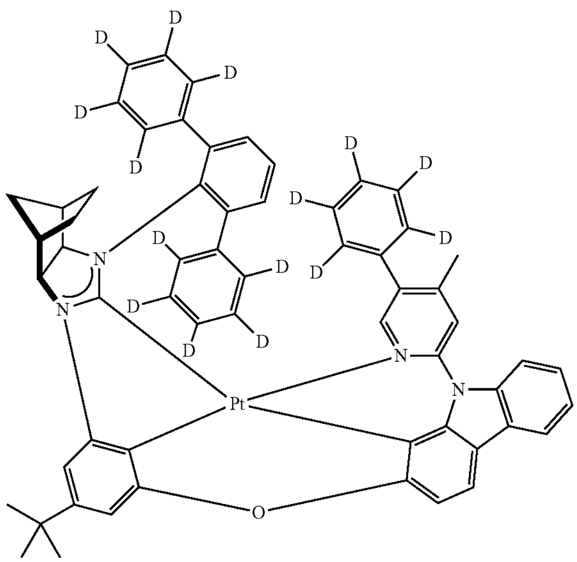
11
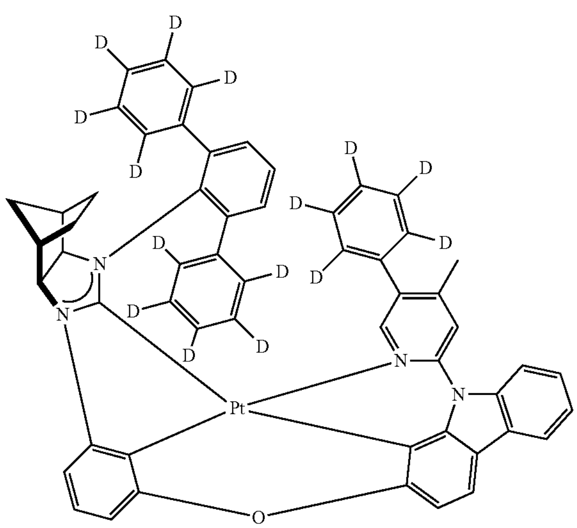
12
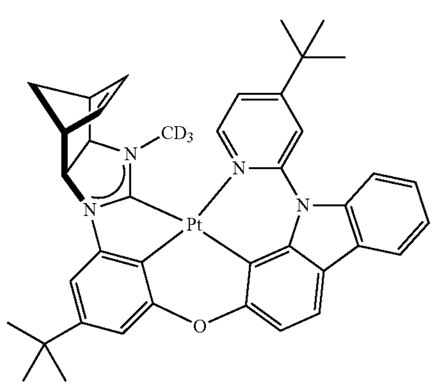
-continued
13
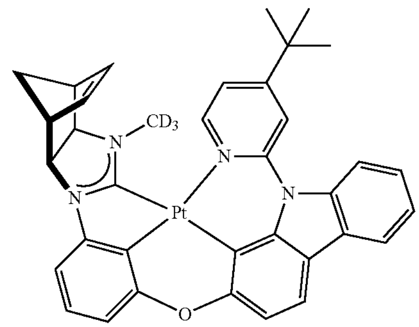
14
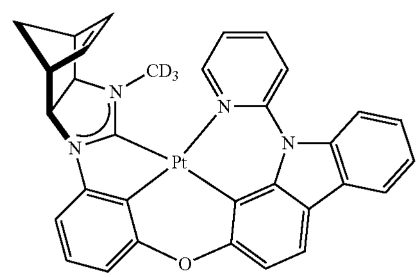
15
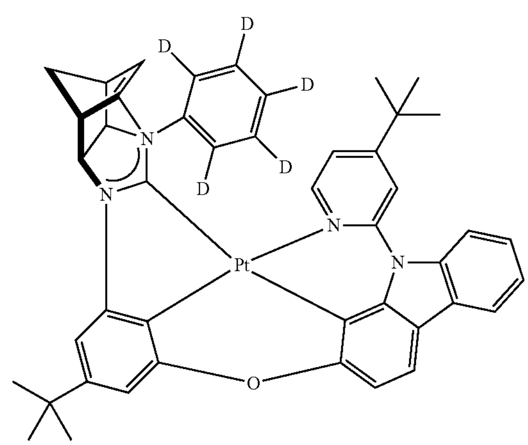
16
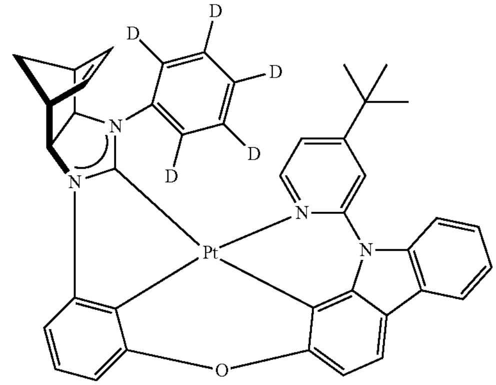

-continued
17
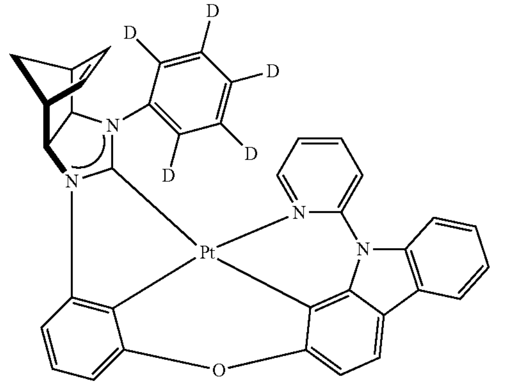
18
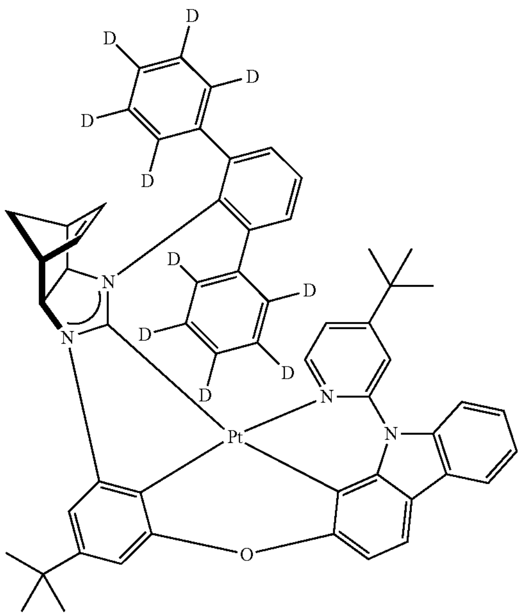
19
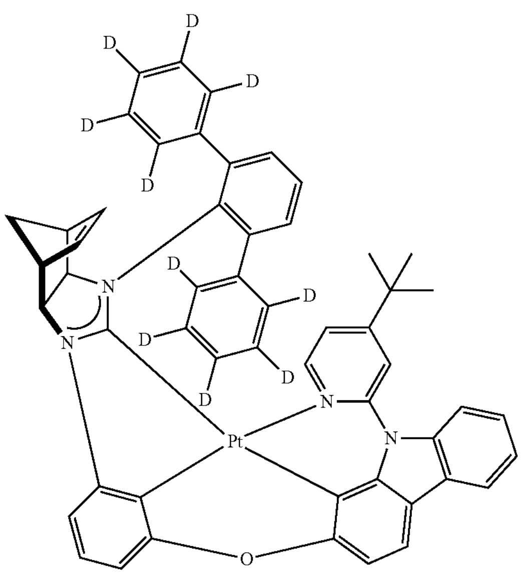
-continued
20
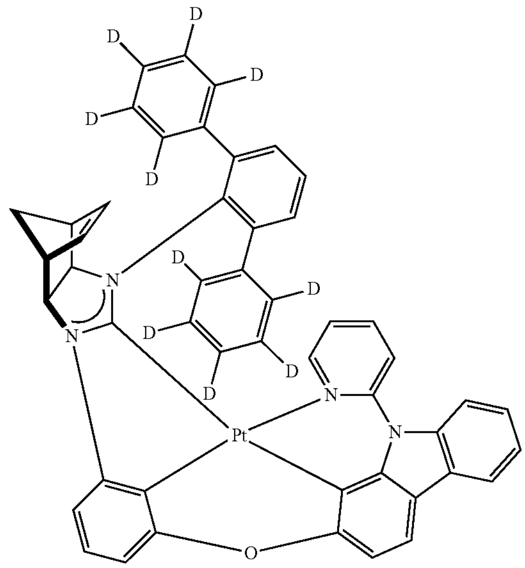
21
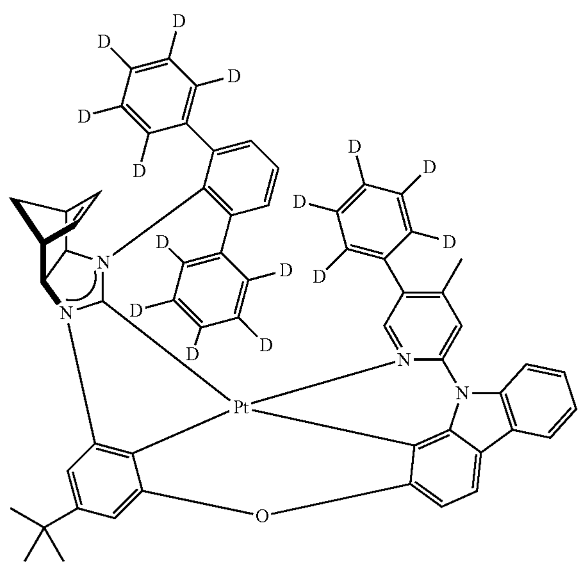

-continued
22
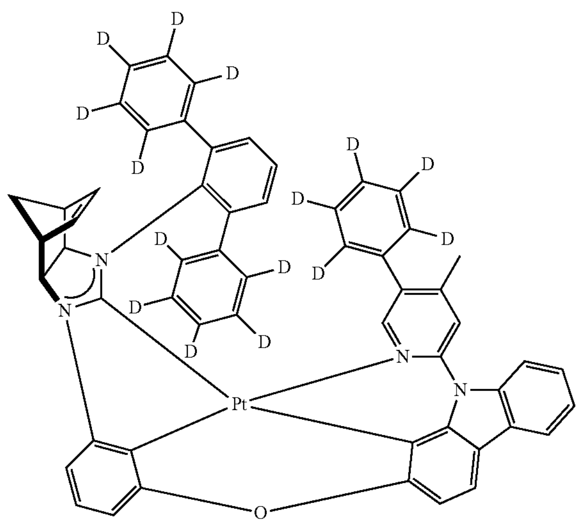
23
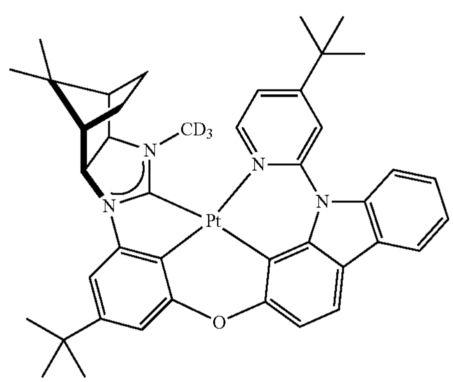
24
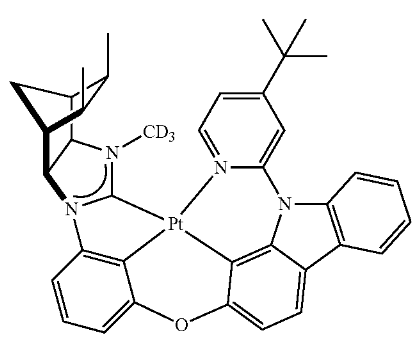
25
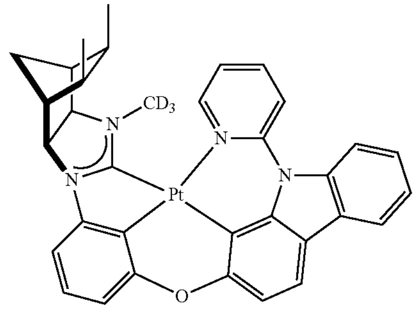
-continued
26
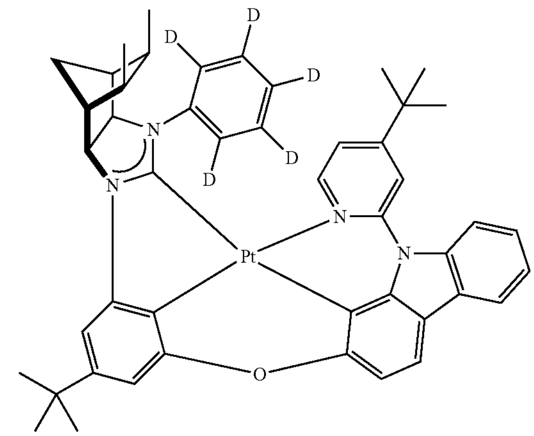
27
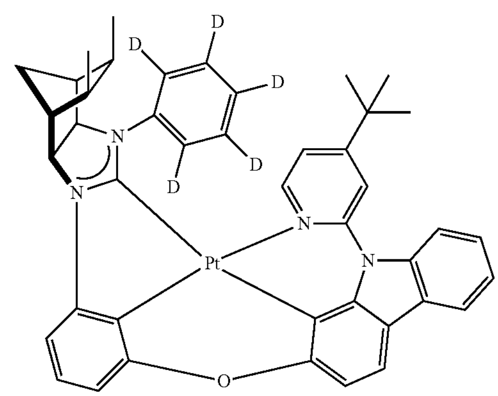
28
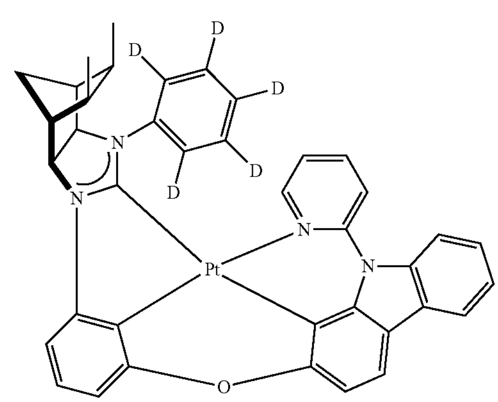

-continued
29
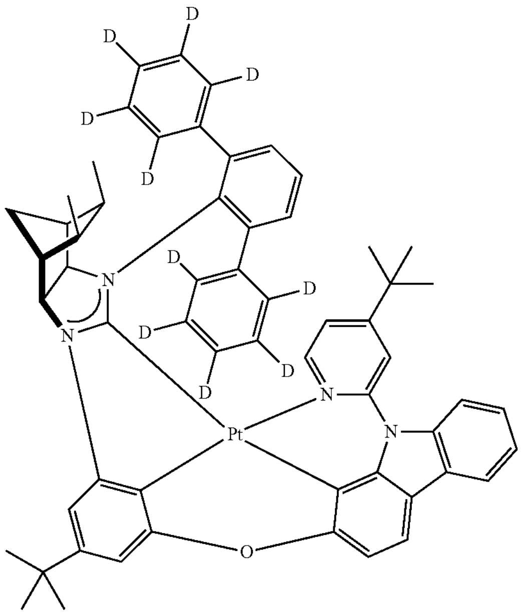
30
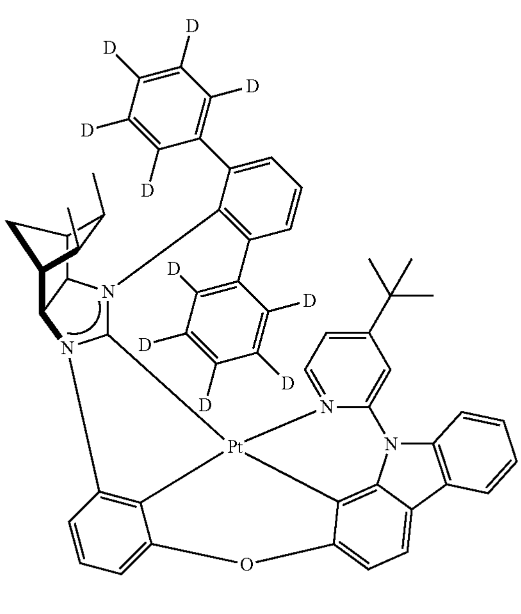
-continued
31
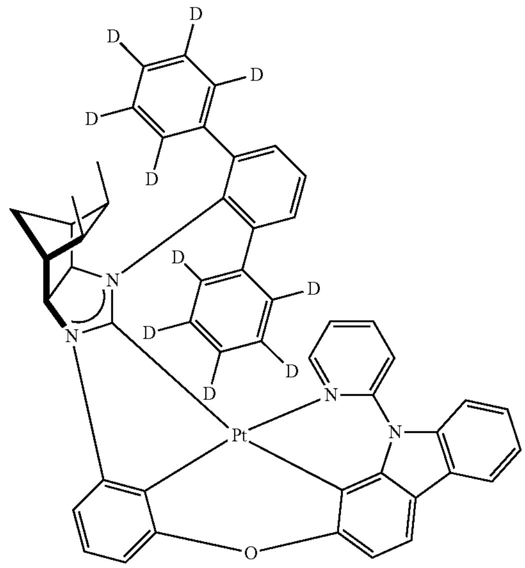
32
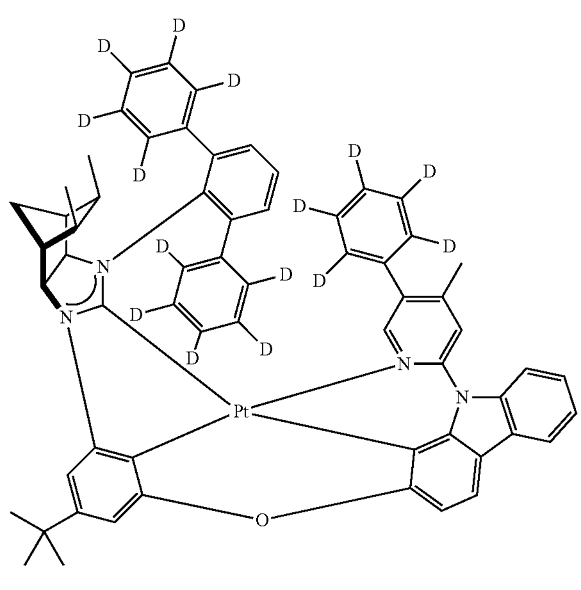

-continued
33
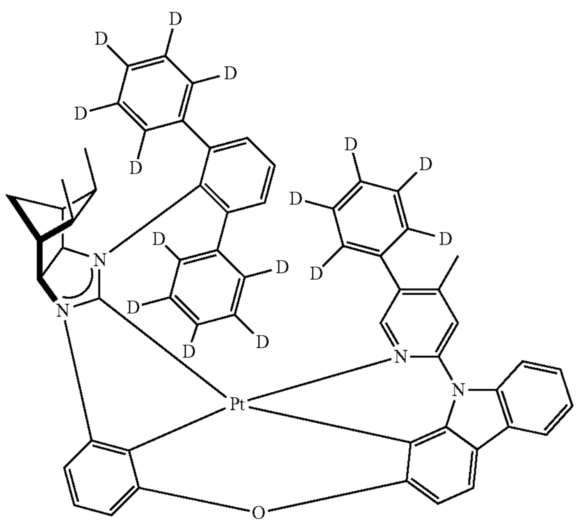
34
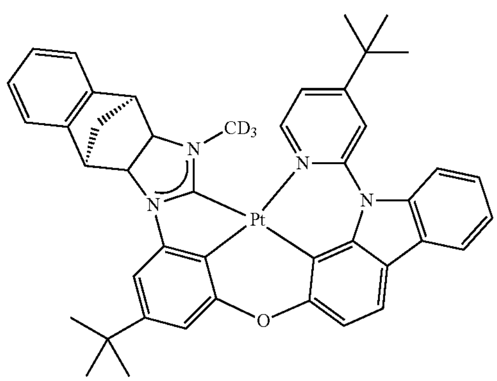
35
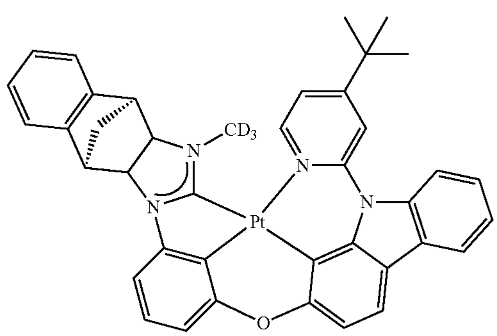
36
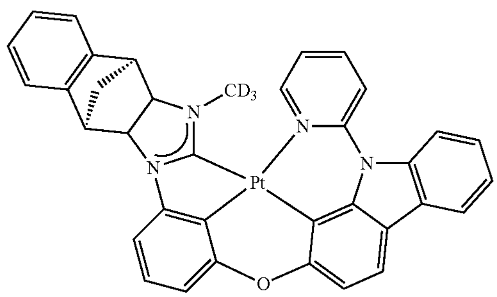
-continued
37
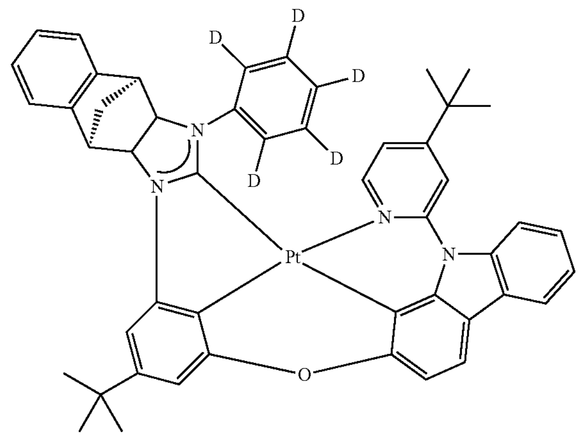
38
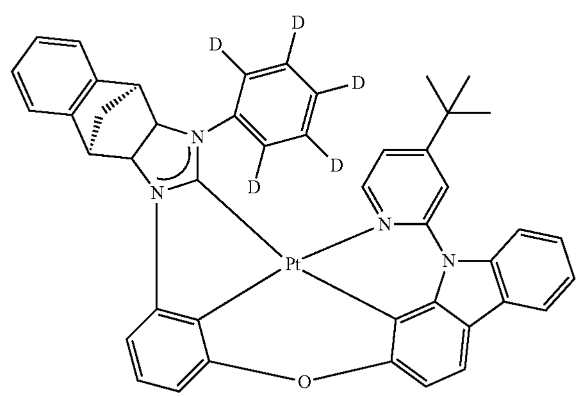
39
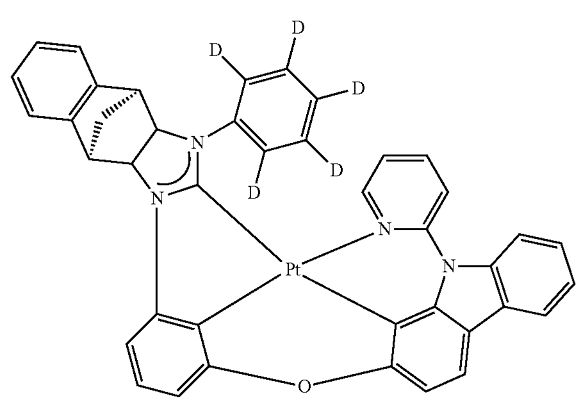

-continued
40
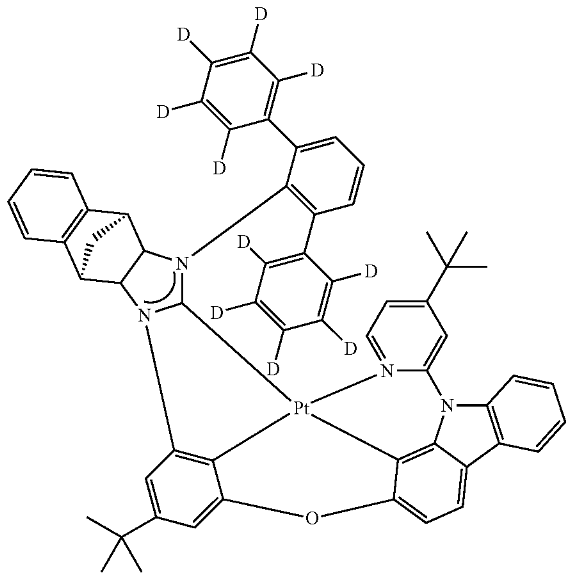
41
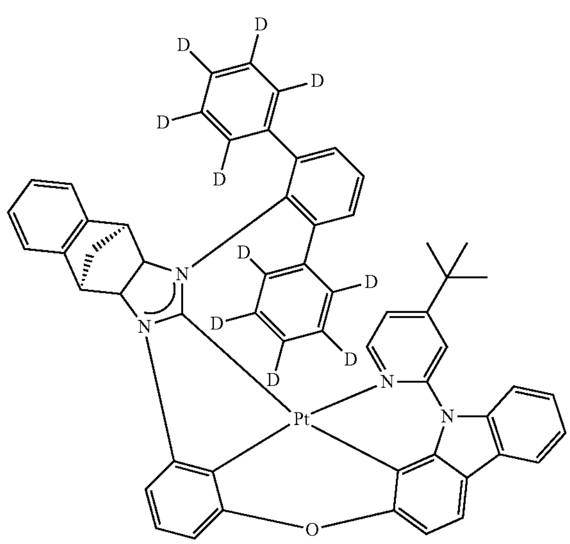
-continued
42
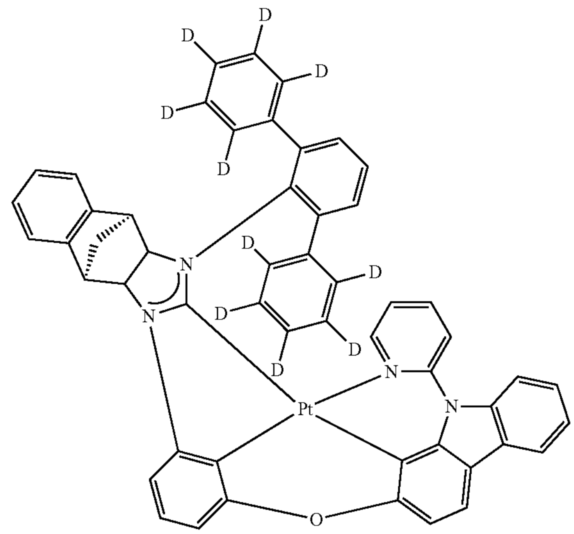
43
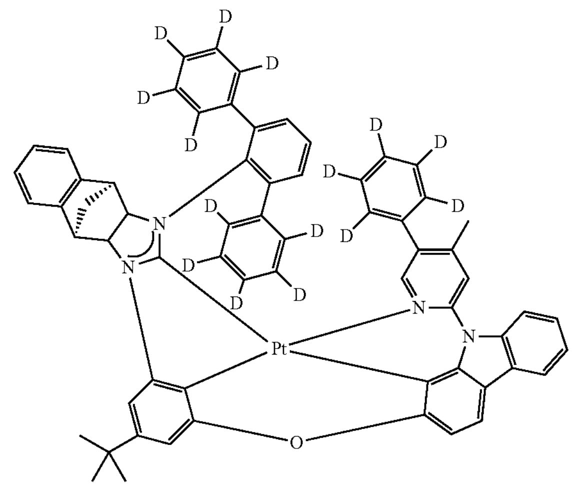
44
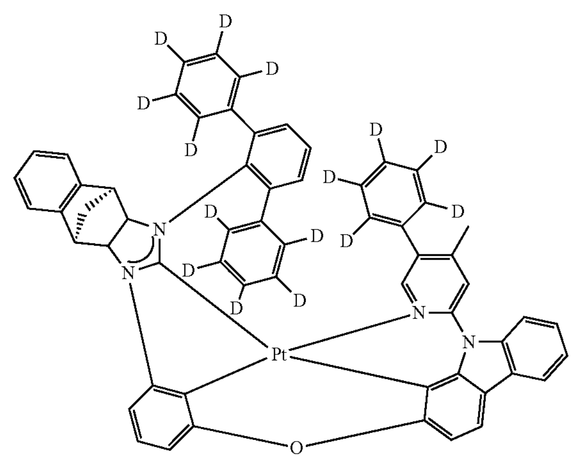
Because in the organometallic compound represented by Formula 1, a carbene ligand that is linked to the central metal thereof ($M_1$ in Formula 1) includes a bridge structure, the binding force between the central metal and the carbene ligand is strengthened and thus, rigidity of the organometallic compound may be increased. Therefore, the lifespan characteristics of an organic light-emitting device utilizing the organometallic compound may be improved.

In addition, due to the inclusion of one or more deuterium in the organometallic compound represented by Formula 1, an intermolecular vibration mode is decreased, resulting in an increase in rigidity of the organometallic compound, and thus, stability of the organometallic compound is increased and a long lifespan effect of the organic light-emitting device utilizing the organometallic compound is obtained.

In an embodiment, because in the organometallic compound represented by Formula 1, the carbene ligand has a condensed cyclic structure, stability may be increased due to an increase in $^{3}$MC energy level in correspondence to the increase in the sigma electron donor effect.

In addition, in the organometallic compound represented by Formula 1, the element of the carbene ligand that is connected to the central metal is carbon, and the carbene ligand has a covalent bond rather than a coordination bond with the central metal, so that the binding force is increased and hole transport characteristics and electron transport characteristics may be simultaneously enhanced.

As a result, when the organometallic compound is applied to an organic light-emitting device, the phenomenon that the triplet exciton is transferred to the non-emissive $^{3}$MC state due to ligand rupture may be reduced or prevented, so that the stability in the excited state is suitable (e.g., excellent) and the organic light-emitting device may have suitable (e.g., excellent) lifespan and efficiency characteristics.

In an embodiment, the organometallic compound represented by Formula 1 may satisfy the range of $E_{3MC}$ described above. At this time, the transition of the organometallic compound represented by Formula 1 from the $^{3}$MCLT state to the $^{3}$MC state, which is the non-emission state, may less likely to occur. Therefore, the stability of the organometallic compound in the excited state may be suitable (e.g., excellent), and the efficiency and lifespan of the organic light-emitting device including the organometallic compound may be increased.

The organometallic compound may emit blue light. For example, the organometallic compound may emit blue light (bottom emission $CIE_{x,y}$ color coordinates X=0.13, Y=0.05 to 0.18) having a maximum emission wavelength of about 440 nm or more and about 490 nm or less, but embodiments of the present disclosure are not limited thereto. Accordingly, the organometallic compound represented by Formula 1 may be useful for the manufacturing of an organic light-emitting device that emits blue light.

Synthesis methods of the organometallic compound represented by Formula 1 may be recognizable by one of ordinary skill in the art by referring to Examples provided below.

At least one of such organometallic compounds represented by Formula 1 may be utilized between a pair of electrodes of an organic light-emitting device. In an embodiment, the organometallic compound may be included in an emission layer. The organometallic compound included in the emission layer may act as a dopant. In one or more embodiments, the organometallic compound of Formula 1 may be utilized as a material for a capping layer located outside a pair of electrodes of an organic light-emitting device.

Accordingly, according to another embodiment of the present disclosure, an organic light-emitting device includes: a first electrode; a second electrode facing the first electrode; an organic layer located between the first electrode and the second electrode; and at least one organometallic compound represented by Formula 1. For example, the organic layer includes at least one of organometallic compounds.

The expression "(an organic layer) includes at least one of organometallic compounds" as used herein may include a case in which "(an organic layer) includes identical organometallic compounds represented by Formula 1" and a case in which "(an organic layer) includes two or more different organometallic compounds represented by Formula 1".

For example, the organic layer may include the organometallic compound, and may include only Compound 1. In this embodiment, Compound 1 may be included in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 may both exist in an emission layer), or different layers (for example, Compound 1 may exist in an emission layer and Compound 2 may exist in an electron transport region).

In some embodiments, the first electrode of the organic light-emitting device may be an anode, the second electrode of the organic light-emitting device may be a cathode, and the organic layer further includes a hole transport region located between the first electrode and the emission layer and an electron transport region located between the emission layer and the second electrode, the hole transport region includes a hole injection layer, a hole transport layer, an emission auxiliary layer, an electron blocking layer, or any combination thereof, and the electron transport region may include a buffer layer, a hole blocking layer, an electron transport layer, an electron injection layer, or any combination thereof.

The term "organic layer" as used herein refers to a single layer and/or multiple layers located between the first electrode and the second electrode of the organic light-emitting device. A material included in the "organic layer" is not limited to an organic material.

In an embodiment, the emission layer includes the organometallic compound represented by Formula 1, the emission layer further includes a host, and an amount of the host of the emission layer may be greater than the amount of the organometallic compound in the emission layer.

In an embodiment, the emission layer may further include a host, and the amount of the organometallic compound may be from 0.1 parts by weight to 50 parts by weight based on 100 parts by weight of the emission layer.

In an embodiment, the hole transport region may include a p-dopant having a lowest unoccupied molecular orbital (LUMO) energy level of less than about −3.5 eV.

Description of FIG. 1

FIG. 1 is a schematic cross-sectional view of an organic light-emitting device according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 will be described in connection with FIG. 1.

First Electrode 110

In FIG. 1, a substrate may be additionally located under the first electrode 110 or above the second electrode 190. The substrate may be a glass substrate or a plastic substrate, each having suitable (e.g., excellent) mechanical strength, thermal stability, transparency, surface smoothness, ease of handling, and water resistance.

The first electrode 110 may be formed by, for example, depositing or sputtering a material for forming the first electrode 110 on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, a material for forming the first electrode 110 may be selected from indium tin oxide (ITO), indium zinc oxide (IZO), tin oxide ($SnO_2$), zinc oxide (ZnO), and any combination thereof, but embodiments of the present disclosure are not limited thereto. In one or more embodiments, when the first electrode 110 is a semi-transmissive electrode or a reflective electrode, a material for forming the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combination thereof, but embodiments of the present disclosure are not limited thereto.

The first electrode 110 may have a single-layered structure or a multi-layered structure including two or more layers. For example, the first electrode 110 may have a three-layered structure of ITO/Ag/ITO, but the structure of the first electrode 110 is not limited thereto.

Organic Layer 150

The organic layer 150 is located on the first electrode 110. The organic layer 150 may include an emission layer.

The organic layer 150 may further include a hole transport region located between the first electrode 110 and the emission layer and an electron transport region located between the emission layer and the second electrode 190.

Hole Transport Region in Organic Layer 150

The hole transport region may have i) a single-layered structure including (e.g., consisting of) a single material, ii) a single-layered structure including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

In an embodiment, the hole transport region may have a single-layered structure including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 110 in the respective stated order, but the structure of the hole transport region is not limited thereto.

The hole transport region may include at least one selected from m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

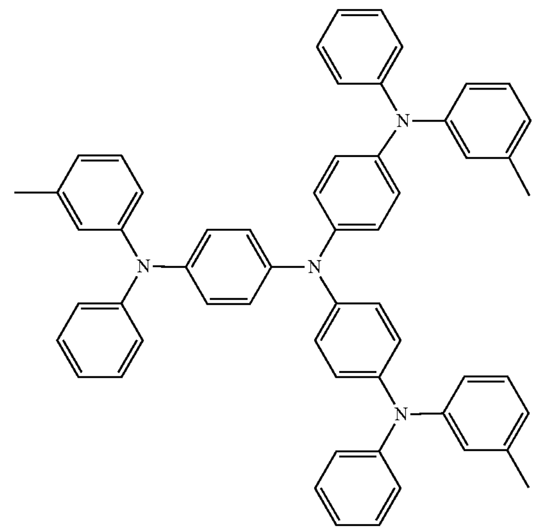

m-MTDATA

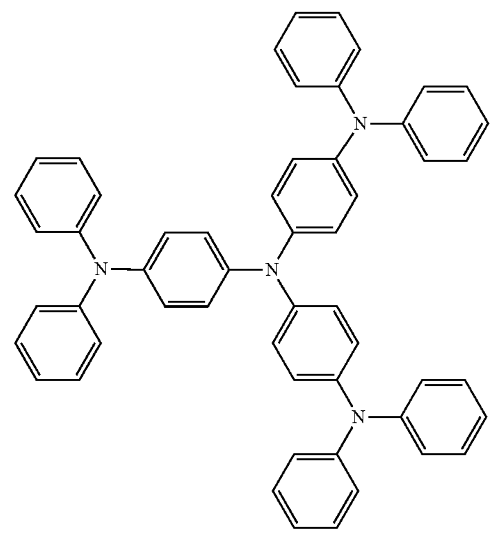

TDATA

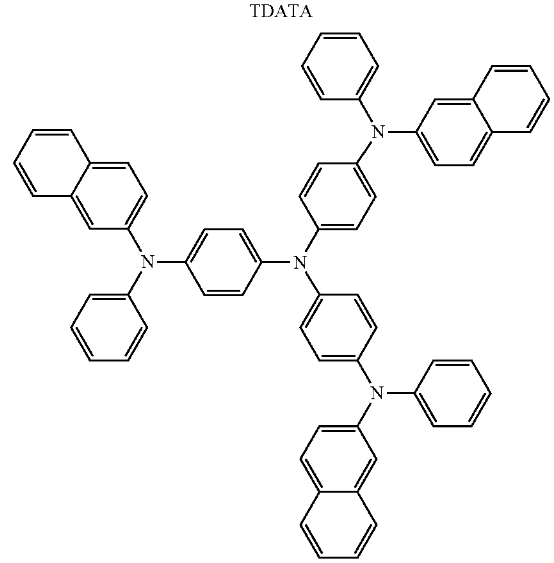

2-TNATA

-continued

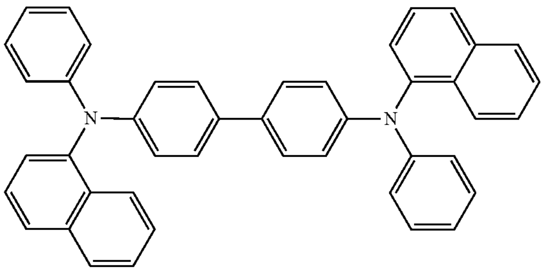

NPB

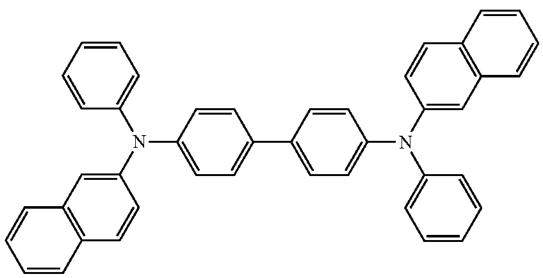

β-NPB

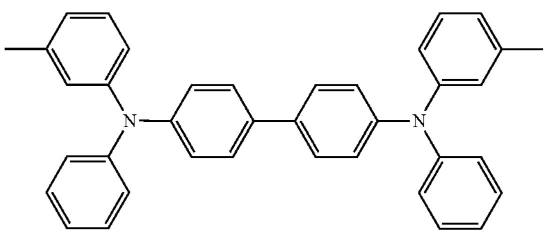

TPD

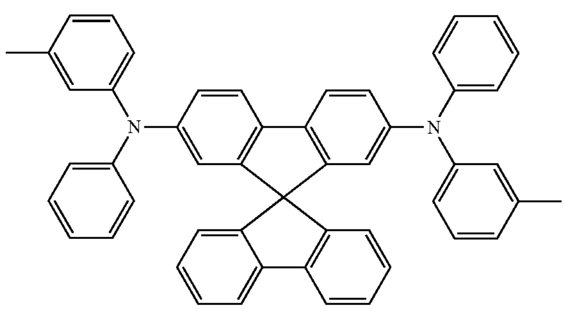

Spiro-TPD

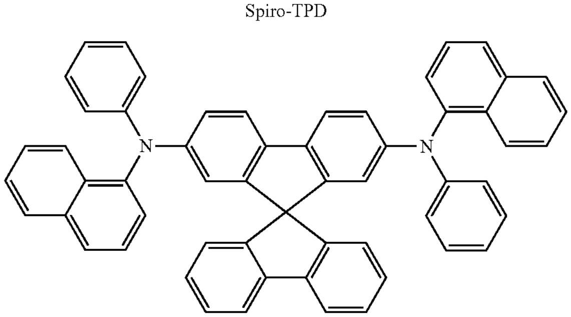

Spiro-NPB

-continued

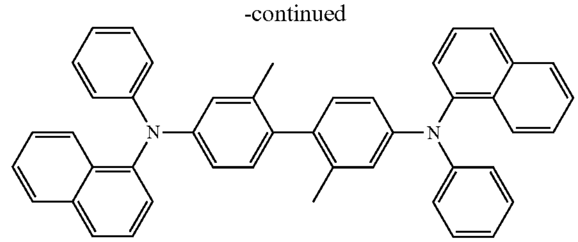

methylated NPB

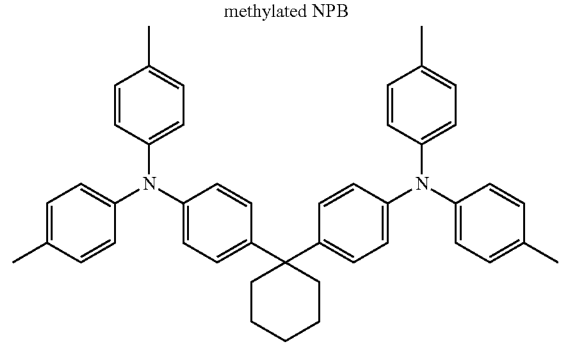

TAPC

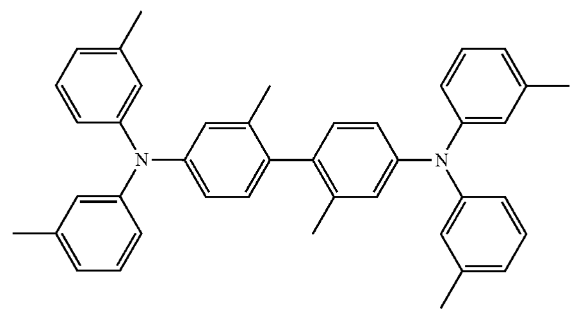

HMTPD

Formula 201

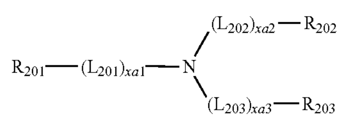

Formula 202

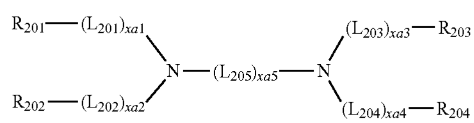

wherein, in Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, $R_{201}$ and $R_{202}$ in Formula 202 may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In an embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$ and —$N(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from: a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$) and —N($Q_{31}$)($Q_{32}$), wherein $Q_{31}$ to $Q_{33}$ may each independently be the same as described above.

In one or more embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked to each other via a single bond, and/or ii) $R_{203}$ and $R_{204}$ may be linked to each other via a single bond.

In one or more embodiments, at least one of $R_{201}$ to $R_{204}$ in Formula 202 may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, the compound represented by Formula 201 may be represented by Formula 201A below:

Formula 201A

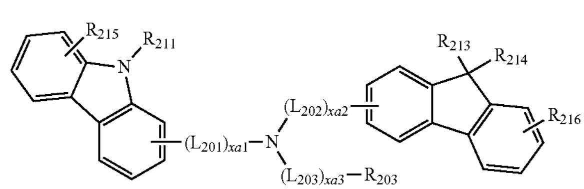

In one or more embodiments, the compound represented by Formula 201 may be represented by Formula 201A(1) below, but embodiments of the present disclosure are not limited thereto:

Formula 201A(1)

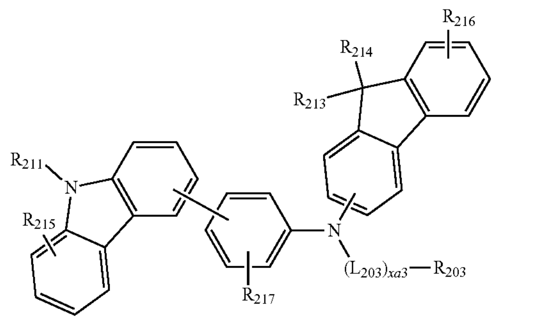

In one or more embodiments, the compound represented by Formula 201 may be represented by Formula 201A-1 below, but embodiments of the present disclosure are not limited thereto:

Formula 201A-1

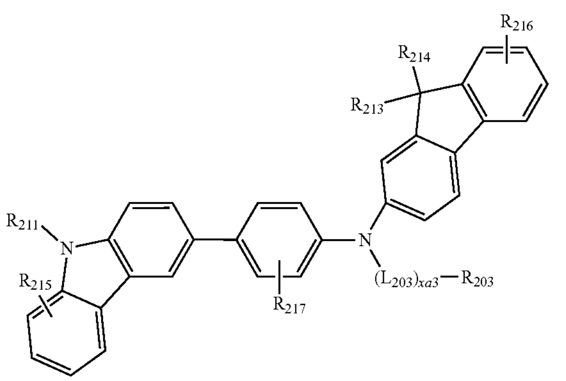

In one or more embodiments, the compound represented by Formula 202 may be represented by Formula 202A below:

Formula 202A

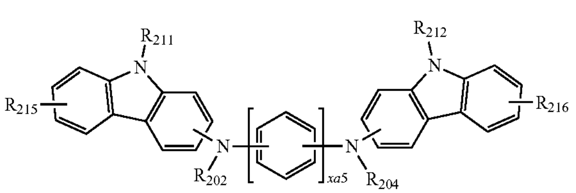

In one or more embodiments, the compound represented by Formula 202 may be represented by Formula 202A-1 below:

Formula 202A-1

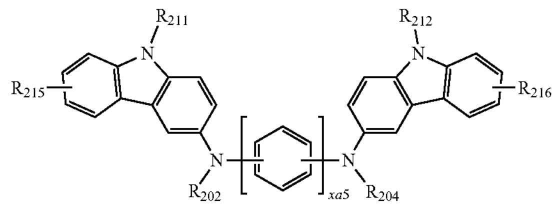

In Formulae 201A, 201A(1), 201A-1, 202A, and 202A-1, $L_{201}$ to $L_{203}$, xa1 to xa3, xa5, and $R_{202}$ to $R_{204}$ may be the same as respectively described above, $R_{211}$ and $R_{212}$ may each independently be the same as described in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from compounds HT1 to HT39, but compounds to be included in the hole transport region are not limited thereto:

HT1
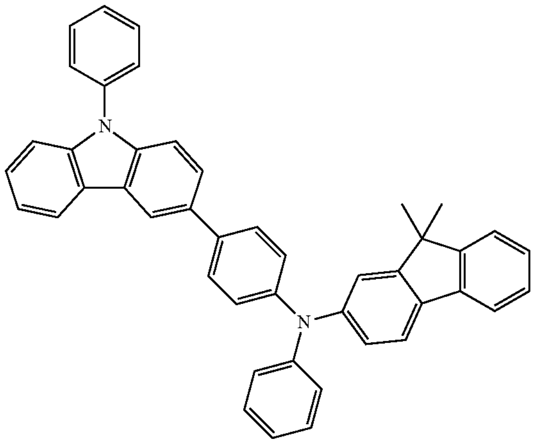
HT2
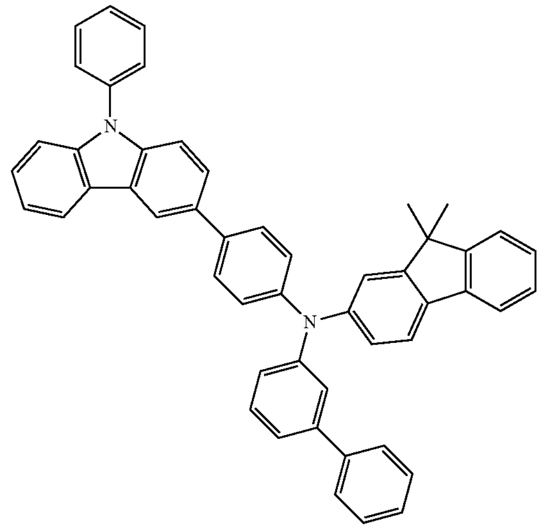
HT3
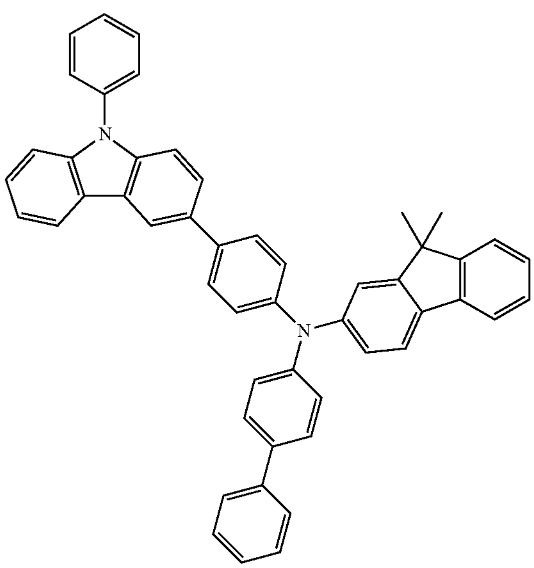
HT4
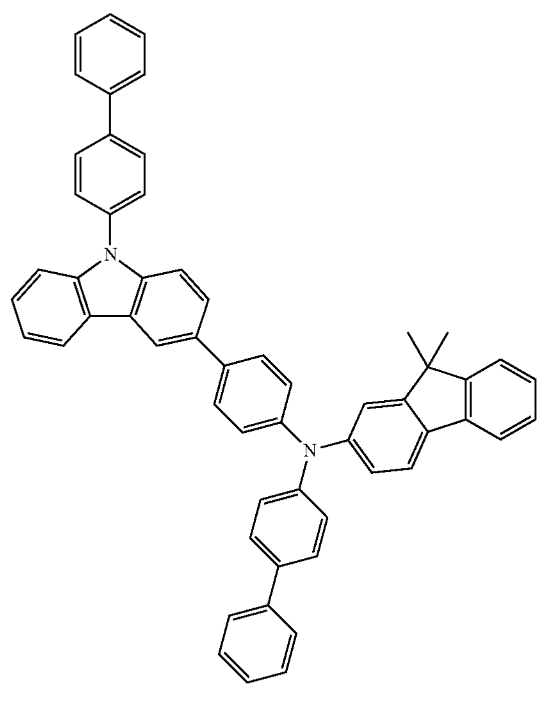

-continued
HT5
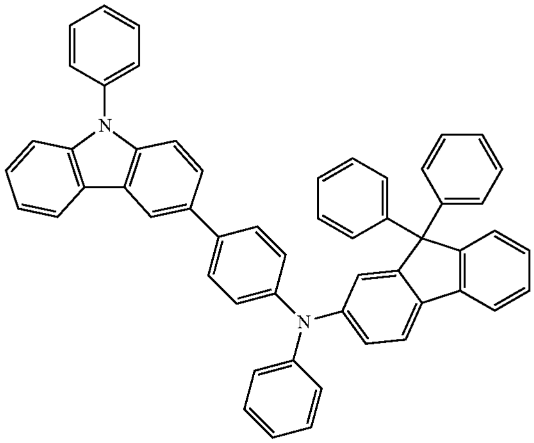
HT6
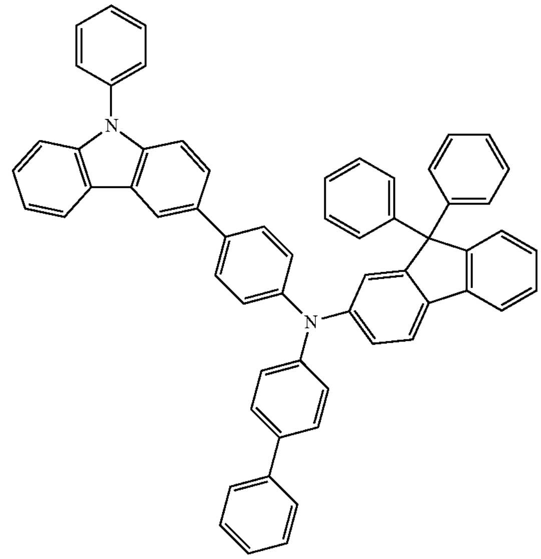
HT7
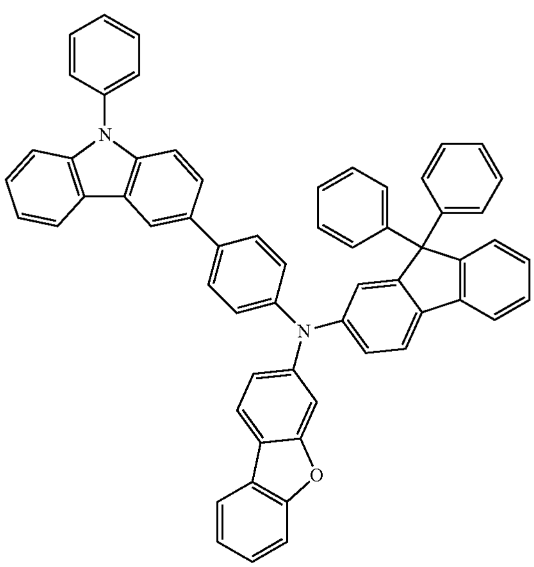
HT8
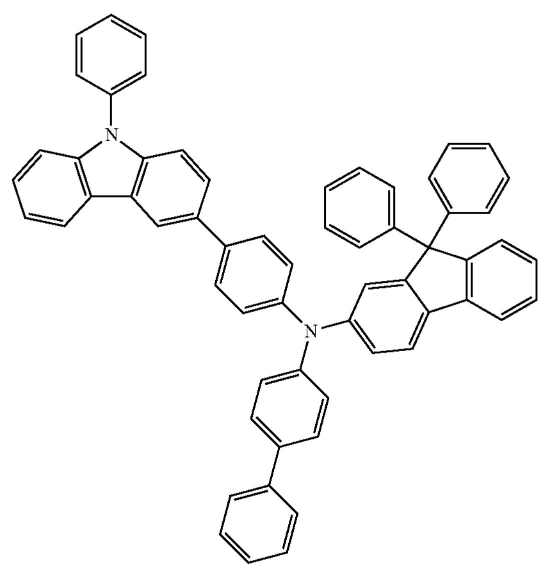

-continued
HT9
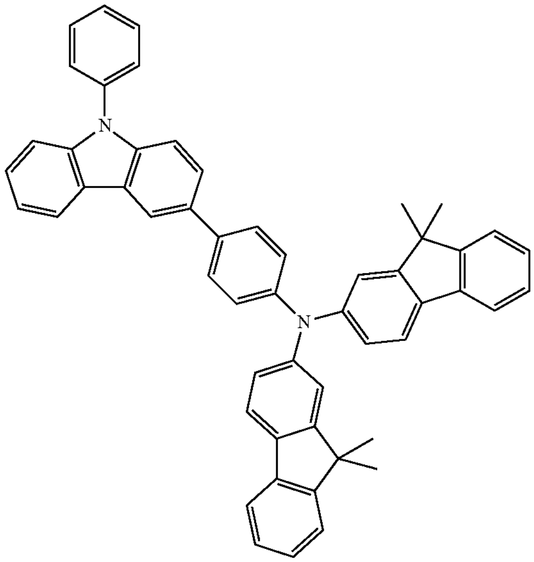
HT10
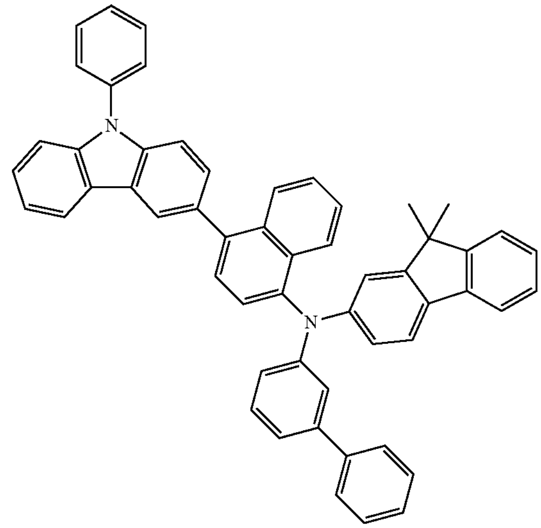
HT11
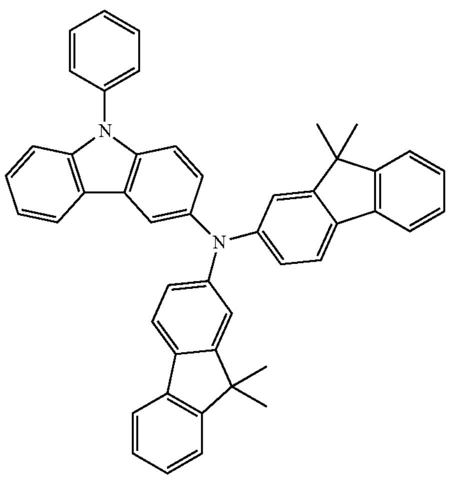
HT12
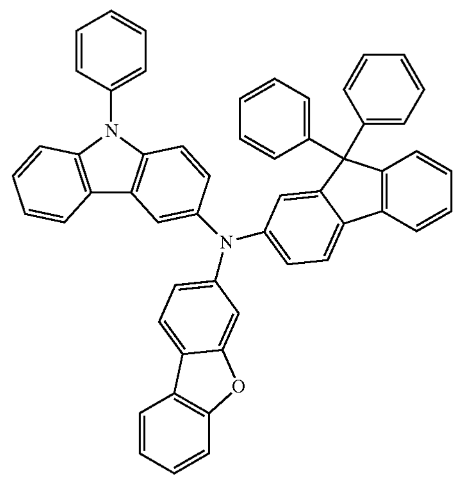
HT13
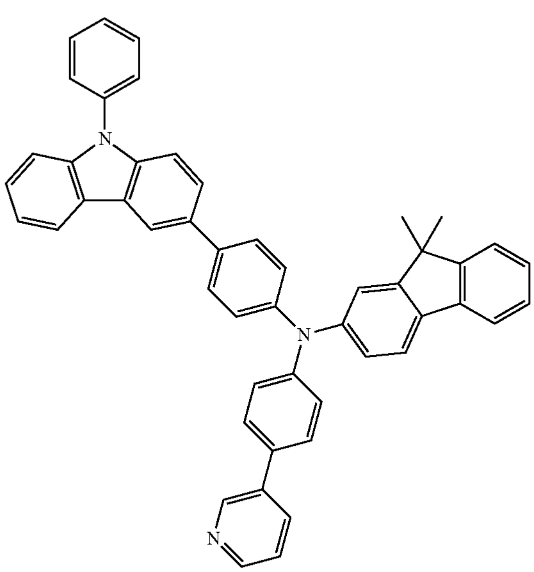
HT14
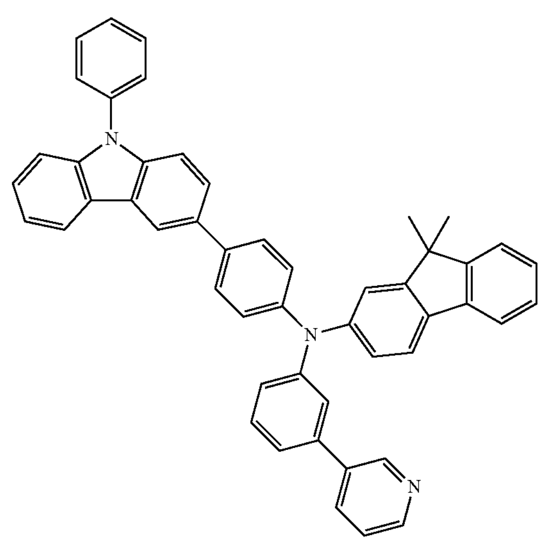

-continued
HT15
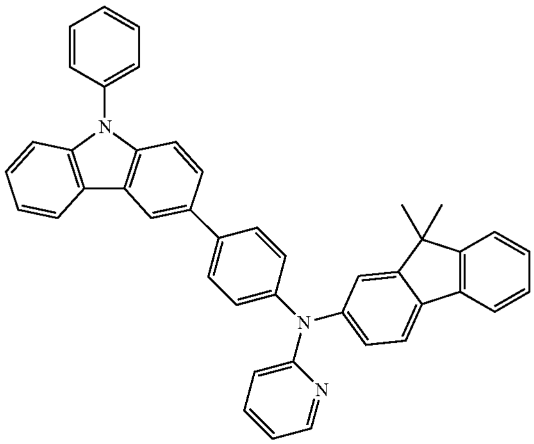
HT16
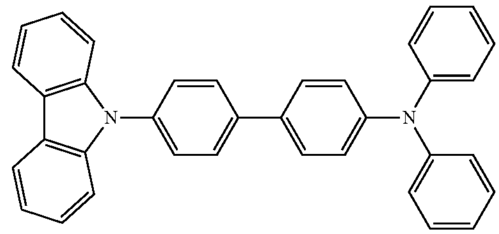
HT17
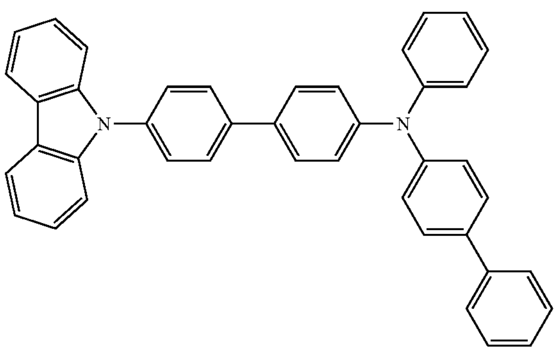
HT18
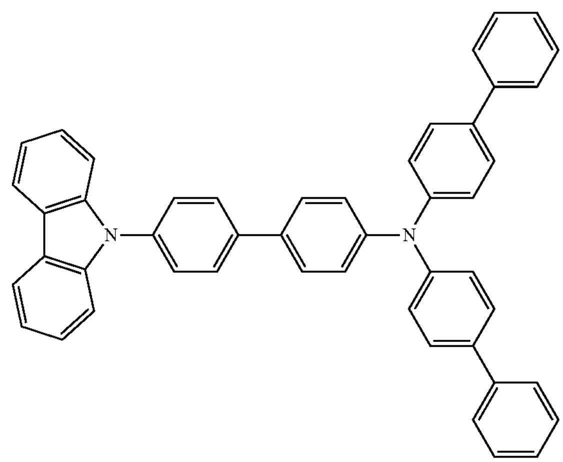
HT19
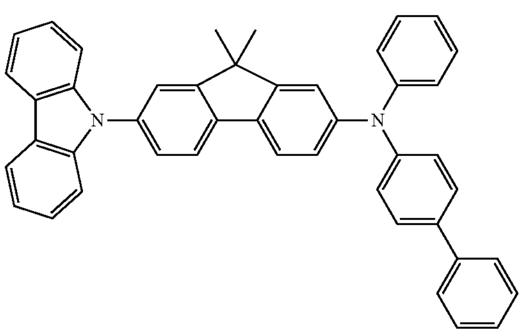
HT20
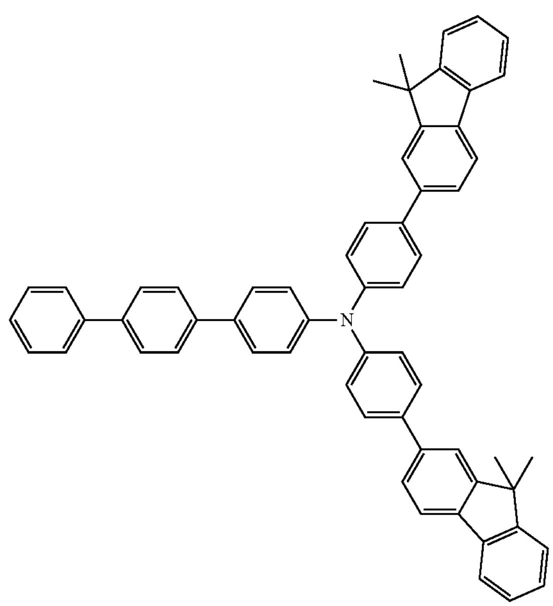

-continued
HT21
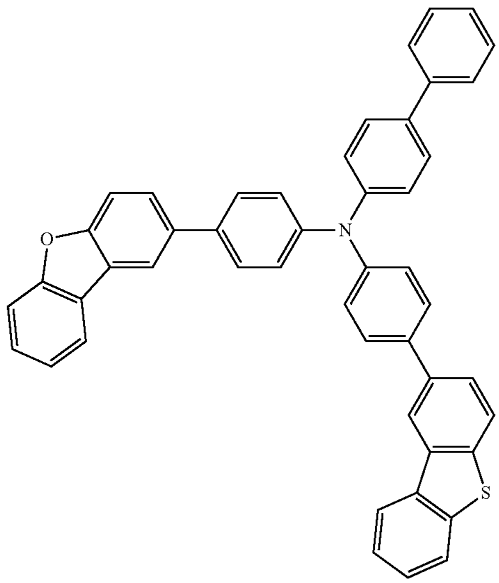
HT22
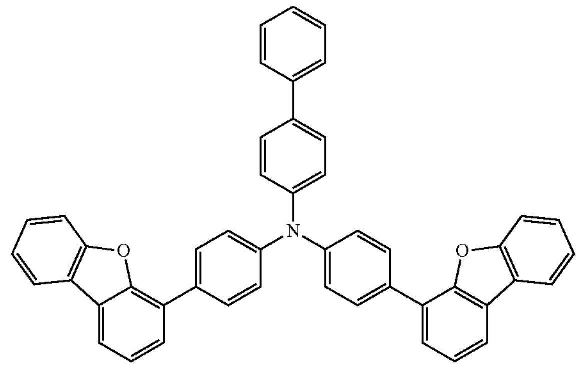
HT23
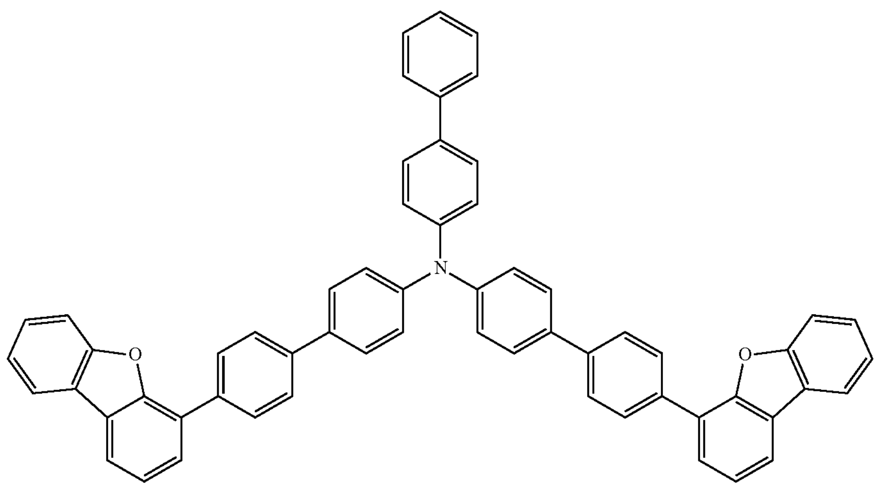
HT24
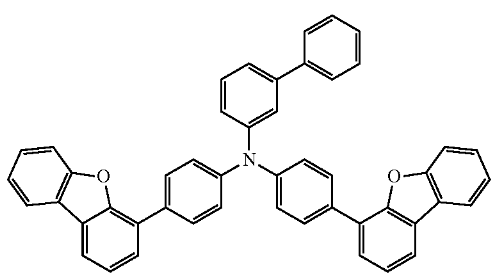
HT25
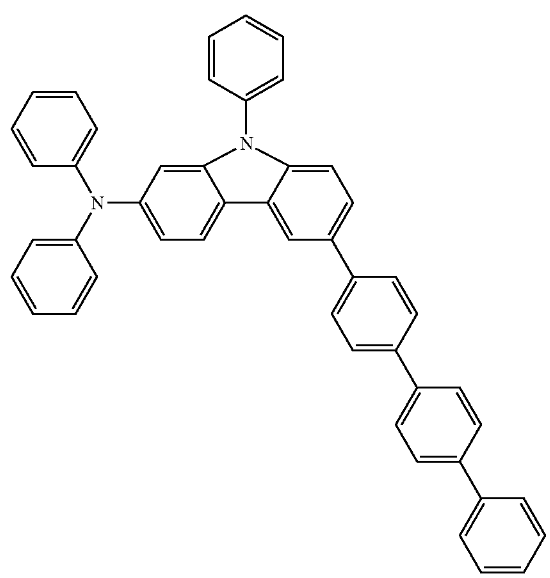

-continued
HT26
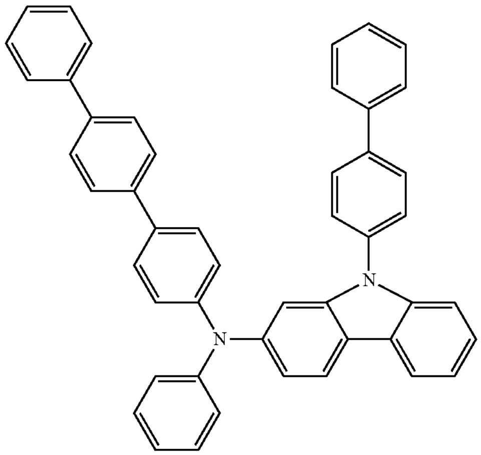
HT27
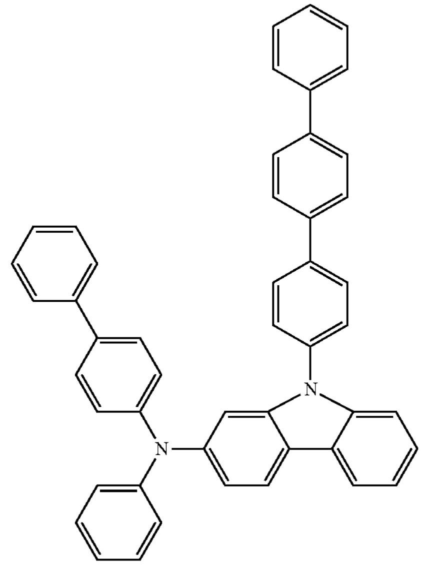
HT28
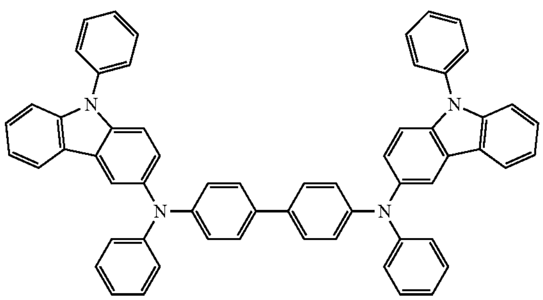
HT29
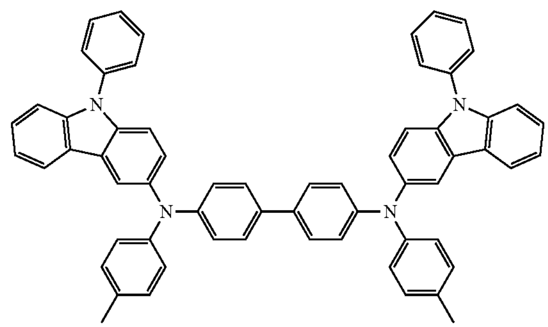
HT30
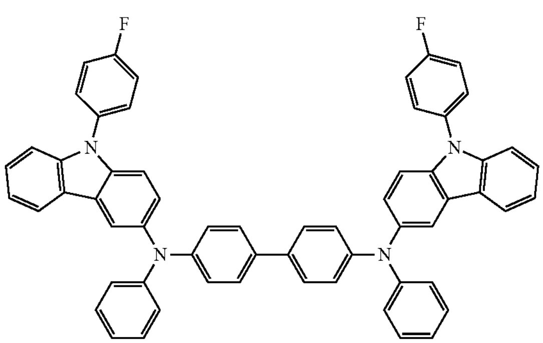
HT31
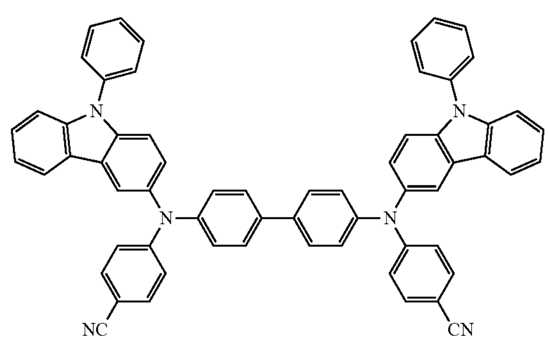

-continued
HT32
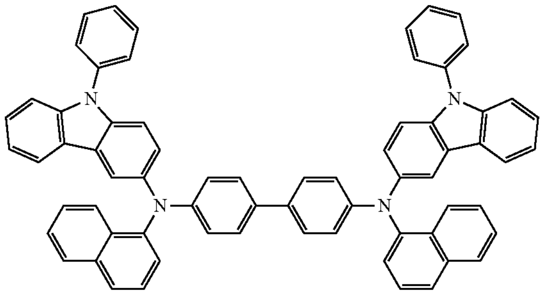
HT33
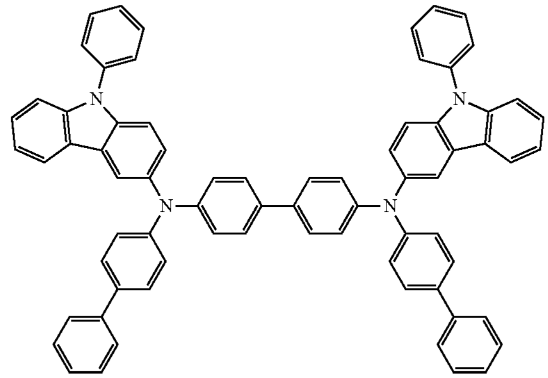
HT34
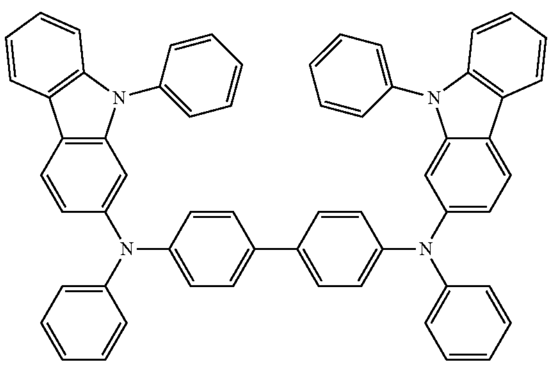
HT35
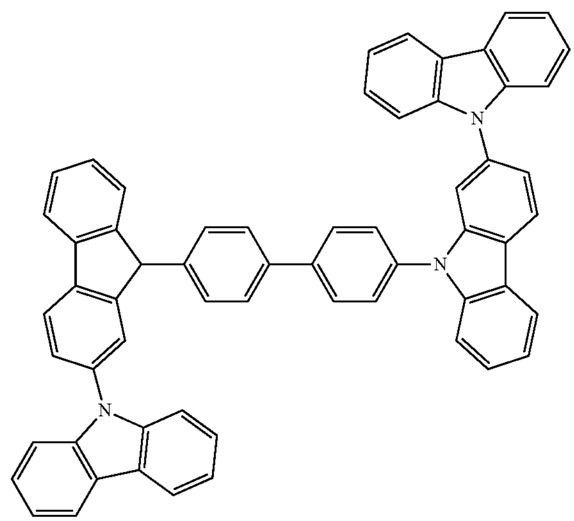
HT36
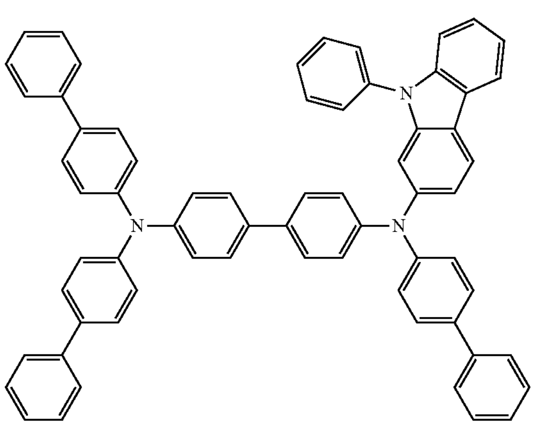
HT37
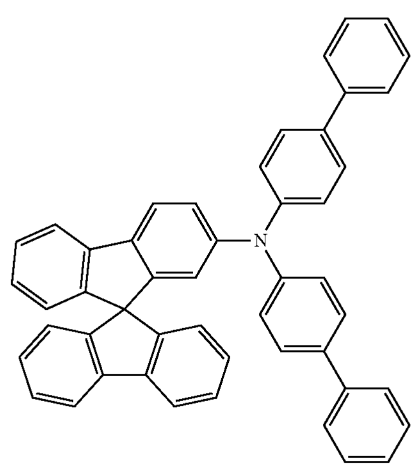

-continued

HT38

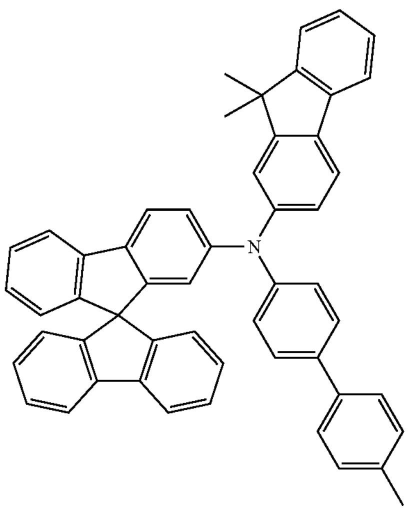

HT39

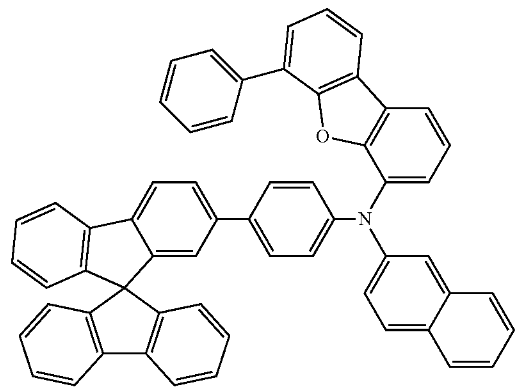

A thickness of the hole transport region may be in a range of about 100 Å to about 10,000 Å, for example, about 100 Å to about 1,000 Å. When the hole transport region includes at least one selected from a hole injection layer and a hole transport layer, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

P-Dopant

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In an embodiment, the p-dopant may have a lowest unoccupied molecular orbital (LUMO) energy level of −3.5 eV or less.

The p-dopant may include at least one selected from a quinone derivative, a metal oxide, and a cyano group-containing compound, but embodiments of the present disclosure are not limited thereto.

In an embodiment, the p-dopant may include at least one selected from:

- a quinone derivative, such as tetracyanoquinodimethane (TCNQ) and/or 2,3,5,6-tetrafluoro-7,7,8,8-tetracyanoquinodimethane (F4-TCNQ);
- a metal oxide, such as tungsten oxide and/or molybdenum oxide;
- 1,4,5,8,9,12-hexaazatriphenylene-hexacarbonitrile (HAT-CN); and
- a compound represented by Formula 221 below, but embodiments of the present disclosure are not limited thereto:

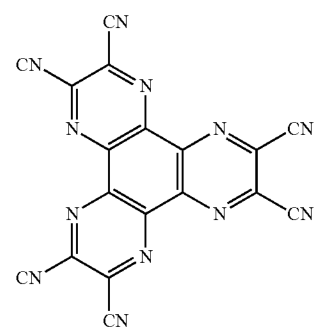

HAT-CN

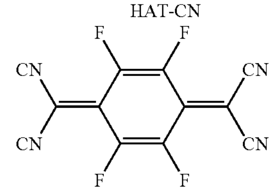

F4-TCNQ

Formula 221

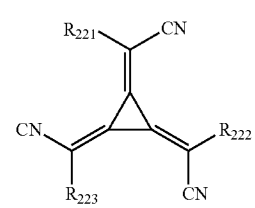

wherein, in Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

When the organic light-emitting device 10 is a full-color organic light-emitting device, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers may contact each other or may be separated from each other. In one or more embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include at least one selected from a phosphorescent dopant and a fluorescent dopant. The phosphorescent dopant may include the organometallic compound represented by Formula 1.

An amount of a dopant in the emission layer may be, based on about 100 parts by weight of the host, in the range of about 0.01 to about 15 parts by weight, but embodiments of the present disclosure are not limited thereto.

A thickness of the emission layer may be in a range of about 100 Å to about 1,000 Å, for example, about 200 Å to about 600 Å. When the thickness of the emission layer is within these ranges, suitable (e.g., excellent) light-emission characteristics may be obtained without a substantial increase in driving voltage.

Host in Emission Layer

In one or more embodiments, the host may include a compound represented by Formula 301 below.

$$[Ar_{301}]_{xb11}\text{-}[(L_{301})_{xb1}\text{-}R_{301}]_{xb21} \qquad \text{Formula 301}$$

wherein, in Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), and —P(═O)($Q_{301}$)($Q_{302}$), and xb21 may be an integer from 1 to 5, wherein $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In an embodiment, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

When xb11 in Formula 301 is two or more, two or more of $Ar_{301}$(s) may be linked via a single bond.

In one or more embodiments, the compound represented by Formula 301 may be represented by one of Formula 301-1 and Formula 301-2:

Formula 301-1

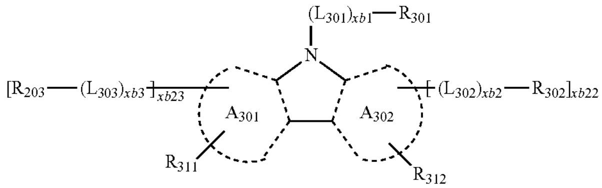

Formula 301-2

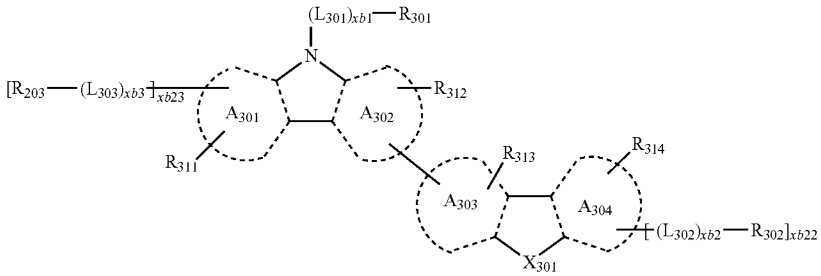

In Formulae 301-1 and 301-2

$A_{301}$ to $A_{304}$ may each independently be selected from a benzene ring, a naphthalene ring, a phenanthrene ring, a fluoranthene ring, a triphenylene ring, a pyrene ring, a chrysene ring, a pyridine ring, a pyrimidine ring, an indene ring, a fluorene ring, a spiro-bifluorene ring, a benzofluorene ring, a dibenzofluorene ring, an indole ring, a carbazole ring, a benzocarbazole ring, a dibenzocarbazole ring, a furan ring, a benzofuran ring, a dibenzofuran ring, a naphthofuran ring, a benzonaphthofuran ring, a dinaphthofuran ring, a thiophene ring, a benzothiophene ring, a dibenzothiophene ring, a naphthothiophene ring, a benzonaphthothiophene ring, and a dinaphthothiophene ring, $X_{301}$ may be O, S, or N-[$(L_{304})_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, xb22 and xb23 may each independently be 0, 1, or 2, $L_{301}$, xb1, $R_{301}$ and $Q_{31}$ to $Q_{33}$ may each independently be the same as respectively described above, $L_{302}$ to $L_{304}$ may each independently the same as described in connection with $L_{301}$, xb2 to xb4 may each independently be the same as described in connection with xb1, and $R_{302}$ to $R_{304}$ may each independently the same as described in connection with $R_{301}$.

For example, $L_{301}$ to $L_{304}$ in Formulae 301, 301-1, and 301-2 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_{31}$ to $Q_{33}$ may each independently be the same as described above.

In an embodiment, $R_{301}$ to $R_{304}$ in Formulae 301, 301-1, and 301-2 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_{31}$ to $Q_{33}$ may each independently be the same as described above.

In one or more embodiments, the host may include an alkaline earth metal complex. For example, the host may be selected from a Be complex (for example, Compound H55), an Mg complex, and a Zn complex.

The host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, but embodiments of the present disclosure are not limited thereto:

H1

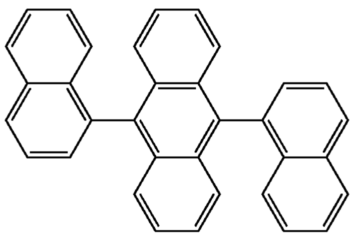

H2

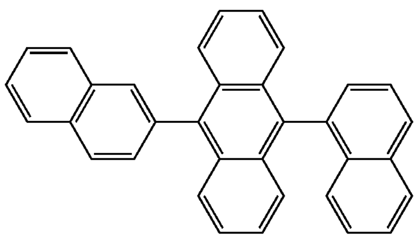

H3

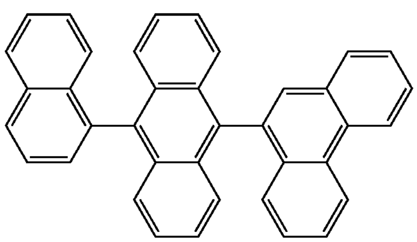

H4

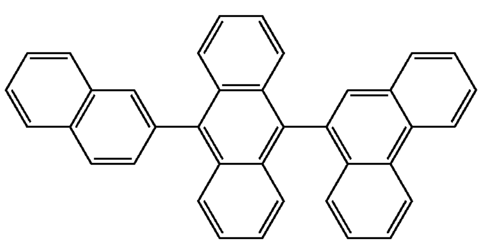

H5

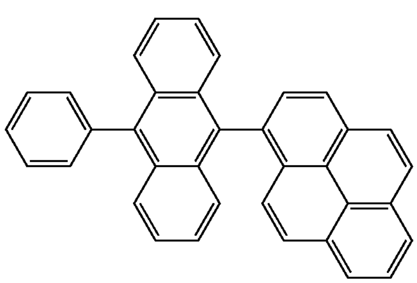

-continued

H6

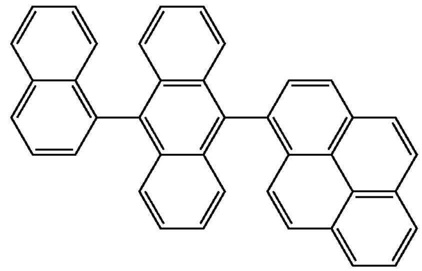

H7

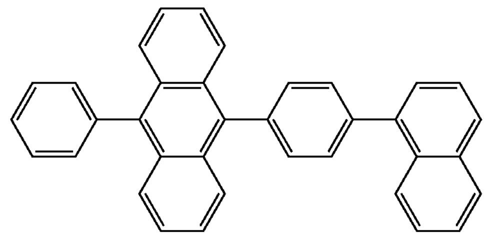

H8

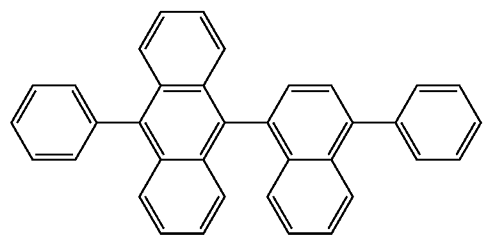

H9

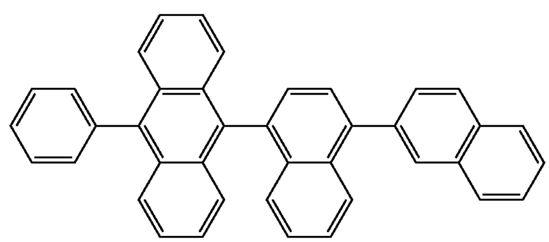

H10

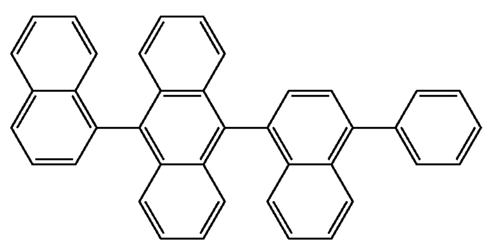

H11

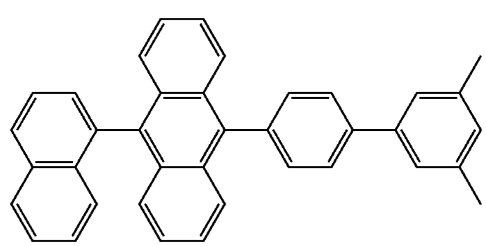

-continued
H12
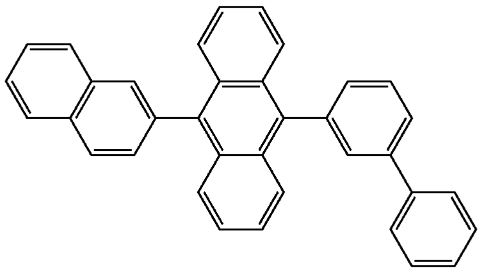
H13
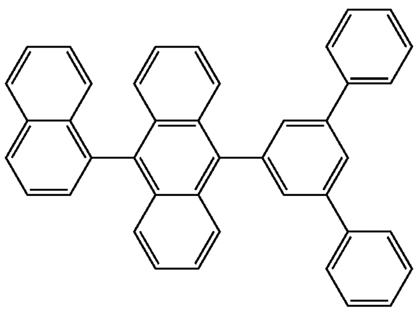
H14
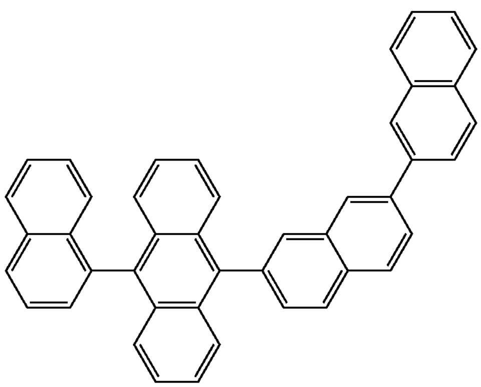
H15
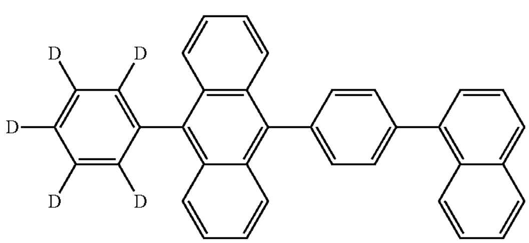
H16
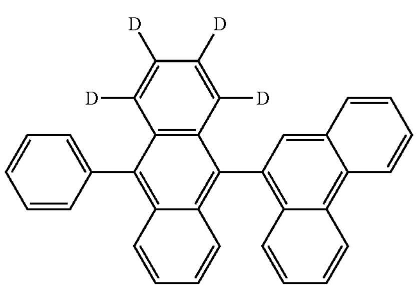
-continued
H17
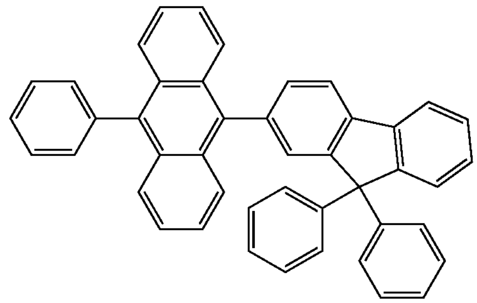
H18
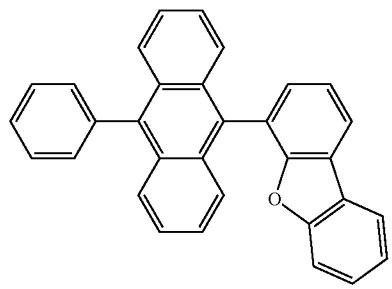
H19
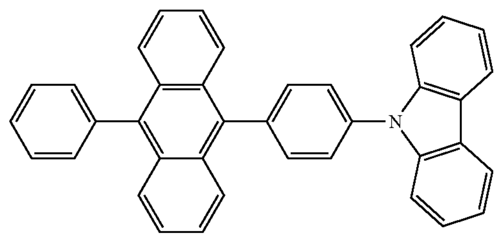
H20
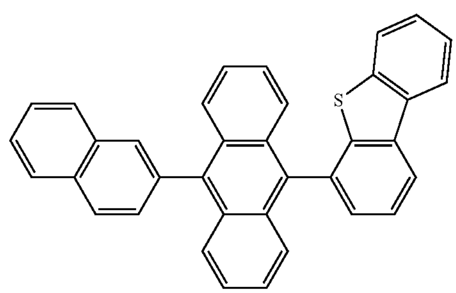
H21
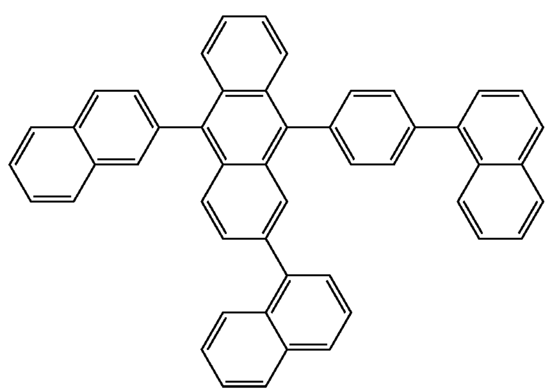

-continued
H22
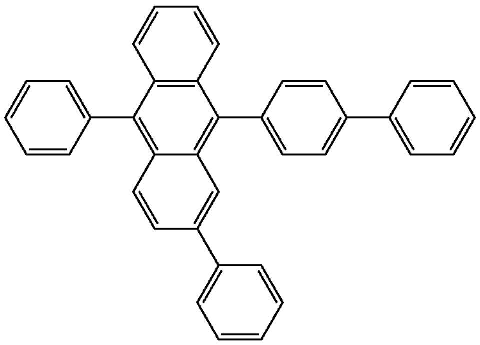
H23
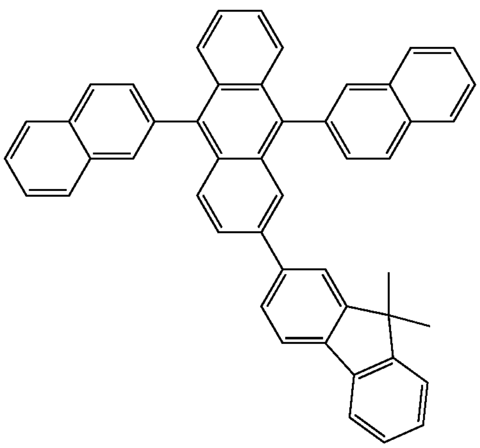
H24
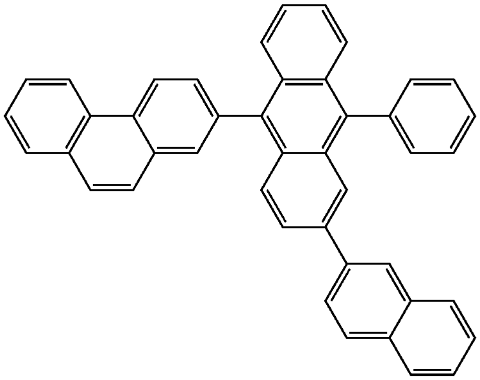
-continued
H25
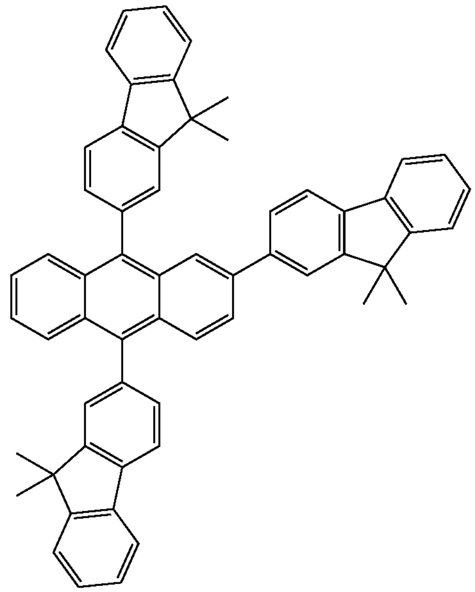
H26
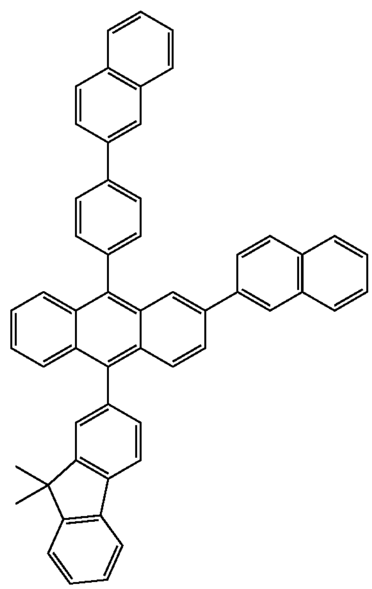
H27
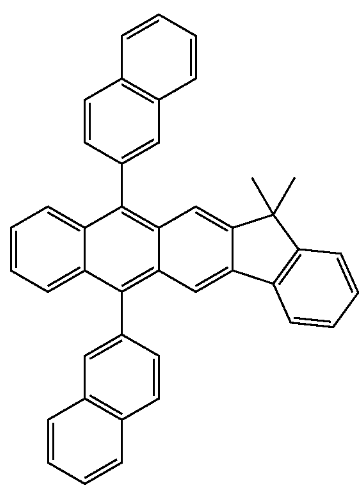

-continued
H28
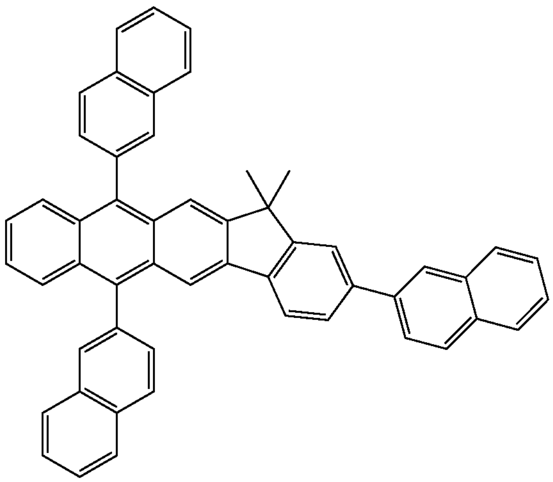
H29
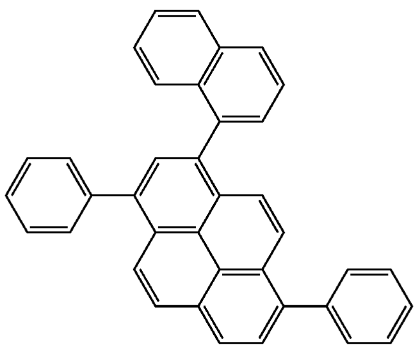
H30
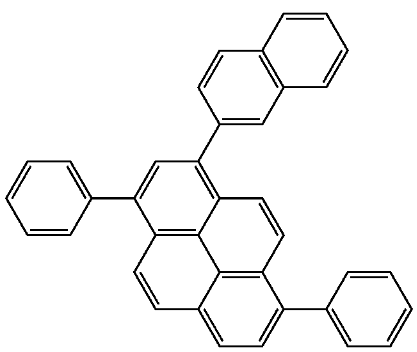
H31
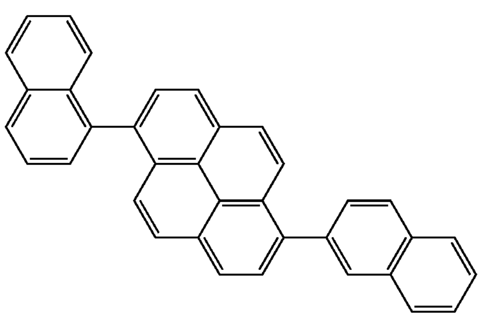
-continued
H32
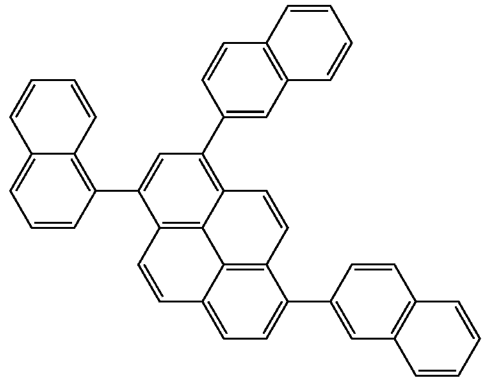
H33
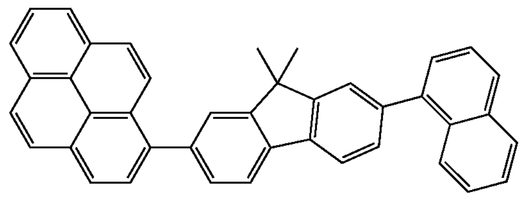
H34
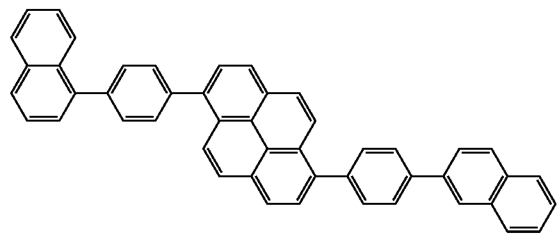
H35
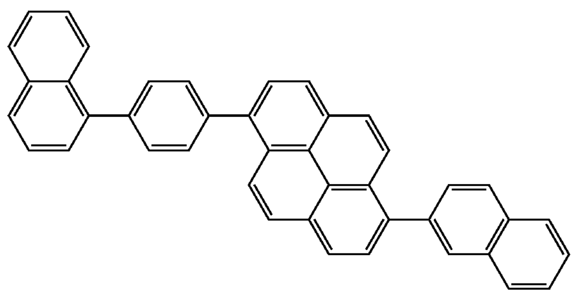
H36
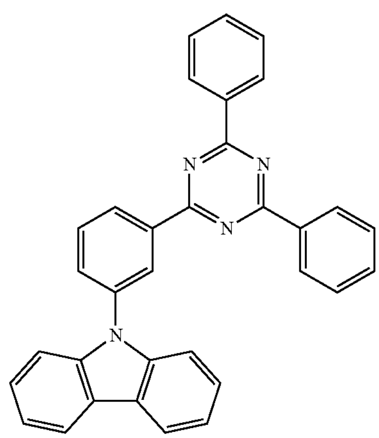

-continued
H37
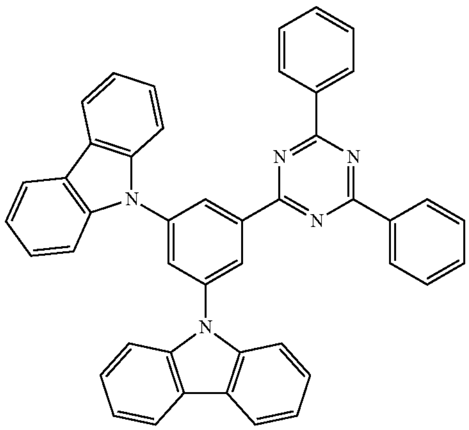
H38
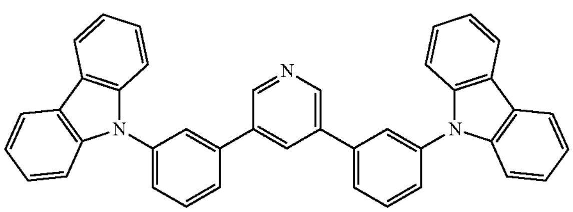
H39
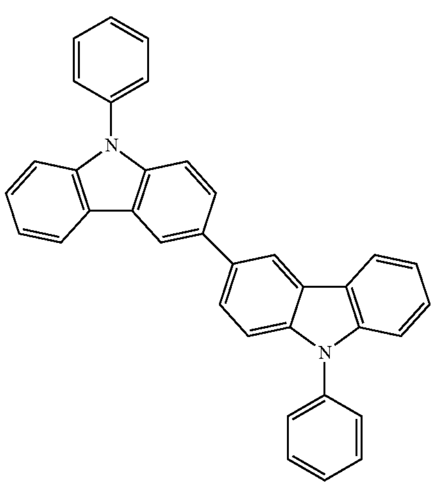
-continued
H40
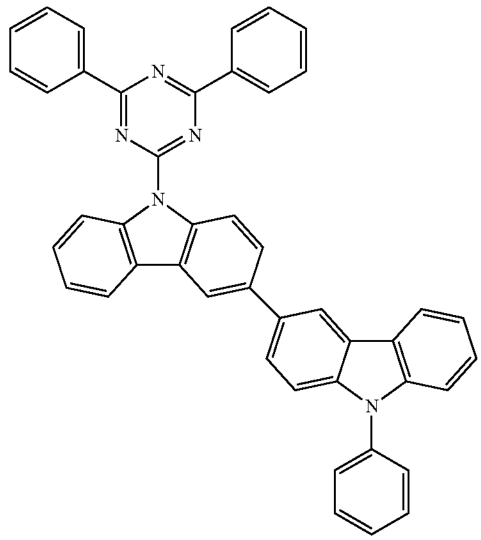
H41
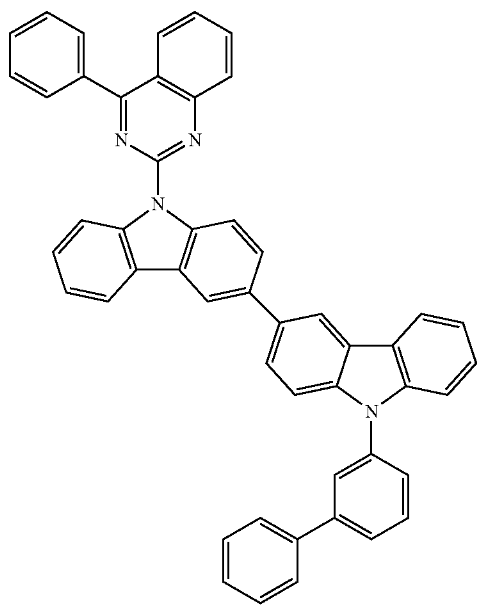
H42
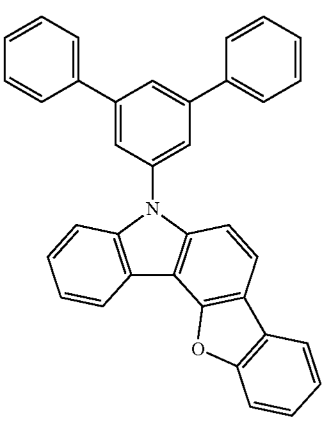

H43
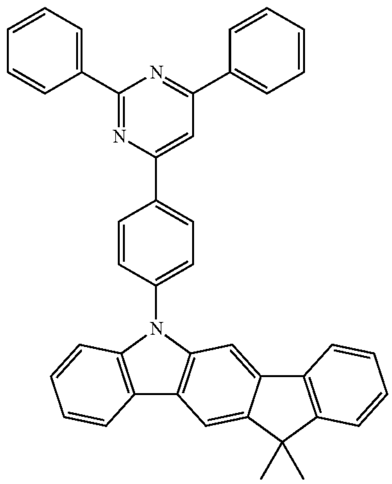
H44
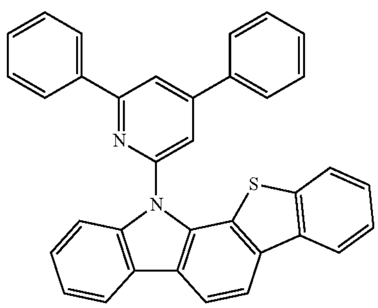
H45
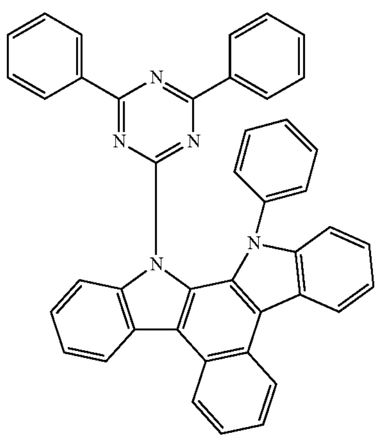
H46
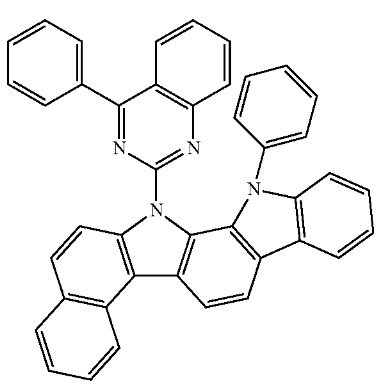
H47
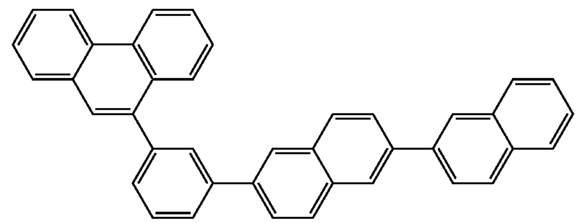
H48
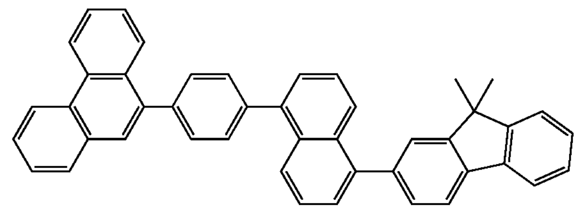
H49
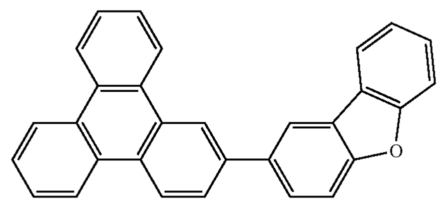
H50
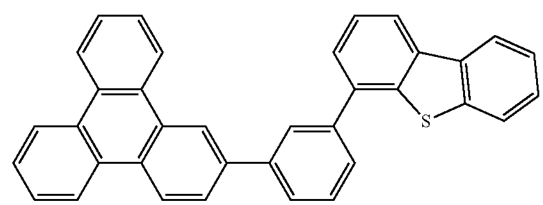
H51
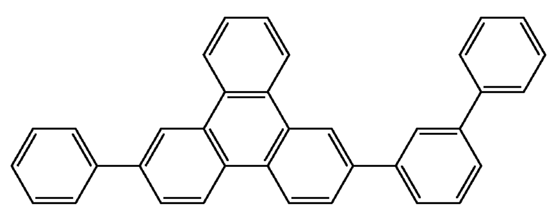
H52
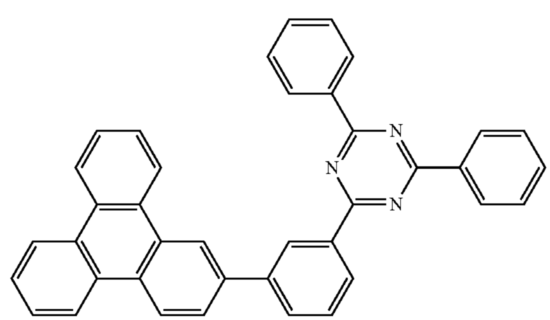

-continued

H53

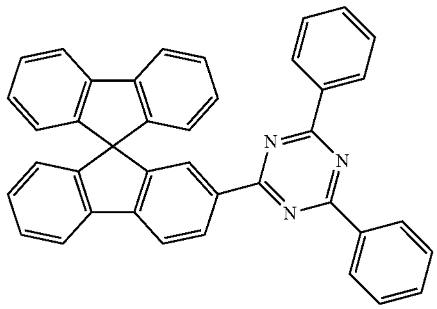

H54

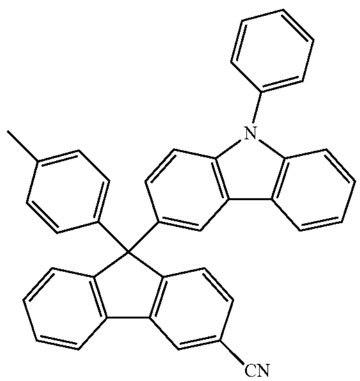

H55

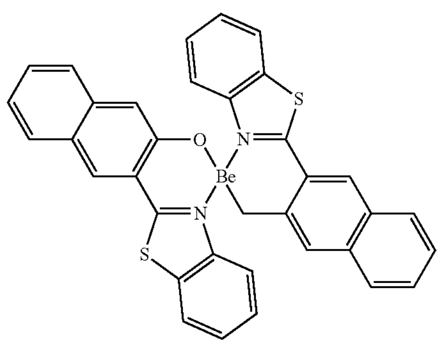

In an embodiment, the host may include at least one selected from a silicon-containing compound (for example, BCPDS utilized in the following examples and/or the like) and a phosphine oxide-containing compound (for example, POPCPA utilized in the following examples and/or the like).

The host may include only one compound or may include two or more compounds that are different from each other (for example, the host of the following Examples includes BCPDS and POPCPA). In one or more embodiment, the host may instead have various suitable modifications.

Phosphorescent Dopant Included in Emission Layer in Organic Layer 150

The phosphorescent dopant may include the organometallic compound represented by Formula 1:

In addition, the phosphorescent dopant may include an organometallic complex represented by Formula 401 below:

Formula 401

$$M(L_{401})_{xc1}(L_{402})_{xc2}$$

Formula 402

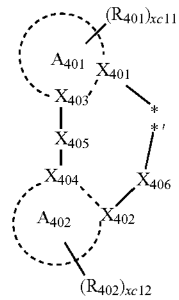

wherein, in Formulae 401 and 402,

M may be selected from iridium (Ir), platinum (Pt), palladium (Pd), osmium (Os), titanium ($T_1$), zirconium (Zr), hafnium (Hf), europium (Eu), terbium (Tb), rhodium (Rh), and thulium (Tm), $L_{401}$ may be a ligand represented by Formula 402, and xc1 may be 1, 2, or 3, wherein when xc1 is two or more, two or more $L_{401}$(s) may be identical to or different from each other, $L_{402}$ may be an organic ligand, and xc2 may be an integer from 0 to 4, wherein when xc2 is two or more, two or more L402(s) may be identical to or different from each other, $X_{401}$ to $X_{404}$ may each independently be nitrogen or carbon, $X_{401}$ and $X_{403}$ may be linked via a single bond or a double bond, and $X_{402}$ and $X_{404}$ may be linked via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—C(═O)—*', *—N($Q_{411}$)-*', *—C($Q_{411}$)($Q_{412}$)-*', *—C($Q_{411}$)═C($Q_{412}$)-*', *—C($Q_{411}$)═*' or *═C═*', wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{401})(Q_{402})(Q_{403})$, $—N(Q_{401})(Q_{402})$, $—B(Q_{401})(Q_{402})$, $—C(=O)(Q_{401})$, $—S(=O)_2(Q_{401})$, and $—P(=O)(Q_{401})(Q_{402})$, and $Q_{401}$ to $Q_{403}$ may each independently be selected from a $C_1$-$C_{10}$ alkyl group, a $C_1$-$C_{10}$ alkoxy group, a $C_3$-$C_{20}$ aryl group, and a $C_1$-$C_{20}$ heteroaryl group, xc11 and xc12 may each independently be an integer from 0 to 10, and

* and *' in Formula 402 each indicate a binding site to a M in Formula 401.

In an embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen and $X_{402}$ may be carbon, or ii) $X_{401}$ and $X_{402}$ may each be nitrogen at the same time.

In one or more embodiments, $R_{401}$ and $R_{402}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group, and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and $—Si(Q_{401})(Q_{402})(Q_{403})$, $—N(Q_{401})(Q_{402})$, $—B(Q_{401})(Q_{402})$, $—C(=O)(Q_{401})$, $—S(=O)_2(Q_{401})$, and $—P(=O)(Q_{401})(Q_{402})$, wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments of the present disclosure are not limited thereto.

In one or more embodiments, when xc1 in Formula 401 is two or more, two $A_{401}$(s) in two or more $L_{401}$(s) may optionally be linked to each other via $X_{407}$, which is a linking group, two $A_{402}$(s) may optionally be linked to each other via $X_{408}$, which is a linking group (see Compounds PD1 to PD4 and PD7). $X_{407}$ and $X_{408}$ may each independently be a single bond, *—O—*', *—S—*', *—C(=O)—*', *—N($Q_{413}$)-*', *—C($Q_{413}$)($Q_{414}$)-*' or *—C($Q_{413}$)=C($Q_{414}$)-*'(where $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

$L_{402}$ in Formula 401 may be a monovalent, divalent, or trivalent organic ligand. For example, $L_{402}$ may be selected from halogen, diketone (for example, acetylacetonate), carboxylic acid (for example, picolinate), —C(=O), isonitrile, —CN, and a phosphorus-containing material (for example, phosphine, or phosphite), but embodiments of the present disclosure are not limited thereto.

In one or more embodiments, the phosphorescent dopant may be selected from, for example, Compounds PD1 to PD25, but embodiments of the present disclosure are not limited thereto:

PD1

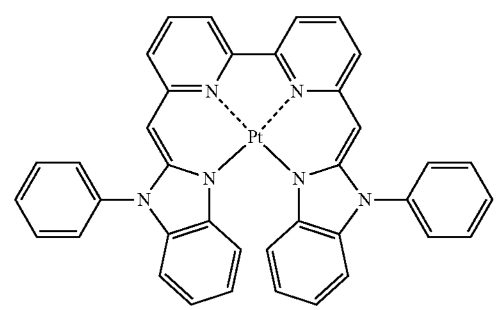

PD2

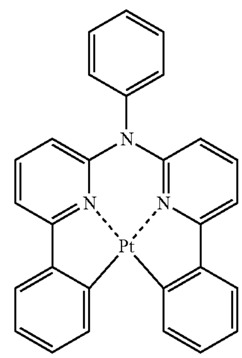

-continued
PD3
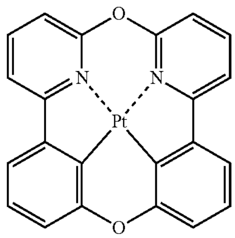
PD4
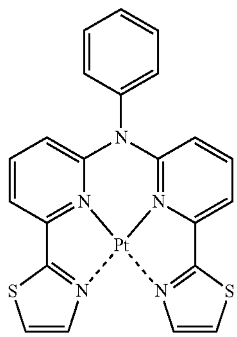
PD5
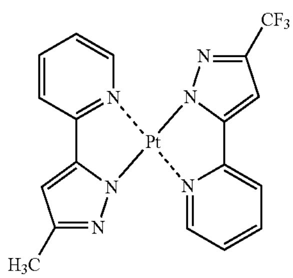
PD6
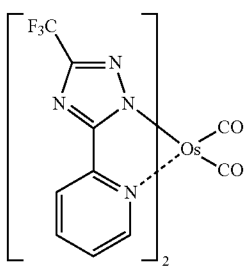
PD7
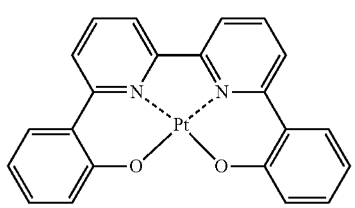
PD8
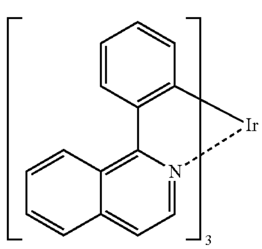
-continued
PD9
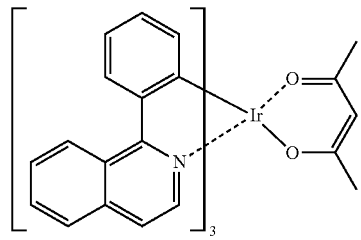
PD10
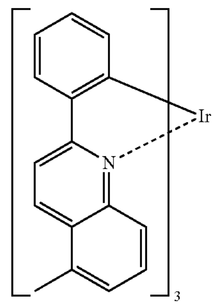
PD11
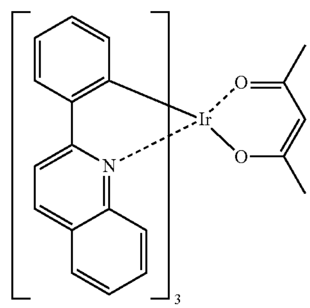
PD12
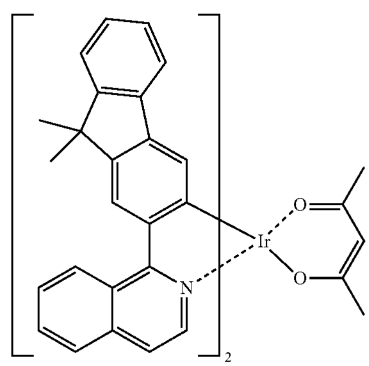
PD13
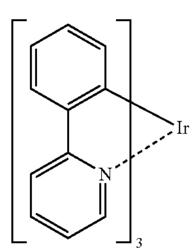

PD14
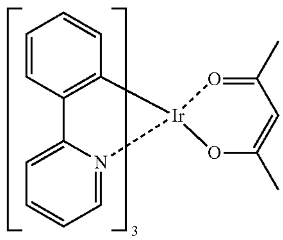
PD15
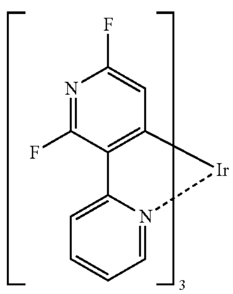
PD16
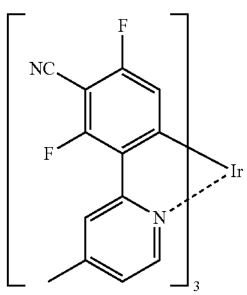
PD17
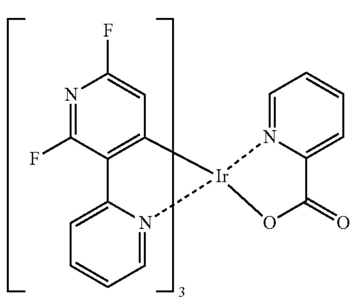
PD18
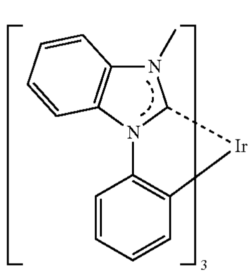
PD19
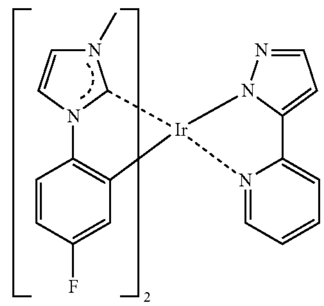
PD20
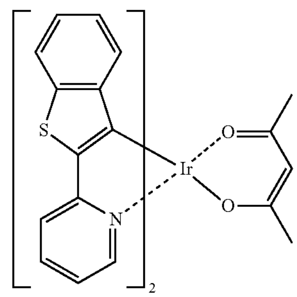
PD21
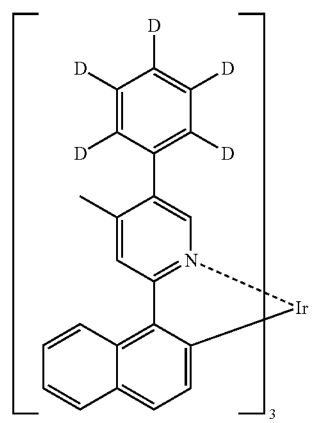
PD22
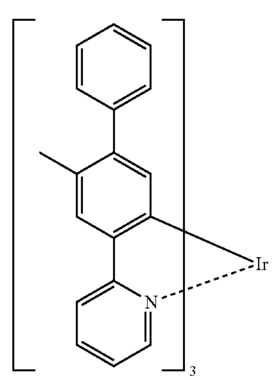

-continued

PD23

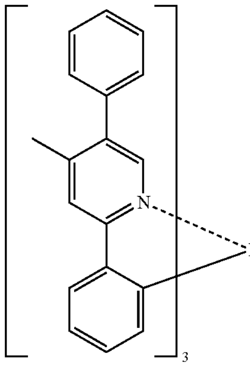

PD24

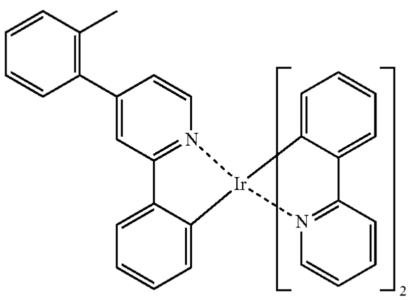

PD25

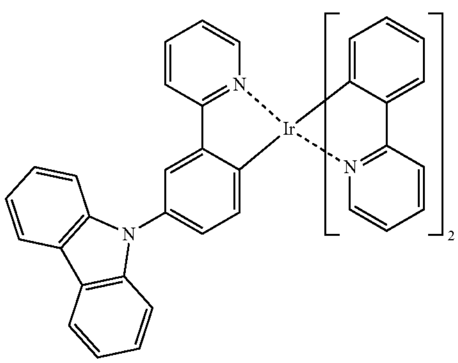

Fluorescent Dopant in Emission Layer

The fluorescent dopant may include an arylamine compound or a styrylamine compound.

The fluorescent dopant may include a compound represented by Formula 501 below.

Formula 501

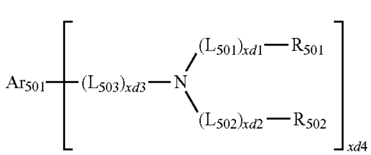

wherein, in Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In an embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments of the present disclosure are not limited thereto.

For example, the fluorescent dopant may be selected from Compounds FD1 to FD22:

FD1

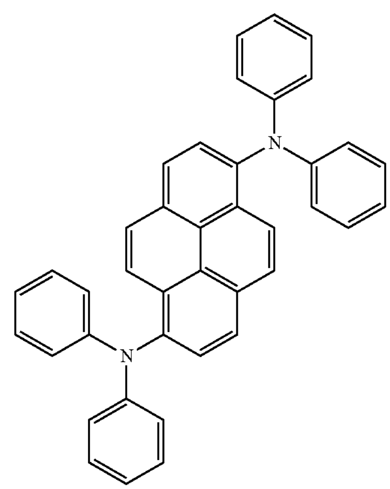

FD2

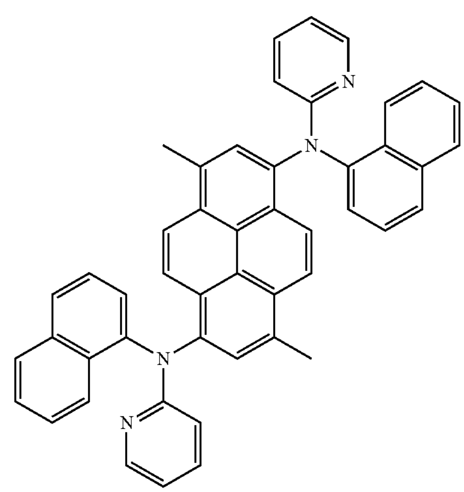

-continued
FD3
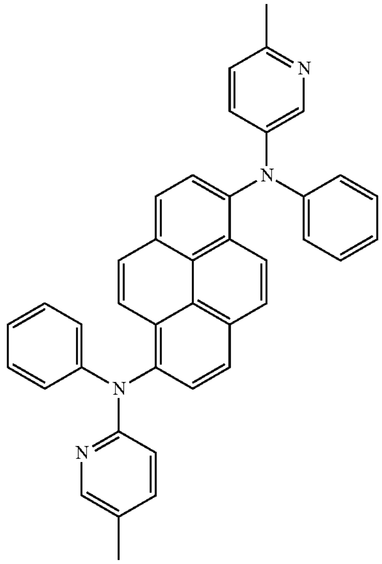
FD4
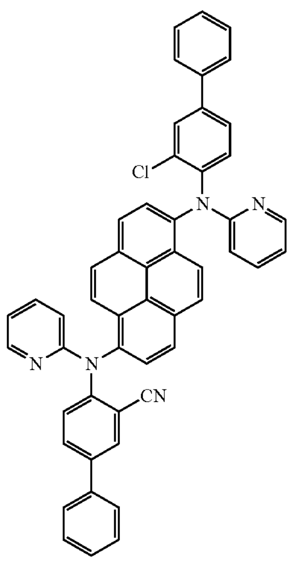
FD5
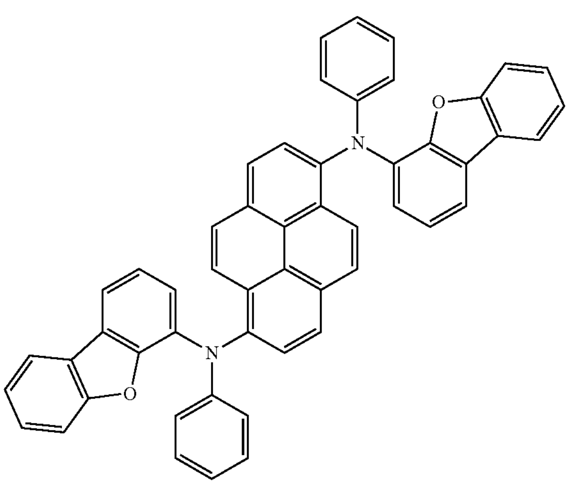
-continued
FD6
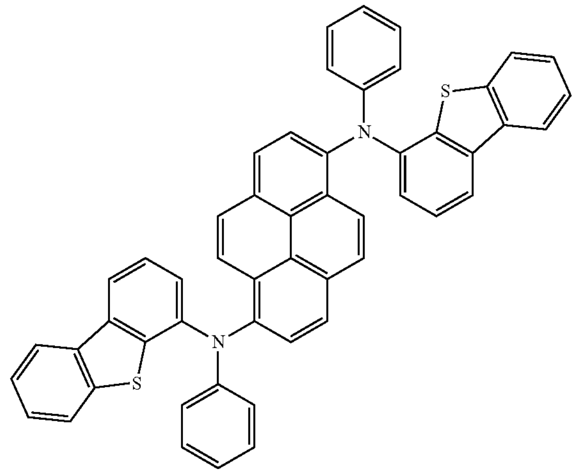
FD7
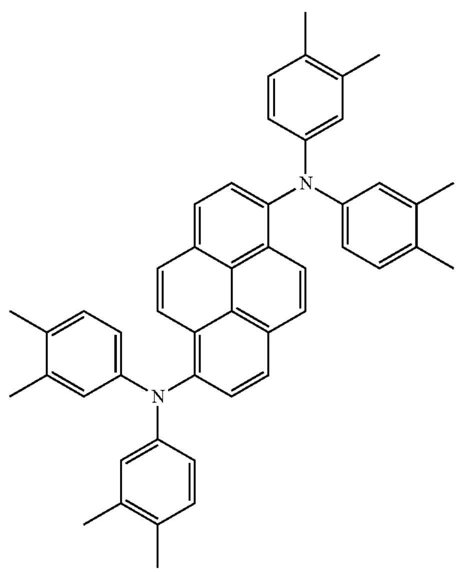
FD8
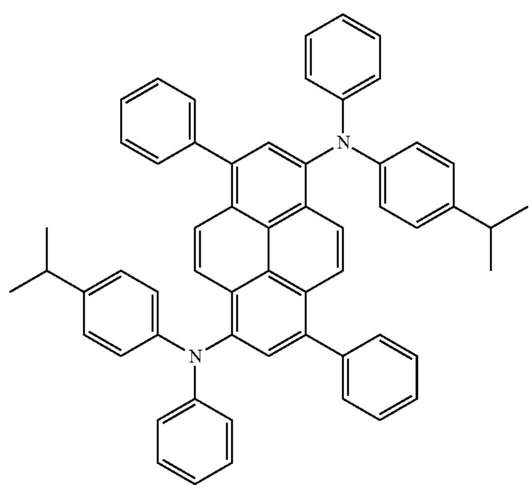

-continued
FD9
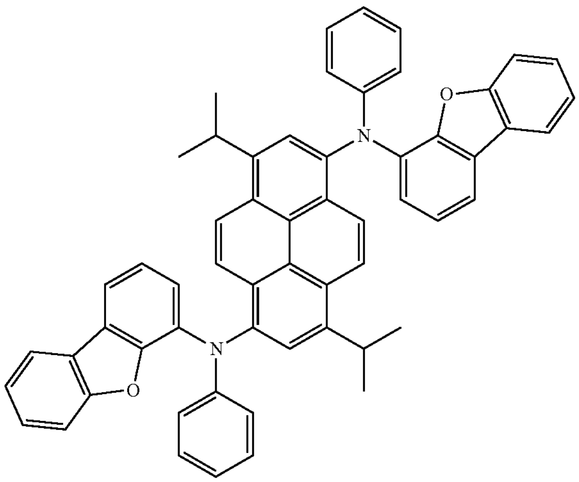
FD10
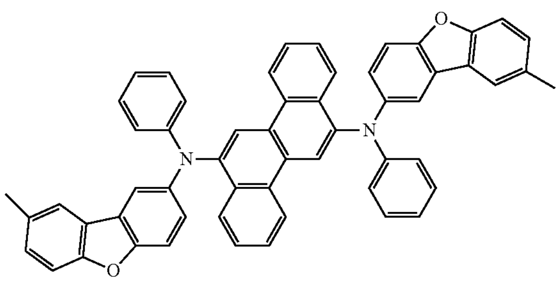
FD11
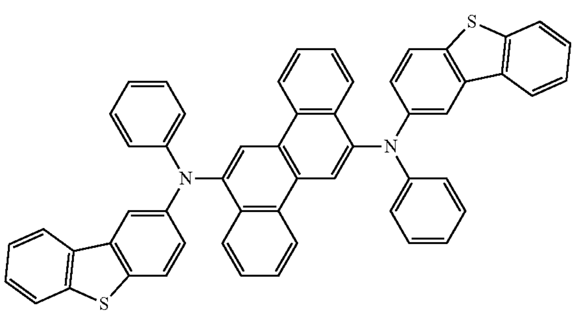
FD12
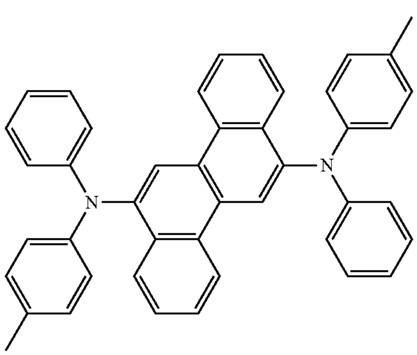
-continued
FD13
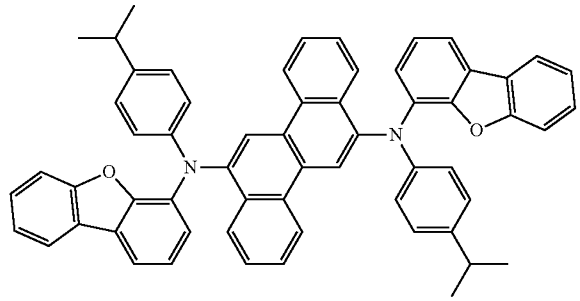
FD14
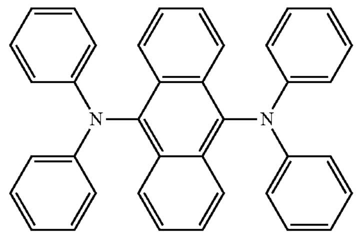
FD15
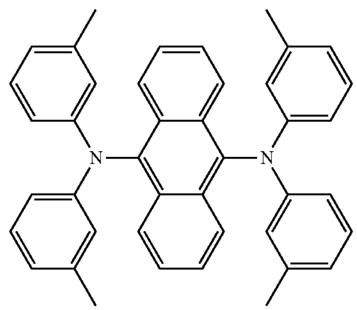
FD16
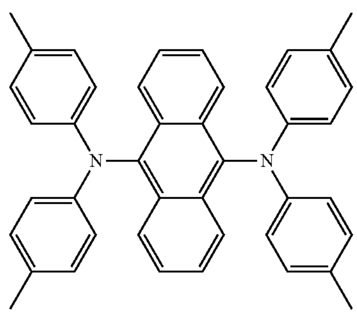
FD17
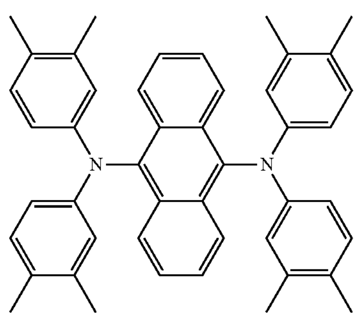

-continued
FD18
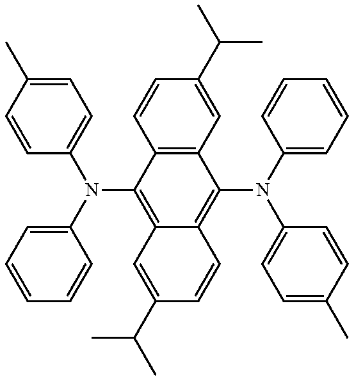
FD19
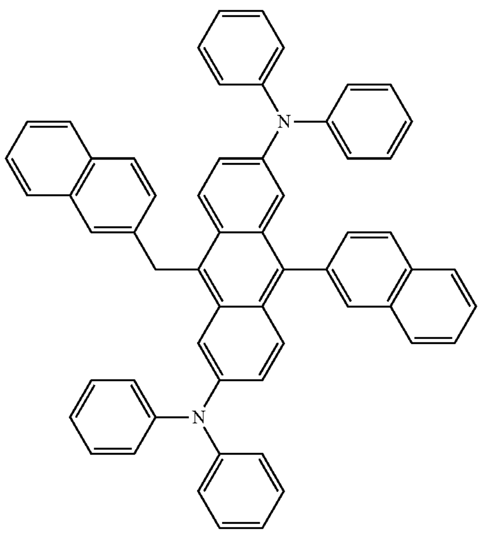
FD20
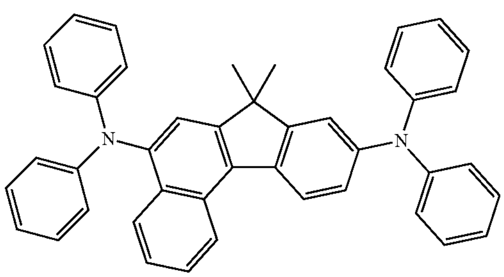
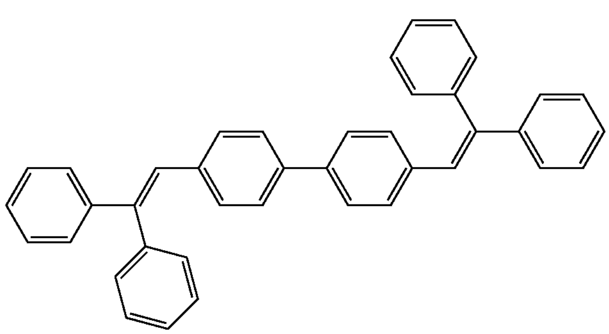
DPVBi
-continued
FD21
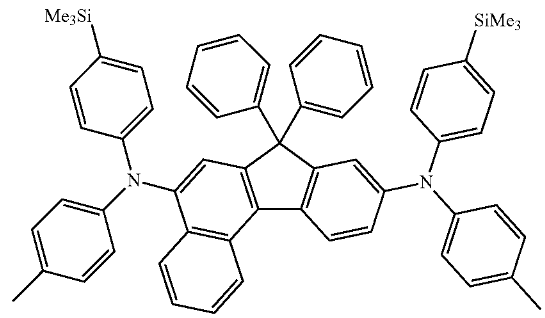
FD22
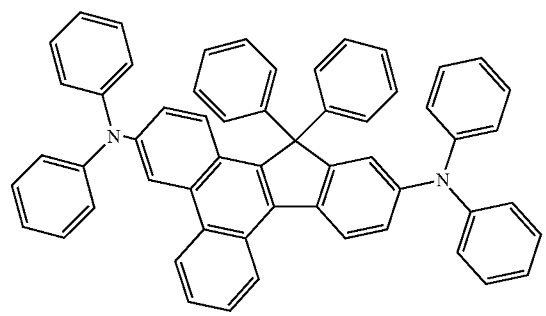
In one or more embodiments, the fluorescent dopant may be selected from the following compounds, but embodiments of the present disclosure are not limited thereto.

-continued

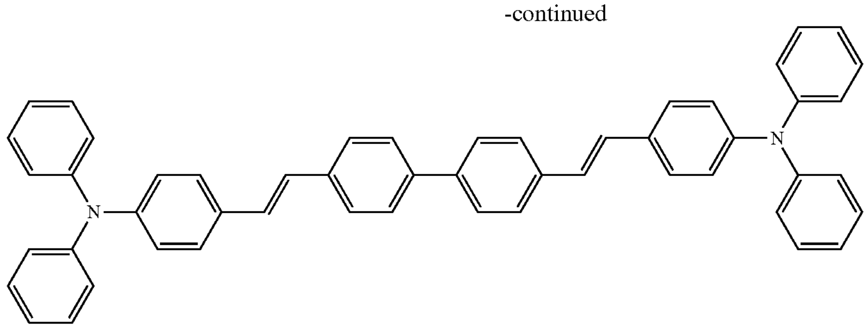

DPAVBi

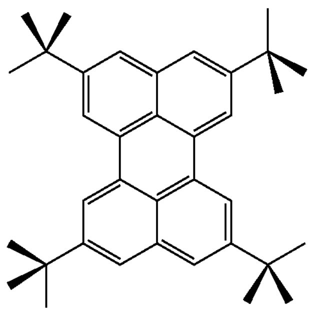

TBPe

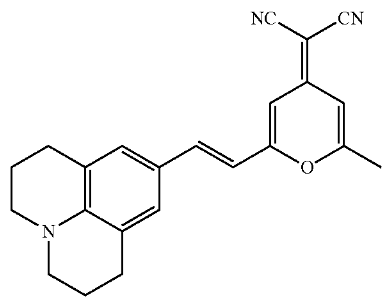

DCM

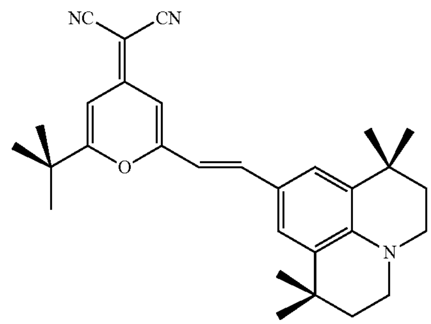

DCJTB

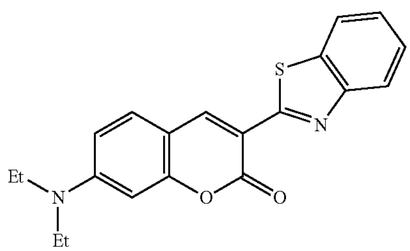

Coumarin 6

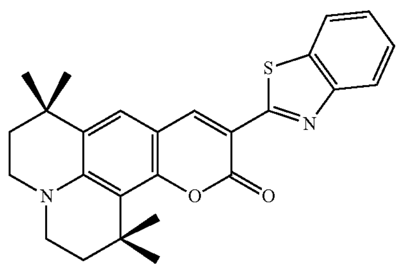

C545T

Electron Transport Region in Organic Layer 150

The electron transport region may have i) a single-layered structure including (e.g., consisting of) a single material, ii) a single-layered structure including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer in this stated order. However, embodiments of the structure of the electron transport region are not limited thereto.

The electron transport region (for example, a buffer layer, a hole blocking layer, an electron control layer, or an electron transport layer in the electron transport region) may include a metal-free compound containing at least one TT electron-depleted nitrogen-containing ring.

The "TT electron-depleted nitrogen-containing ring" refers to a $C_1$-$C_{60}$ heterocyclic group having at least one *—N=*' moiety as a ring-forming moiety.

For example, the "TT electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the TT electron-deficient nitrogen-containing ring include an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, an isobenzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and an azacarbazole ring, but are not limited thereto.

For example, the electron transport region may include a compound represented by Formula 601 below:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-Si(Q_{601})(Q_{602})(Q_{603})$, $-C(=O)(Q_{601})$, $-S(=O)_2(Q_{601})$, and $-P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of $Ar_{601}$(s) in the number of xe11 and $R_{601}$(s) in the number of xe21 may include the TT electron-deficient nitrogen-containing ring.

In an embodiment, ring $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, $-Si(Q_{31})(Q_{32})(Q_{33})$, $-S(=O)_2(Q_{31})$, and $-P(=O)(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more $Ar_{601}$(s) may be linked to each other via a single bond.

In one or more embodiments, $Ar_{601}$ in Formula 601 may be an anthracene group.

In one or more embodiments, the compound represented by Formula 601 may be represented by Formula 601-1:

Formula 601-1

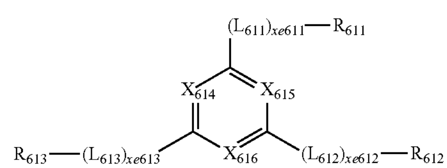

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{602}$)(Q$_{602}$), wherein Q$_{601}$ and Q$_{602}$ may each independently be the same as described above.

The electron transport region may include at least one compound selected from Compounds ET1 to ET36, but embodiments of the present disclosure are not limited thereto:

ET1

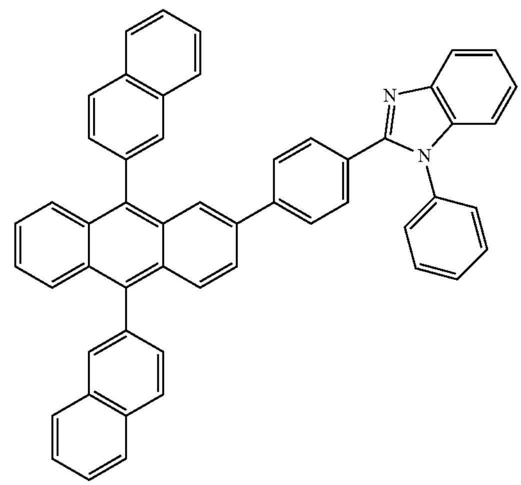

ET2

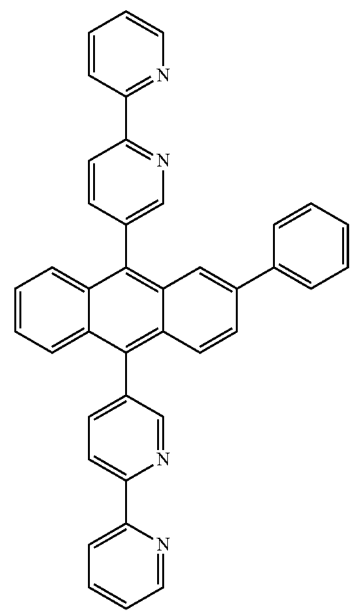

ET3

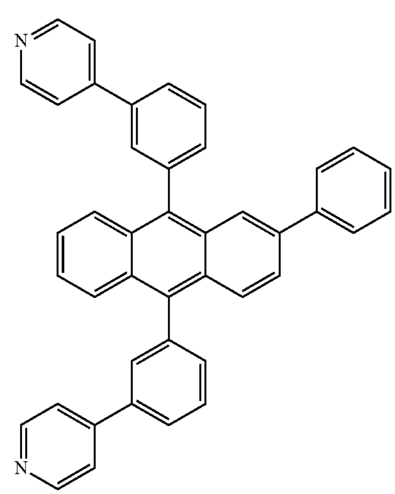

ET4
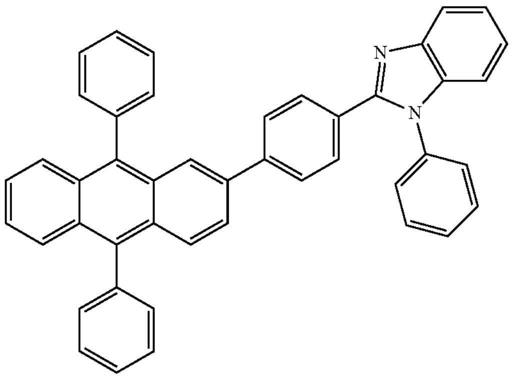
ET5
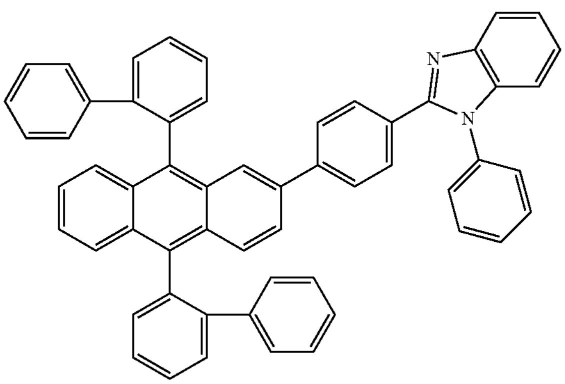
ET6
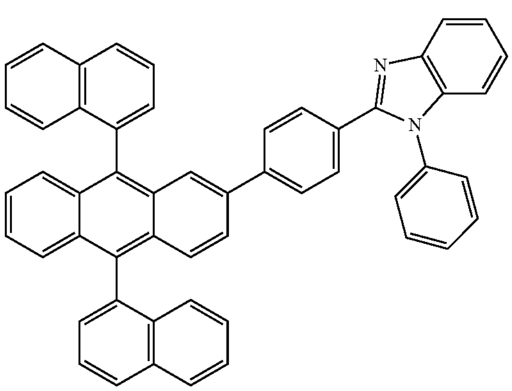
ET7
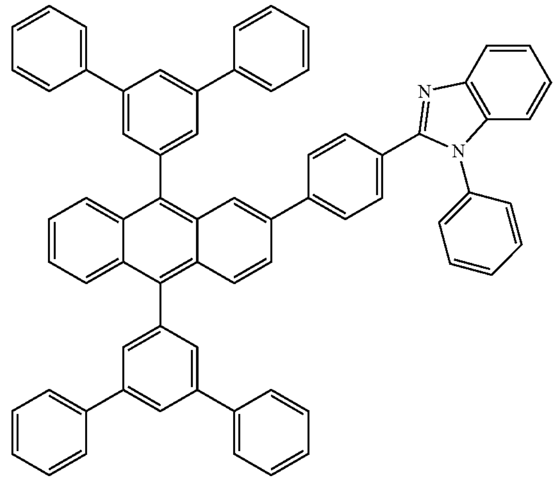
ET8
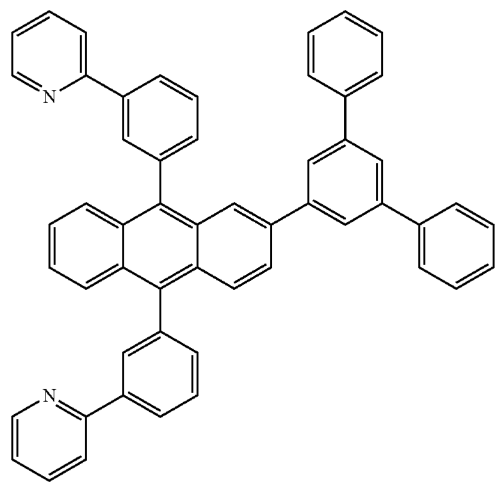
ET9
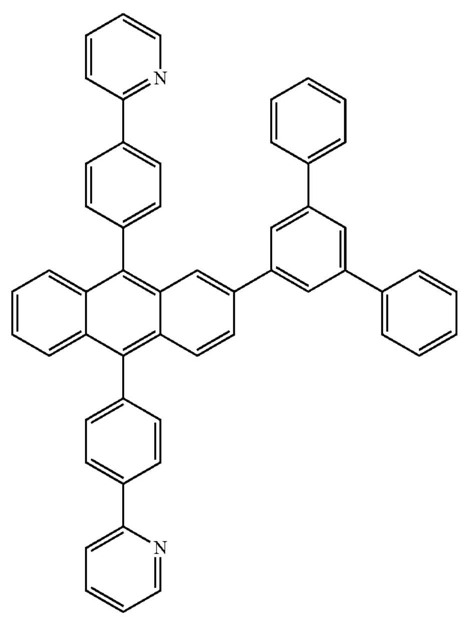

-continued
ET10
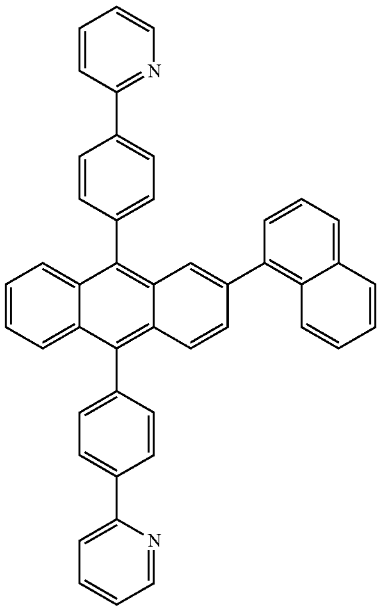
ET11
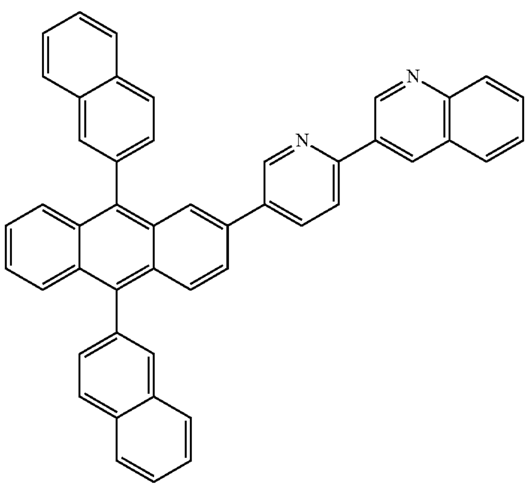
ET12
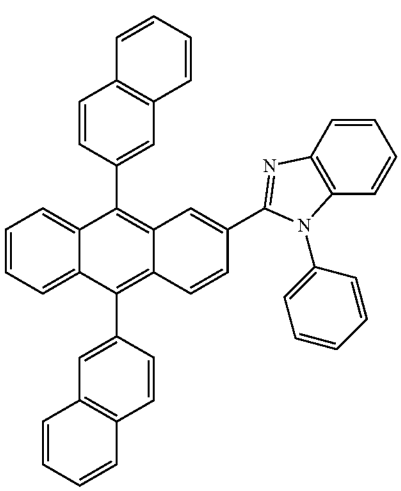
-continued
ET13
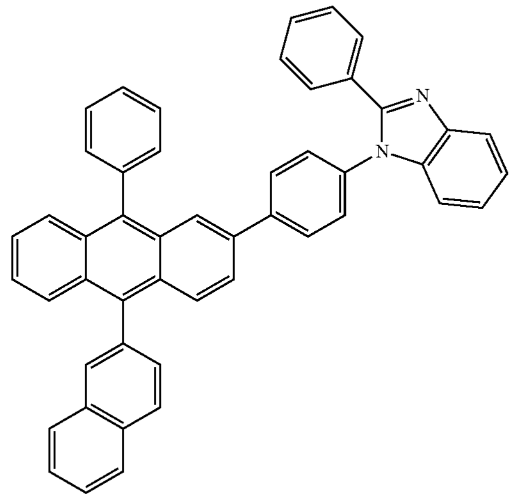
ET14
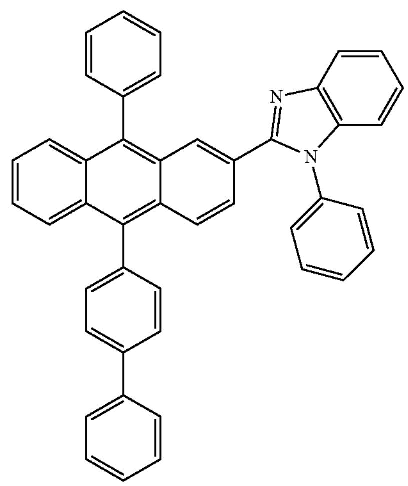
ET15
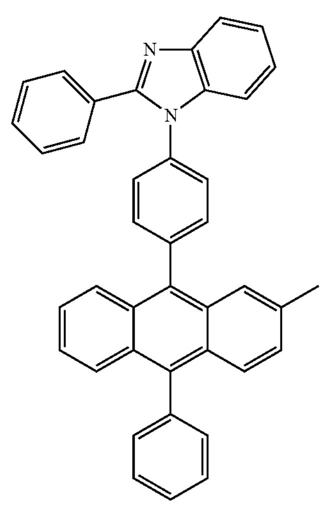

-continued
ET16
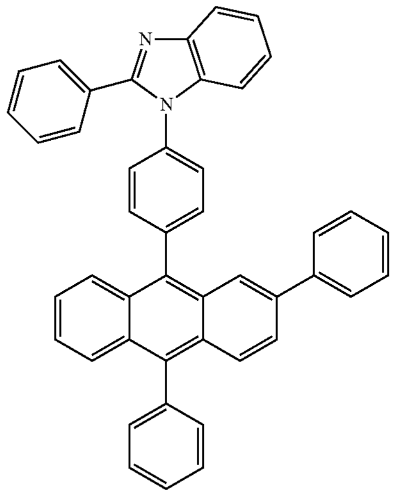
ET17
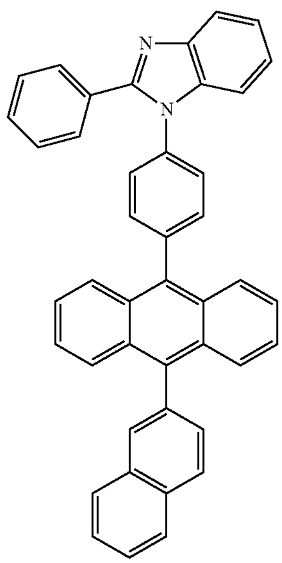
ET18
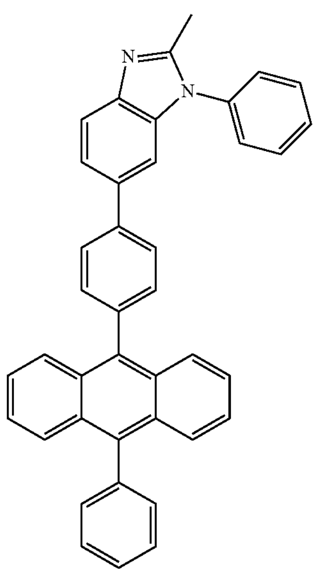
-continued
ET19
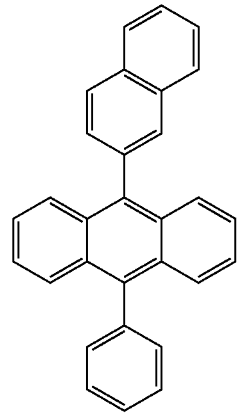
ET20
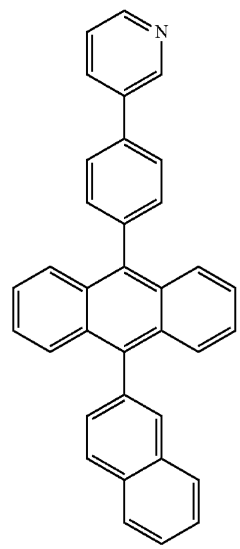
ET21
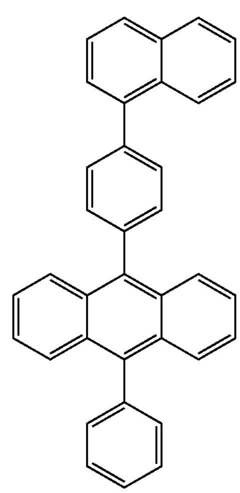

-continued
ET22
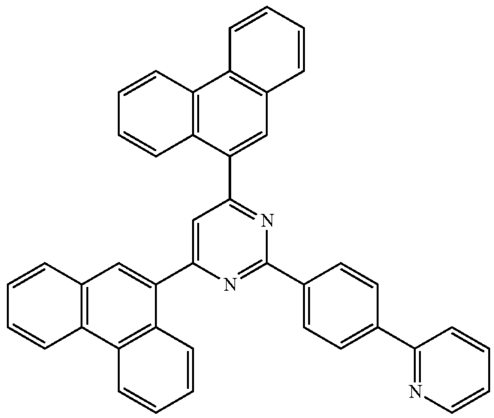
ET23
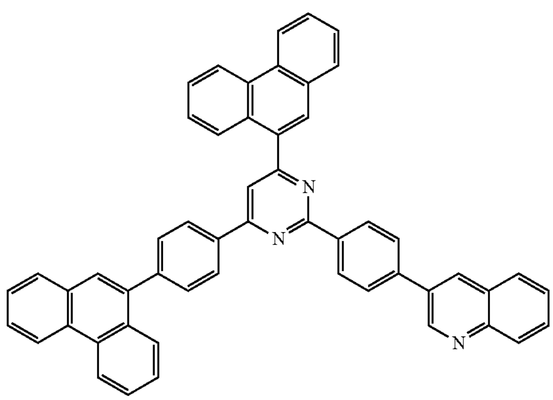
ET24
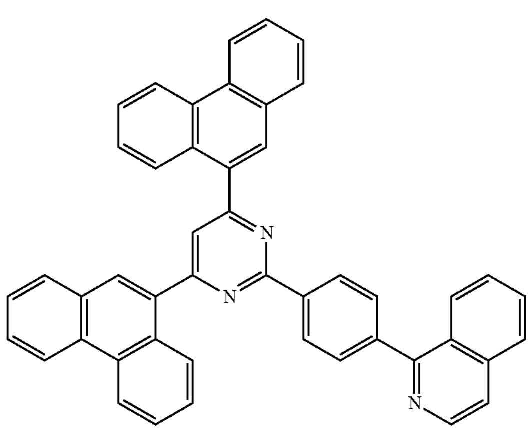
-continued
ET25
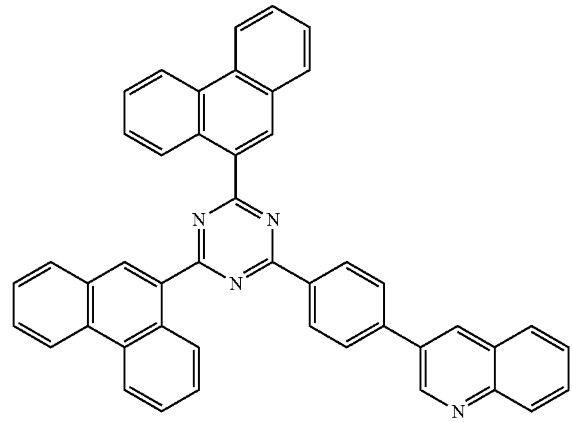
ET26
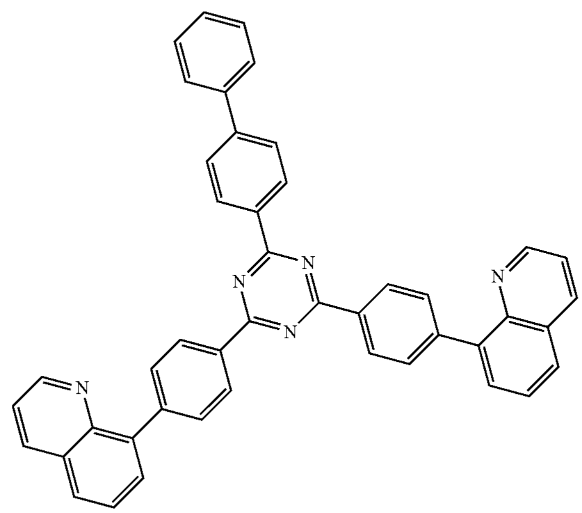
ET27
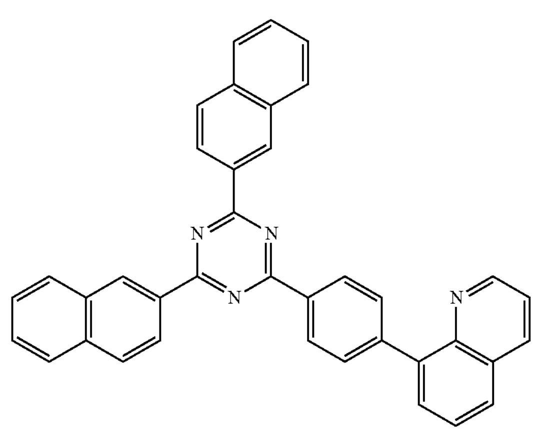

ET28
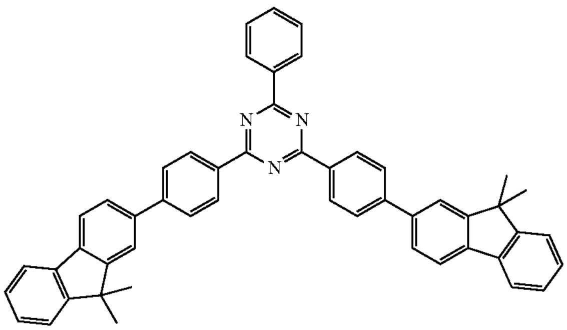
ET29
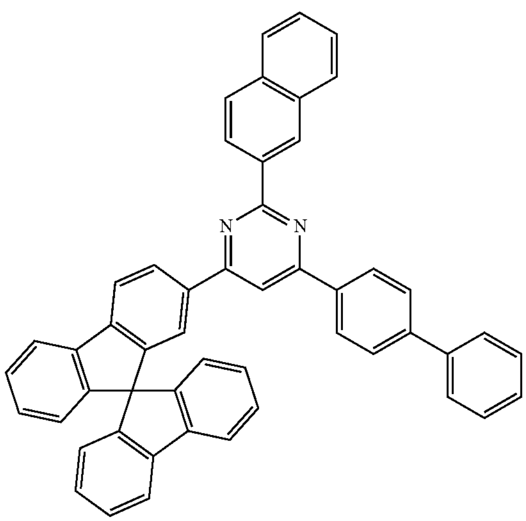
ET30
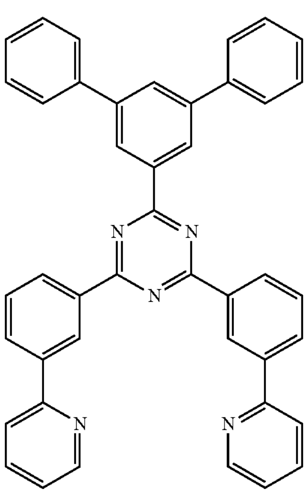
ET31
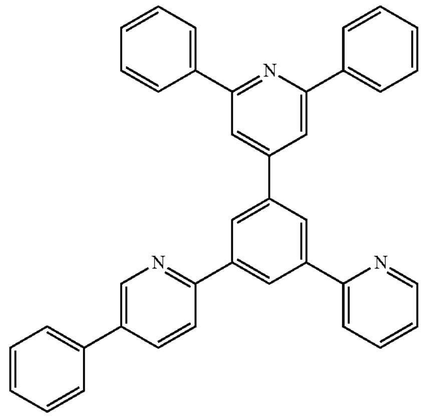
ET32
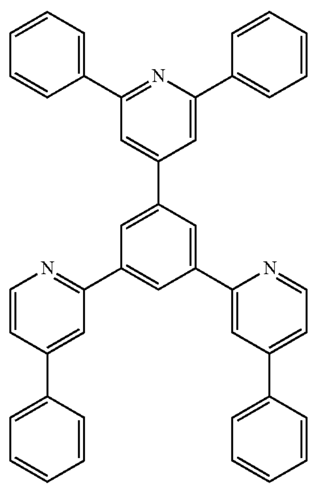
ET33
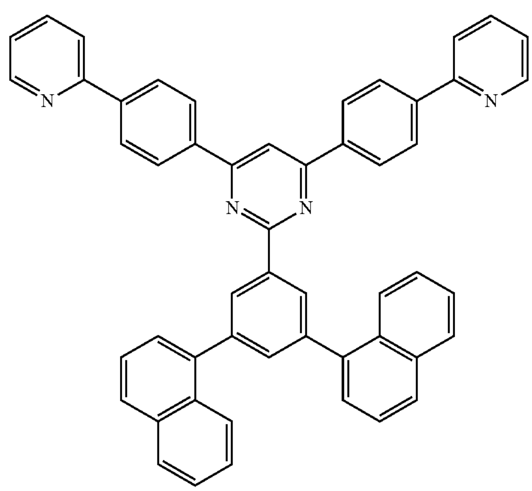

-continued

ET34

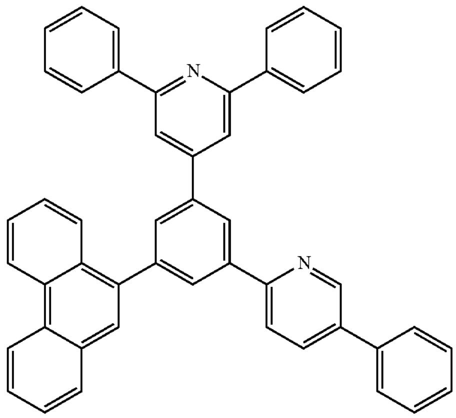

ET35

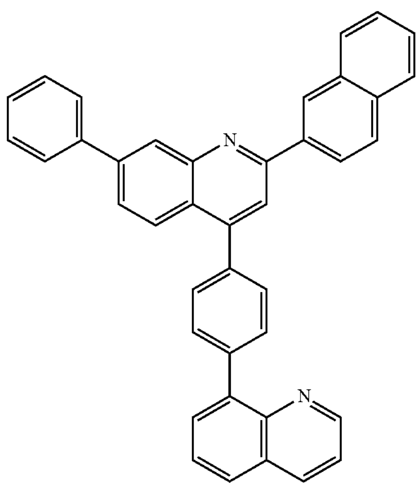

ET36

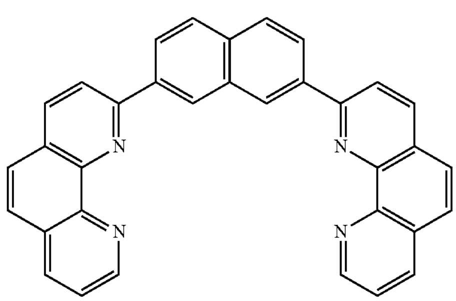

In one or more embodiments, the electron transport region may include at least one selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ:

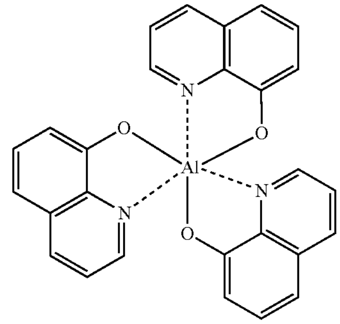

$Alq_3$

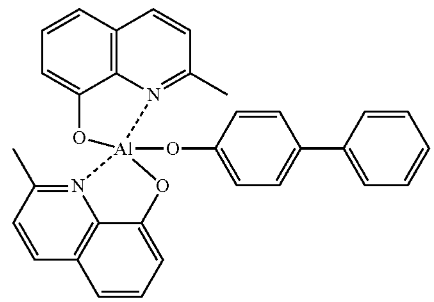

BAlq

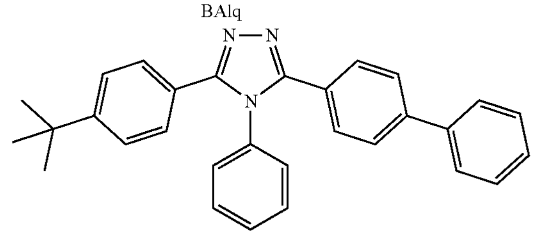

TAZ

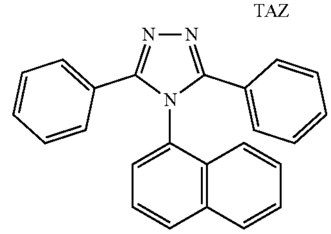

NTAZ

In one or more embodiments, the electron transport region may include a phosphine oxide-containing compound, but embodiments of the present disclosure are not limited thereto. In an embodiment, the phosphine oxide-containing compound may be utilized in a hole blocking layer in the electron transport region, but embodiments of the present disclosure are not limited thereto.

Thicknesses of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within these ranges, suitable (e.g., excellent) hole blocking characteristics or suitable (e.g., excellent) electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within the ranges described above, the electron transport layer may have satisfactory electron transport characteristics without a substantial increase in driving voltage.

The electron transport region (for example, the electron transport layer in the electron transport region) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2:

ET-D1

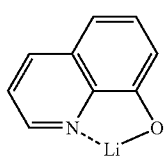

ET-D2

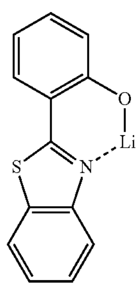

The electron transport region may include an electron injection layer that facilitates the injection of electrons from the second electrode 190. The electron injection layer may directly contact the second electrode 190.

The electron injection layer may have i) a single-layered structure including (e.g., consisting of) a single material, ii) a single-layered structure including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In an embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, and/or $K_2O$, and alkali metal halides, such as LiF, NaF, CsF, KF, LiI, NaI, CsI, and/or KI. In an embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $BaxSr_{1-x}O$ ($0<x<1$), and/or $BaxCa_{1-x}O$ ($0<x<1$). In an embodiment, the alkaline earth-metal compound may be selected from BaO, SrO, and CaO, but embodiments of the present disclosure are not limited thereto.

The rare earth metal compound may be selected from $YbF_3$, $ScF_3$, $Sc_2O_3$, $Y_2O_3$, $Ce_2O_3$, $GdF_3$ and $TbF_3$. In an embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy phenyloxadiazole, hydroxy phenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may include (e.g., consist of) an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, the alkali metal, the alkaline earth metal, the rare earth metal, the alkali metal compound, the alkaline earth-metal compound, the rare earth metal compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the ranges described above, the electron injection layer may have satisfactory electron injection characteristics without a substantial increase in driving voltage.

Second Electrode 190

The second electrode 190 is located on the organic layer 150 having such a structure. The second electrode 190 may be a cathode which is an electron injection electrode, and in this regard, a material for forming the second electrode 190 may be selected from a metal, an alloy, an electrically conductive compound, and a combination thereof, each having a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, and IZO, but embodiments of the present disclosure are not limited thereto. The second electrode 190 may be a transmissive electrode, a semi-transmissive electrode, or a reflective electrode.

The second electrode 190 may have a single-layered structure or a multi-layered structure including two or more layers.

Figure 2:
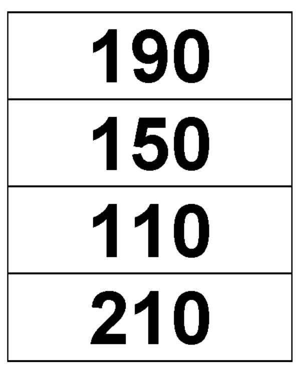
FIG. 2 is a schematic cross-sectional view of an embodiment of an organic light-emitting device.
Figure 3:
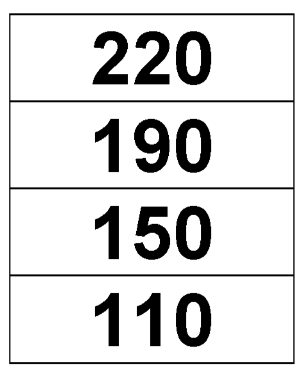
FIG. 3 is a schematic cross-sectional view of an embodiment of an organic light-emitting device.
Figure 4:
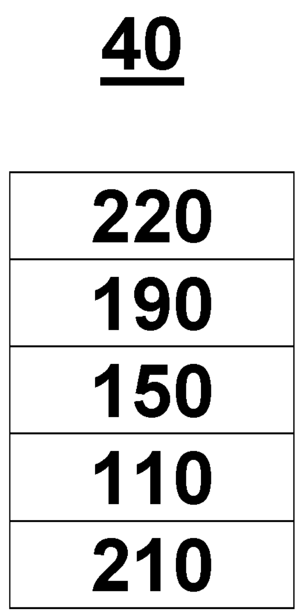
FIG. 4 is a schematic cross-sectional view of an embodiment of an organic light-emitting device.

Description of FIGS. 2 to 4

An organic light-emitting device 20 of FIG. 2 includes a first capping layer 210, the first electrode 110, the organic layer 150, and the second electrode 190 which are sequentially stacked in this stated order, an organic light-emitting device 30 of FIG. 3 includes the first electrode 110, the organic layer 150, the second electrode 190, and a second capping layer 220 which are sequentially stacked in this stated order, and an organic light-emitting device 40 of FIG. 4 includes a first capping layer 210, a first electrode 110, an organic layer 150, a second electrode 190, and a second capping layer 220 which are sequentially stacked in this stated order.

Regarding FIGS. 2 to 4, the first electrode 110, the organic layer 150, and the second electrode 190 may be understood by referring to the description presented in connection with FIG. 1.

In the organic layer 150 of each of the organic light-emitting devices 20 and 40, light generated in an emission layer may pass through the first electrode 110, which is a semi-transmissive electrode or a transmissive electrode, and the first capping layer 210 toward the outside, and in the organic layer 150 of each of the organic light-emitting devices 30 and 40, light generated in an emission layer may pass through the second electrode 190, which is a semi-transmissive electrode or a transmissive electrode, and the second capping layer 220 toward the outside.

The first capping layer 210 and the second capping layer 220 may increase external luminescence efficiency according to the principle of constructive interference. Accordingly, the light extraction efficiency of the organic light-emitting device 10 is increased, so that the luminescence efficiency of the organic light-emitting device 10 may be improved.

Each of the first capping layer 210 and the second capping layer 220 may include a material having a refractive index of 1.6 or more (at 589 nm).

The first capping layer 210 and the second capping layer 220 may increase external luminescence efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphyrin derivatives, phthalocyanine derivatives, naphthalocyanine derivatives, alkali metal complexes, and alkaline earth metal complexes. The carbocyclic compound, the heterocyclic compound, and the amine-based compound may be optionally substituted with a substituent containing at least one element selected from O, N, S, Se, Si, F, Cl, Br, and I. In an embodiment, at least one of the first capping layer 210 and the second capping layer 220 may each independently include an amine-based compound.

In an embodiment, at least one selected from the first capping layer 210 and the second capping layer 220 may each independently include the compound represented by Formula 201 or the compound represented by Formula 202.

In one or more embodiments, at least one of the first capping layer 210 and the second capping layer 220 may each independently include a compound selected from Compounds HT28 to HT33, Compounds CP1 to CP6, and β-NPB, but embodiments of the present disclosure are not limited thereto.

CP1

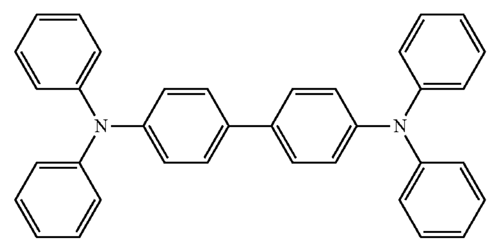

CP2

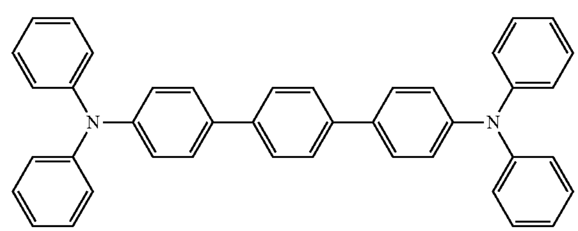

CP3

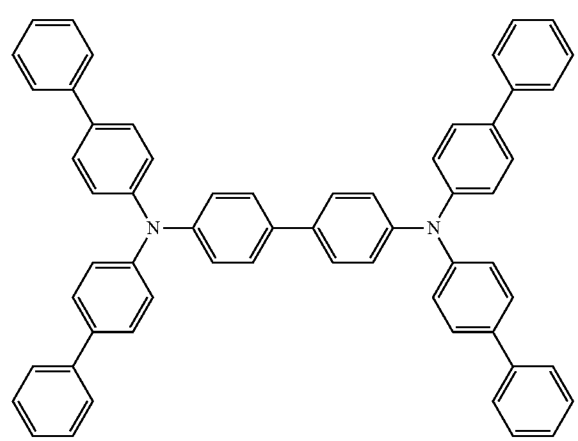

-continued

CP4

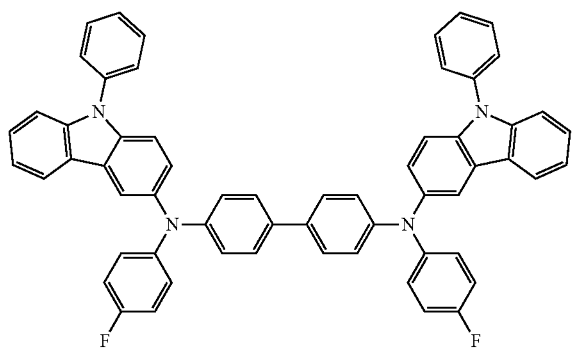

CP5

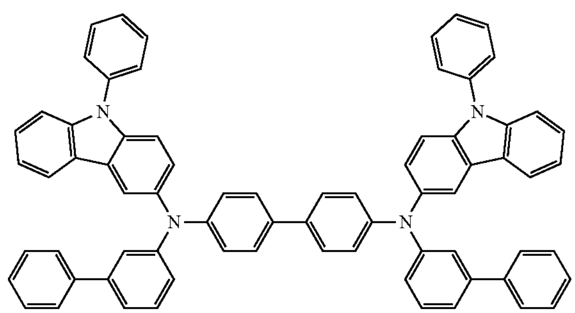

CP6

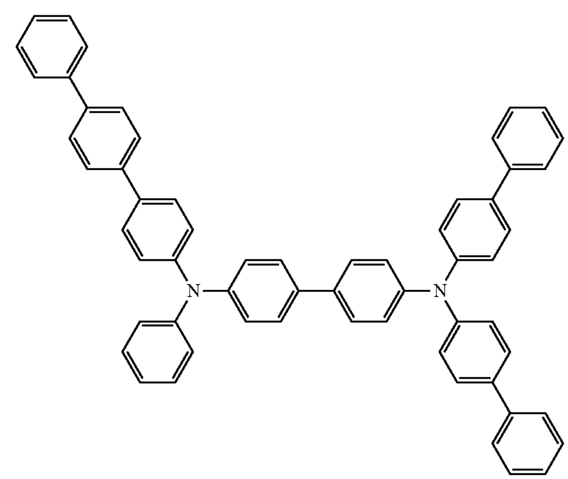

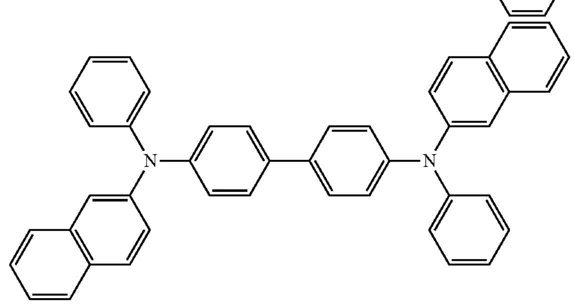

β-NPB

Hereinbefore, the organic light-emitting device according to an embodiment has been described in connection with FIGS. 1-4. However, embodiments of the present disclosure are not limited thereto.

Layers constituting the hole transport region, the emission layer, and layers constituting the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the vacuum deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in the layer to be formed and the structure of the layer to be formed.

When layers constituting the hole transport region, the emission layer, and layers constituting the electron transport region are formed by spin coating, the spin coating may be performed at a coating speed of about 2,000 rpm to about 5,000 rpm and at a heat treatment temperature of about 80° C. to 200° C. by taking into account a material to be included in the layer to be formed and the structure of the layer to be formed.

General Definition of Substituents

The term "$C_1$-$C_{60}$ alkyl group" as used herein refers to a linear or branched aliphatic saturated hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and non-limiting examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, Si, P, and S as a ring-forming atom and 1 to 10 carbon atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term $C_3$-$C_{10}$ cycloalkenyl group used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, a fluorenyl group and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a heterocyclic aromatic system that has at least one heteroatom selected from N, O, Si, P, and S as a ring-forming atom, in addition to 1 to 60 carbon atoms. The term "$C_1$-$C_{60}$ heteroarylene group" as used herein refers to a divalent group having a heterocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, an isoquinolinyl group, a carbazolyl group, a dibenzofuranyl group and a dibenzothiophenyl group. When the $C_1$-$C_{60}$ heteroaryl group and the $C_1$-$C_{60}$ heteroarylene group each include two or more rings, the two or more rings may be condensed with each other.

The term "$C_6$-$C_{60}$ aryloxy group" as used herein refers to a group represented by —$OA_{102}$ (wherein $A_{102}$ is the $C_6$-$C_{60}$ aryl group), and the term "$C_6$-$C_{60}$ arylthio group" as used herein refers to a group represented by —$SA_{103}$ (wherein $A_{103}$ is the $C_6$-$C_{60}$ aryl group).

The term "monovalent non-aromatic condensed polycyclic group" as used herein refers to a monovalent group having two or more rings condensed with each other, only carbon atoms (for example, having 8 to 60 carbon atoms) as ring-forming atoms, and no aromaticity in its entire molecular structure. Non-limiting examples of the monovalent non-aromatic condensed polycyclic group include a fluorenyl group and an adamantyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, at least one heteroatom selected from N, O, Si, P, and S, other than carbon atoms (for example, having 1 to 60 carbon atoms), as a ring-forming atom, and no aromaticity in its entire molecular structure. Non-limiting examples of the monovalent non-aromatic condensed heteropolycyclic group include a carbazolyl group and a 9H-xanthenyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a monocyclic or polycyclic group that includes only carbon atoms as a ring-forming atom and includes 5 to 60 carbon atoms. The term "$C_5$-$C_{60}$ carbocyclic group" as used herein refers to an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_5$-$C_{60}$ carbocyclic group, except that as a ring-forming atom, at least one heteroatom selected from N, O, Si, P, and S is used in addition to carbon (the number of carbon atoms may be in a range of 1 to 60).

In the present specification, at least one substituent of the substituted $C_5$-$C_{60}$ carbocyclic group, the substituted $C_1$-$C_{60}$ heterocyclic group, the substituted $C_1$-$C_{20}$ alkylene group, the substituted $C_2$-$C_{20}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, —Cl, —Br, —I, and a cyano group, a $C_6$-$C_{60}$ aryl group substituted with at least one selected from deuterium, —F, —Cl, —Br, —I, and a cyano group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

*, and *', as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The wording "B was utilized instead of A" utilized in describing Synthesis Examples refers to that an identical molar equivalent of B was utilized in place of an identical molar equivalent of A.

SYNTHESIS EXAMPLE

Synthesis Example 1: Synthesis of Compound 1

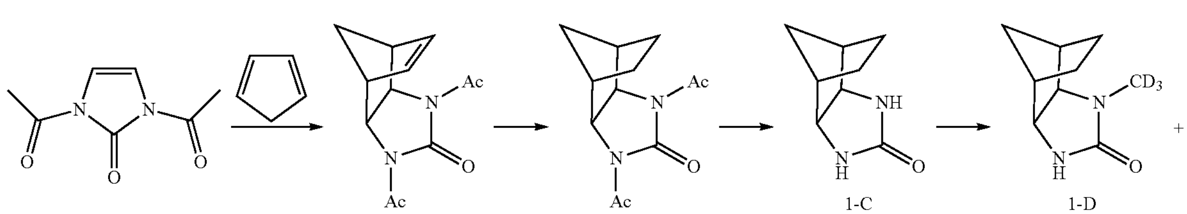

1-A 1-B 1-C 1-D

-continued

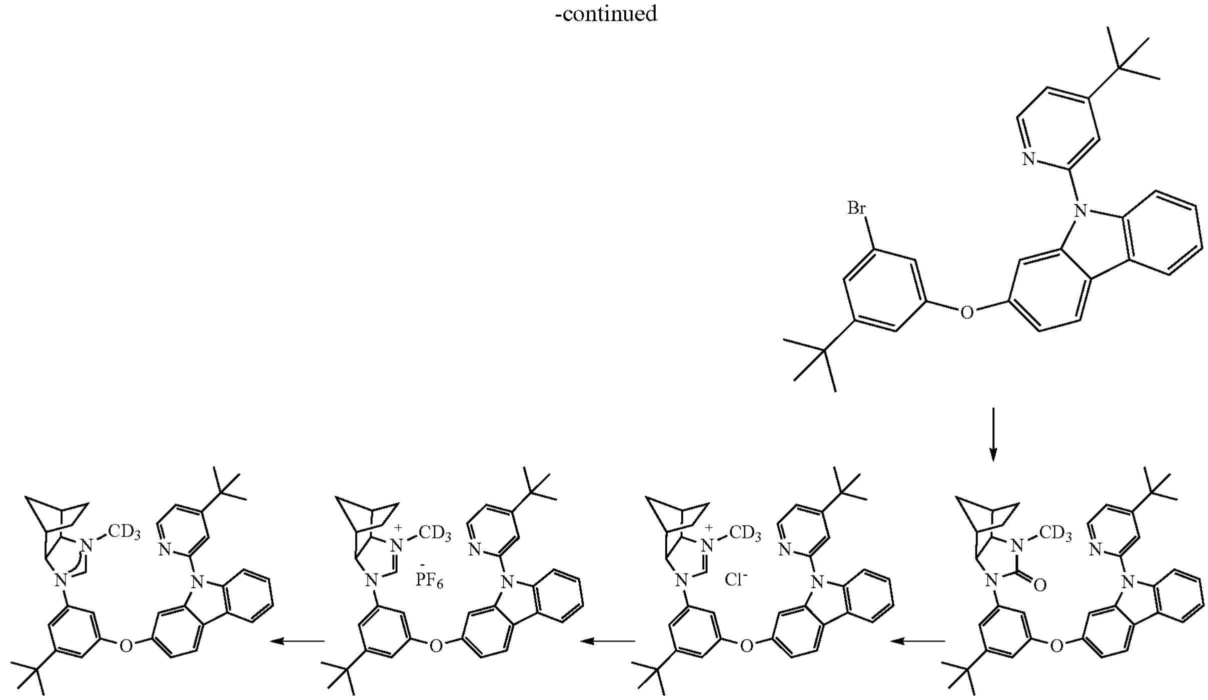

1 1-G 1-F 1-E

Synthesis of Intermediate Compound 1-A 1,3-diacetylimidazolin-2-one (1.0 equiv.) and cyclopentadiene (1.0 mol, 10 equiv.) were dissolved in m-xylene and stirred at a temperature of 150° C. for 72 hours. After the pressure was reduced, n-hexane was added to the reaction mixture and the precipitate was removed therefrom by filtration. The filtered precipitate was dissolved in MeOH (250 ml) and 2 M HCl (250 ml), stirred at room temperature for 30 minutes, and then subjected to reduced pressure. The reaction mixture was extracted with water and dichloromethane to obtain an organic layer. The obtained organic layer was dried by utilizing anhydrous magnesium sulfate, and concentrated to synthesize Intermediate compound 1-A (yield of 54%).

Synthesis of Intermediate Compound 1-B

A 20 ml ethyl acetate (EtOAc) solution of 10% Pd/C (70 mg) was added to a solution in which Intermediate compound 1-A (30 mmol) was dissolved in EtOAc (20 ml) under the Ar condition (e.g., under an Ar inert atmosphere). After filling with the hydrogen gas, stirring was performed thereon at room temperature for 1 hour. The reaction mixture was washed with EtOAc and filtered utilizing Celite. The filtrate was concentrated to obtain Intermediate compound 1-B (yield of 99%).

Synthesis of Intermediate Compound 1-C

Intermediate compound 1-B (2.0 equiv.) was dissolved in MeOH and dichloromethane and stirred at room temperature. After adding NaH (60% in mineral oil, 1.0 equiv.) at 0° C., the resultant mixture was stirred for 4 hours at room temperature. After quenching with a $NH_4Cl$ solution at 0° C., an extraction process was performed utilizing water and dichloromethane. The obtained organic layer was dried utilizing anhydrous magnesium sulfate, concentrated, and recrystallized utilizing n-hexane to synthesize Intermediate compound 1-C (yield of 93%).

Synthesis of Intermediate Compound 1-D

Intermediate Compound 1-C (1.0 eq), Iodomethane-d3 (3.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 12 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography was utilized to obtain Intermediate compound 1-D (yield: 75%).

Synthesis of Intermediate Compound 1-E

Intermediate Compound 1-D (1.2 eq), 2-(3-bromo-5-(tert-butyl)phenoxy)-9-(4-(tert-butyl)pyridin-2-yl)-9H-carbazole (1.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 3 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography (ethyl acetate: hexane=1:9) was utilized to obtain Intermediate compound 1-E (yield: 78%).

Synthesis of Intermediate Compound 1-F

Intermediate Compound 1-E (3.5 mmol) was dissolved in tetrahydrofuran (THF) and then stirred at room temperature. $LiAlH_4$ (7.0 mmol) was added at a temperature of 0° C., followed by stirring for 2 hours at a temperature of 50° C. After adding THF, a NaOH solution and $H_2O$ to the reaction mixture at a temperature of 0° C., the resultant mixture was stirred for 30 minutes at room temperature. The reaction mixture was filtered by celite/silica gel utilizing THF and EtOAc and subjected to reduced pressure. After the reaction mixture (1.0 eq) was dissolved in triethyl orthoformate (30 eq) at 80° C., 37% HCl (1.5 eq) was added thereto and stirred at a temperature of 80° C. for 12 hours. After cooling at room temperature, triethyl orthoformate (e.g., the triethyl orthoformate solution) was concentrated and extracted three times with dichloromethane and water to obtain an organic layer. The obtained organic layer was dried by utilizing anhydrous magnesium sulfate and concentrated, and column chromatography (MC, MC:5 vol % methanol) was utilized to obtain Intermediate compound 1-F (yield: 87%).

Synthesis of Intermediate Compound 1-G

Intermediate compound 1-F (1.0 eq) and ammonium hexafluorophosphate (3.0 eq) were dissolved in methanol (0.5 M), and then, distilled water was added thereto, and stirred at room temperature for 3 to 12 hours. After washing with distilled water and filtering to obtain a solid, an extraction process was performed thereon three times utilizing dichloromethane and water to obtain an organic layer. The obtained organic layer was dried by utilizing anhydrous magnesium sulfate, and concentrated to synthesize Intermediate compound 1-G (yield of 96%).

Synthesis of Compound 1

Intermediate compound 1-G (1.0 eq), dichloro(1,5-cyclooctadiene)platinum (II) (1.1 eq), and sodium acetate (3.0 eq) were dissolved in anhydrous 1,4-dioxane, and then, stirred in the nitrogen condition (e.g., stirred under a nitrogen inert atmosphere) at a temperature of 120° C. for 4 days. The reaction mixture was cooled at room temperature, and then subjected to an extraction process three times utilizing water to obtain an organic layer. The obtained organic layer was dried by utilizing anhydrous magnesium sulfate and concentrated, and column chromatography (MC:50 vol % hexane) was utilized to obtain Compound 1 (yield: 21%).

Synthesis Example 2: Synthesis of Compound 2

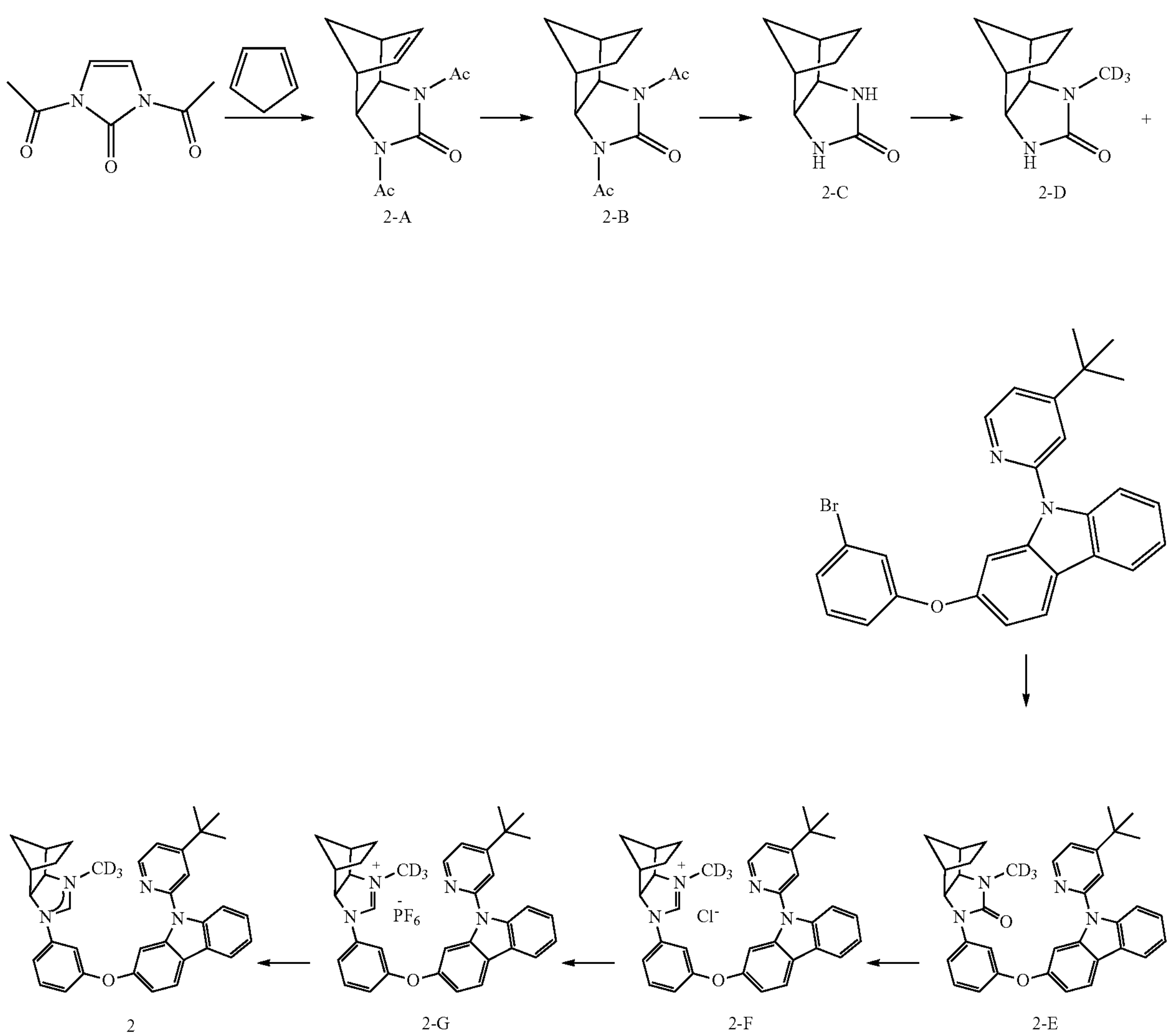

Synthesis of Intermediate Compound 2-A 1,3-diacetylimidazolin-2-one (1.0 equiv.) and cyclopentadiene (1.0 mol, 10 equiv.) were dissolved in m-xylene and stirred at a temperature of 150° C. for 72 hours. After the pressure was reduced, n-hexane was added to the reaction mixture and the precipitate was removed therefrom by filtration. The filtered precipitate was dissolved in MeOH (250 ml) and 2 M HCl (250 ml), stirred at room temperature for 30 minutes, and then subjected to reduced pressure. The reaction mixture was extracted with water and dichloromethane to obtain an organic layer. The obtained organic layer was dried by utilizing anhydrous magnesium sulfate, and concentrated to synthesize Intermediate compound 2-A (yield of 53%).

Synthesis of Intermediate Compound 2-B

A 20 ml EtOAc solution of 10% Pd/C (70 mg) was added to a solution in which Intermediate compound 2-A (30 mmol) was dissolved in EtOAc (20 ml) under the Ar condition (e.g., under an Ar inert atmosphere). After filling with the hydrogen gas, stirring was performed thereon at room temperature for 1 hour. The reaction mixture was washed with EtOAc and filtered utilizing Celite. The filtrate was concentrated to obtain synthesized Intermediate compound 2-B (yield of 99%).

Synthesis of Intermediate Compound 2-C

Intermediate compound 2-B (2.0 equiv.) was dissolved in MeOH and dichloromethane and stirred at room temperature. After adding NaH (60% in mineral oil, 1.0 equiv.) at 0° C., the resultant mixture was stirred for 4 hours at room temperature. After quenching with a $NH_4Cl$ solution at 0° C., an extraction process was performed utilizing water and dichloromethane. The obtained organic layer was dried utilizing anhydrous magnesium sulfate, concentrated, and recrystallized utilizing n-hexane to synthesize Intermediate compound 2-C (yield of 91%).

Synthesis of Intermediate Compound 2-D

Intermediate Compound 2-C (1.0 eq), Iodomethane-d3 (3.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 12 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography was utilized to obtain Intermediate compound 2-D (yield: 75%).

Synthesis of Intermediate Compound 2-E

Intermediate compound 2-D (1.2 eq), 2-(3-bromophenoxy)-9-(4-(tert-butyl)pyridin-2-yl)-9H-carbazole (1.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 3 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography (ethyl acetate: hexane=1:9) was utilized to obtain Intermediate compound 2-E (yield: 78%).

Synthesis of Intermediate Compound 2-F

Intermediate Compound 2-E (3.5 mmol) was dissolved in THF and then stirred at room temperature. $LiAlH_4$ (7.0 mmol) was added at a temperature of 0° C., followed by stirring for 2 hours at 50° C. After adding THF, a NaOH solution and $H_2O$ to the reaction mixture at a temperature of 0° C., the resultant mixture was stirred for 30 minutes at room temperature. The reaction mixture was filtered by celite/silica gel utilizing THF and EtOAc and subjected to reduced pressure. After the reaction mixture (1.0 eq) was dissolved in triethyl orthoformate (30 eq) at 80° C., 37% HCl (1.5 eq) was added thereto and stirred at a temperature of 80° C. for 12 hours. After cooling at room temperature, triethyl orthoformate (e.g., the triethyl orthoformate solution) was concentrated and extracted three times with dichloromethane and water to obtain an organic layer. The obtained organic layer was dried by utilizing anhydrous magnesium sulfate and concentrated, and column chromatography (MC, MC:5 vol % methanol) was utilized to obtain Intermediate compound 2-F (yield: 87%).

Synthesis of Intermediate Compound 2-G

Intermediate compound 2-F (1.0 eq) and ammonium hexafluorophosphate (3.0 eq) were dissolved in methanol (0.5 M), and then, distilled water was added thereto, and stirred at room temperature for 3 hours to 12 hours. After washing with distilled water and filtering to obtain a solid, an extraction process was performed thereon three times utilizing dichloromethane and water to obtain an organic layer. The obtained organic layer was dried by utilizing anhydrous magnesium sulfate, and concentrated to synthesize Intermediate compound 2-G (yield of 93%).

Synthesis of Compound 2

Intermediate compound 2-G (1.0 eq), dichloro(1,5-cyclooctadiene)platinum (II) (1.1 eq), and sodium acetate (3.0 eq) were dissolved in anhydrous 1,4-dioxane, and then, stirred in the nitrogen condition (e.g., stirred under a nitrogen inert atmosphere) at a temperature of 120° C. for 4 days. The reaction mixture was cooled at room temperature, and then subjected to an extraction process three times utilizing water to obtain an organic layer. The obtained organic layer was dried by utilizing anhydrous magnesium sulfate and concentrated, and column chromatography (MC:50 vol % hexane) was utilized to obtain Compound 2 (yield: 18%).

Synthesis Example 3: Synthesis of Compound 4

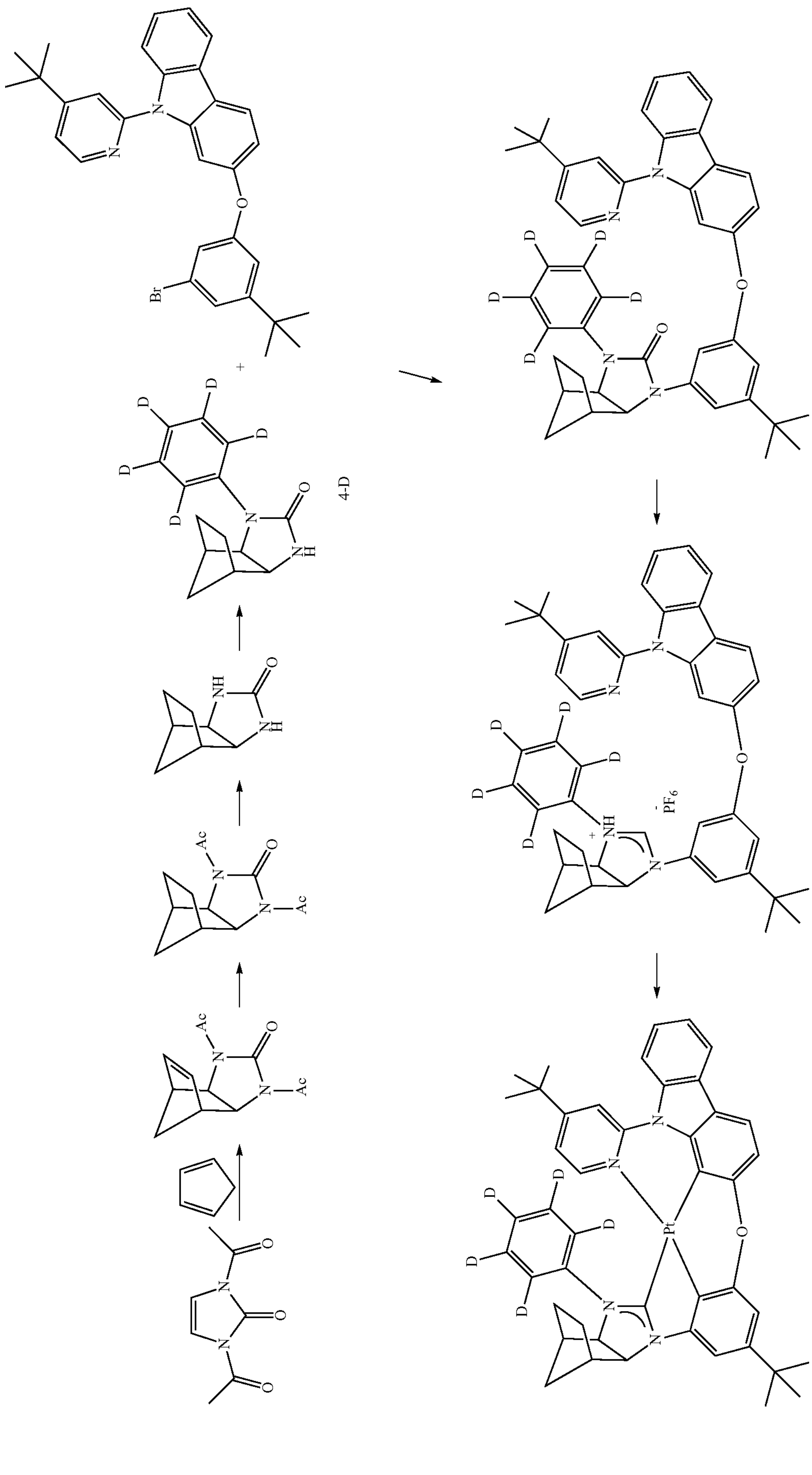
4-D
4-E
4-F
4

Synthesis of Intermediate Compound 4-D

Intermediate compound 1-C (1.0 eq), bromobenzene-d5 (2.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 12 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography was utilized to obtain Intermediate compound 4-D (yield: 77%).

Synthesis of Intermediate Compound 4-E

Intermediate compound 4-D (1.2 eq), 2-(3-bromo-5-(tert-butyl)phenoxy)-9-(4-(tert-butyl)pyridin-2-yl)-9H-carbazole (1.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 3 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography (ethyl acetate: hexane=1:9) was utilized to obtain Intermediate compound 4-E (yield: 70%).

Synthesis of Intermediate Compound 4-F

Intermediate compound 4-E (1.0 eq) and ammonium hexafluorophosphate (3.0 eq) were dissolved in methanol (0.5 M), and then, distilled water was added thereto, and stirred at room temperature for 3 hours to 12 hours. After washing with distilled water and filtering to obtain a solid, an extraction process was performed thereon three times utilizing dichloromethane and water to obtain an organic layer. The obtained organic layer was dried by utilizing anhydrous magnesium sulfate, and concentrated to synthesize Intermediate compound 4-F (yield of 93%).

Synthesis of Compound 4

Intermediate compound 4-F (1.0 eq), dichloro(1,5-cyclooctadiene)platinum (II) (1.1 eq), and sodium acetate (3.0 eq) were dissolved in anhydrous 1,4-dioxane, and then, stirred in the nitrogen condition (e.g., stirred under a nitrogen inert atmosphere) at a temperature of 120° C. for 4 days. The reaction mixture was cooled at room temperature, and then subjected to an extraction process three times utilizing water to obtain an organic layer. The obtained organic layer was dried by utilizing anhydrous magnesium sulfate and concentrated, and column chromatography (MC:50 vol % hexane) was utilized to obtain Compound 4 (yield: 19%).

Synthesis Example 4: Synthesis of Compound 5

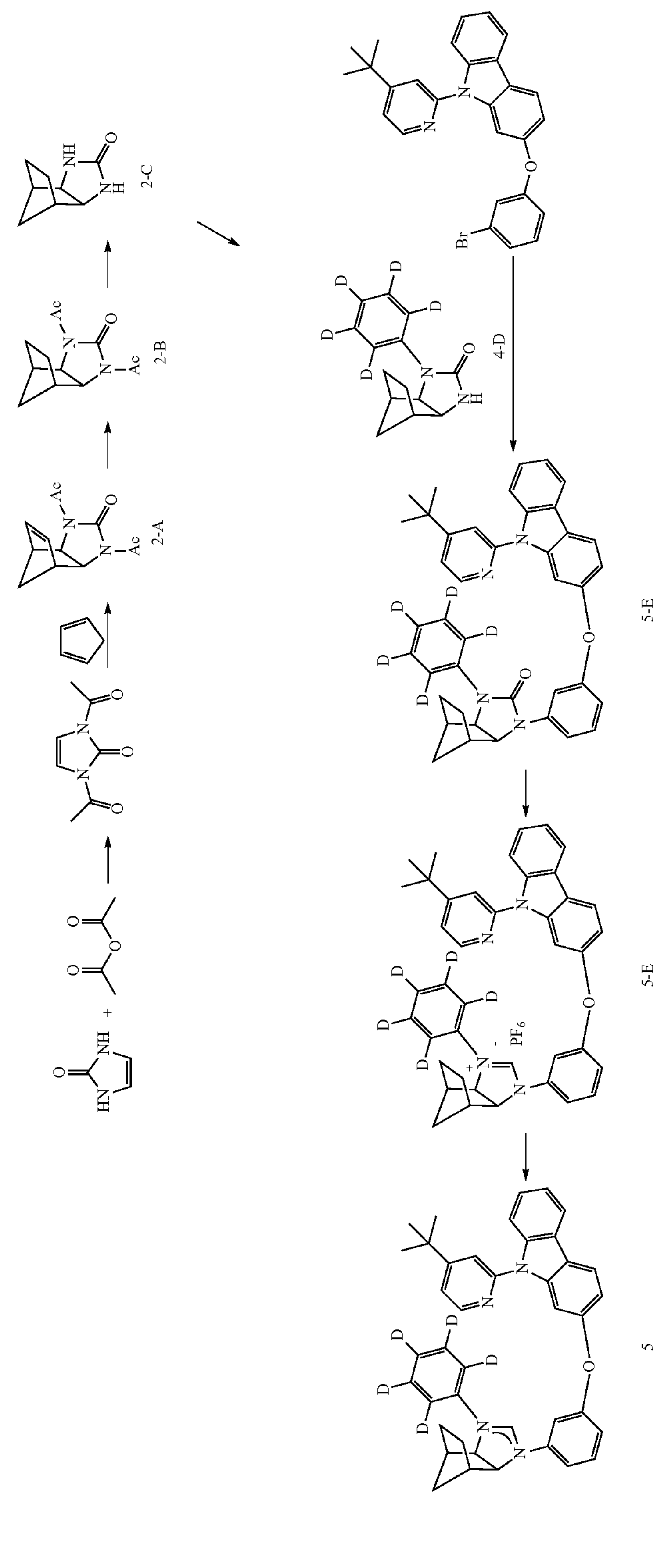
2-A
2-B
2-C
4-D
5-E
5-E
5

Synthesis of Intermediate Compound 5-E

Intermediate compound 4-D (1.2 eq), 2-(3-bromophenoxy)-9-(4-(tert-butyl)pyridin-2-yl)-9H-carbazole (1.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 3 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography (ethyl acetate: hexane=1:9) was utilized to obtain Intermediate compound 5-E (yield: 68%).

Synthesis of Intermediate Compound 5-F

Intermediate compound 5-E (1.0 eq) and ammonium hexafluorophosphate (3.0 eq) were dissolved in methanol (0.5 M), and then, distilled water was added thereto, and stirred at room temperature for 3 hours to 12 hours. After washing with distilled water and filtering to obtain a solid, an extraction process was performed thereon three times utilizing dichloromethane and water to obtain an organic layer. The obtained organic layer was dried by utilizing anhydrous magnesium sulfate, and concentrated to synthesize Intermediate compound 5-F (yield of 93%).

Synthesis of Compound 5

Intermediate compound 5-F (1.0 eq), dichloro(1,5-cyclooctadiene)platinum (II) (1.1 eq), and sodium acetate (3.0 eq) were dissolved in anhydrous 1,4-dioxane, and then, stirred in the nitrogen condition (e.g., stirred under a nitrogen inert atmosphere) at a temperature of 120° C. for 4 days. The reaction mixture was cooled at room temperature, and then subjected to an extraction process three times utilizing water to obtain an organic layer. The obtained organic layer was dried by utilizing anhydrous magnesium sulfate and concentrated, and column chromatography (MC:50 vol % hexane) was utilized to obtain Compound 5 (yield: 17%).

Synthesis Example 5: Synthesis of Compound 7

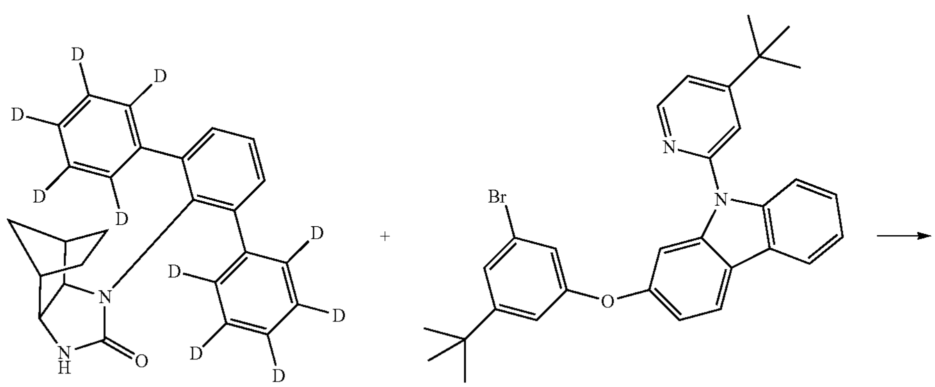

7-A

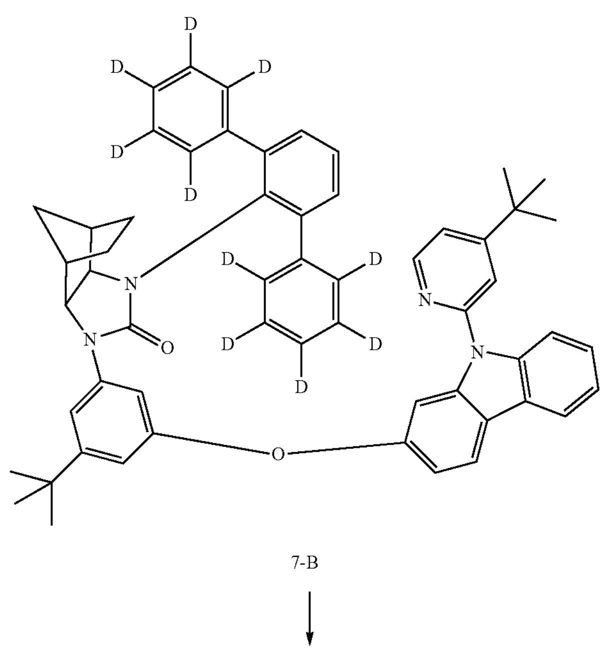

7-B

-continued

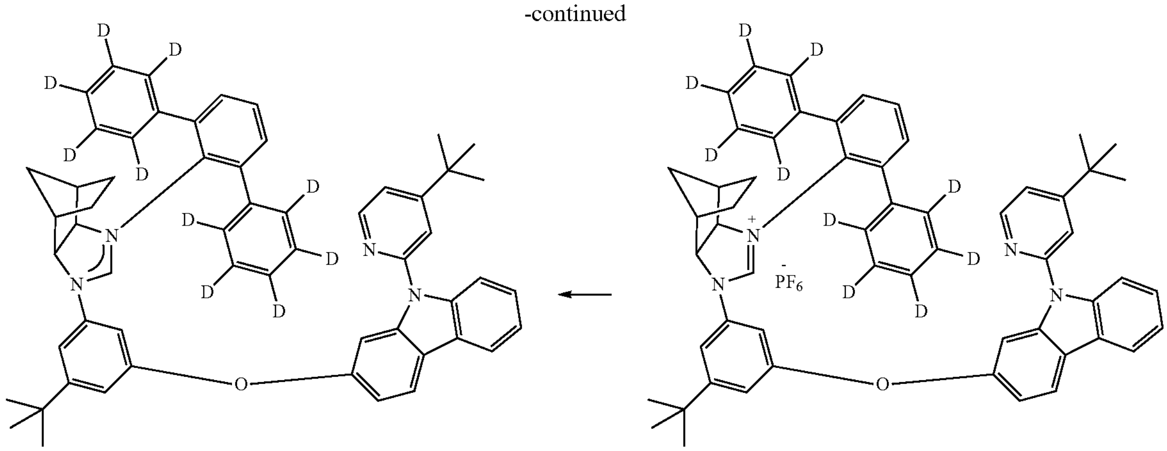

7 7-C

Synthesis of Intermediate Compound 7-A

Intermediate compound 1-C (1.0 eq), 2,6-diphenyl-d10-aniline (2.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 12 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography was utilized to obtain Intermediate compound 7-A (yield: 74%).

Synthesis of Intermediate Compound 7-B

Intermediate compound 7-A (1.2 eq), 2-(3-bromo-5-(tert-butyl)phenoxy)-9-(4-(tert-butyl)pyridin-2-yl)-9H-carbazole (1.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 3 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography (ethyl acetate: hexane=1:9) was utilized to obtain Intermediate compound 7-B (yield: 72%).

Synthesis of Intermediate Compound 7-C

Intermediate compound 7-B (1.0 eq) and ammonium hexafluorophosphate (3.0 eq) were dissolved in methanol (0.5 M), and then, distilled water was added thereto, and stirred at room temperature for 3 hours to 12 hours. After washing with distilled water and filtering to obtain a solid, an extraction process was performed thereon three times utilizing dichloromethane and water to obtain an organic layer. The obtained organic layer was dried by utilizing anhydrous magnesium sulfate, and concentrated to synthesize Intermediate compound 7-C (yield of 93%).

Synthesis of Compound 7

Intermediate compound 7-C (1.0 eq), dichloro(1,5-cyclooctadiene)platinum (II) (1.1 eq), and sodium acetate (3.0 eq) were dissolved in anhydrous 1,4-dioxane, and then, stirred in the nitrogen condition (e.g., stirred under a nitrogen inert atmosphere) at a temperature of 120° C. for 4 days. The reaction mixture was cooled at room temperature, and then subjected to an extraction process three times utilizing water to obtain an organic layer. The obtained organic layer was dried by utilizing anhydrous magnesium sulfate and concentrated, and column chromatography (MC:50 vol % hexane) was utilized to obtain Compound 7 (yield: 17%).

Synthesis Example 6: Synthesis of Compound 8

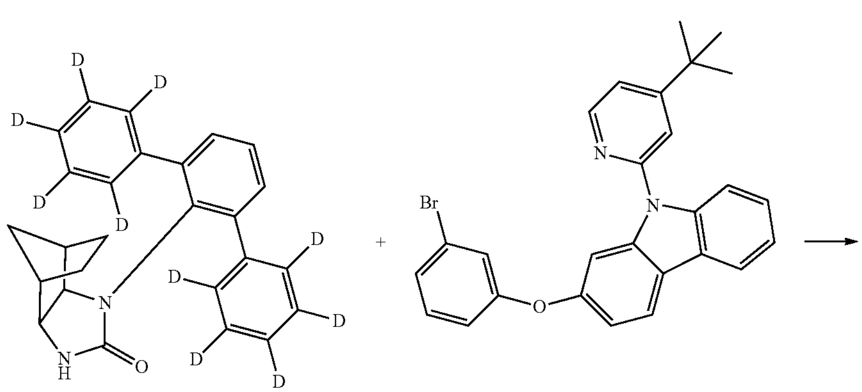

-continued

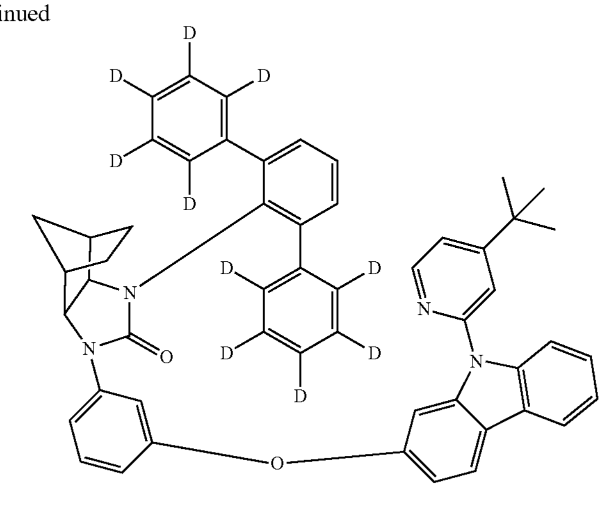

8-A

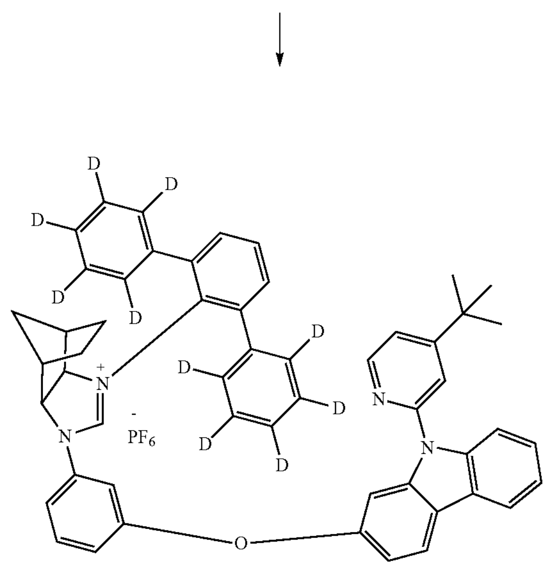

8-B

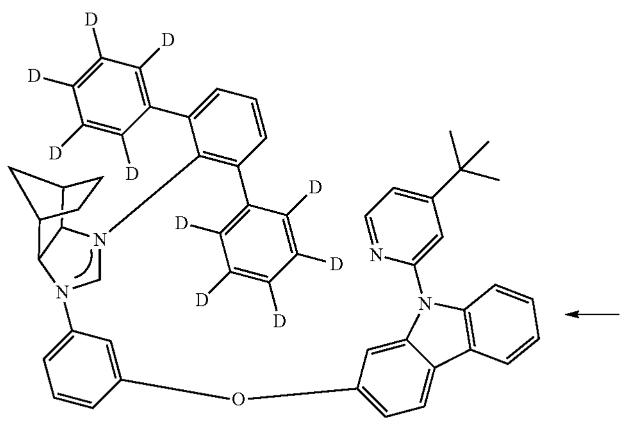

8

Synthesis of Intermediate Compound 8-A

Intermediate compound 7-A (1.2 eq), 2-(3-bromophenoxy)-9-(4-(tert-butyl)pyridin-2-yl)-9H-carbazole (1.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 3 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography (ethyl acetate: hexane=1:9) was utilized to obtain Intermediate compound 8-A (yield: 70%).

Synthesis of Intermediate Compound 8-B

Intermediate compound 8-A (1.0 eq) and ammonium hexafluorophosphate (3.0 eq) were dissolved in methanol (0.5 M), and then, distilled water was added thereto, and stirred at room temperature for 3 hours to 12 hours. After washing with distilled water and filtering to obtain a solid, an extraction process was performed thereon three times utilizing dichloromethane and water to obtain an organic layer. The obtained organic layer was dried by utilizing anhydrous magnesium sulfate, and concentrated to synthesize Intermediate compound 8-B (yield of 93%).

Synthesis of Compound 8

Intermediate compound 8-B (1.0 eq), dichloro(1,5-cyclooctadiene)platinum (II) (1.1 eq), and sodium acetate (3.0 eq) were dissolved in anhydrous 1,4-dioxane, and then, stirred in the nitrogen condition (e.g., stirred under a nitrogen inert atmosphere) at a temperature of 120° C. for 4 days. The reaction mixture was cooled at room temperature, and then subjected to an extraction process three times utilizing water to obtain an organic layer. The obtained organic layer was dried by utilizing anhydrous magnesium sulfate and concentrated, and column chromatography (MC 30 vol %:hexane) was utilized to obtain Compound 8 (yield: 18%).

Synthesis Example 7: Synthesis of Compound 12

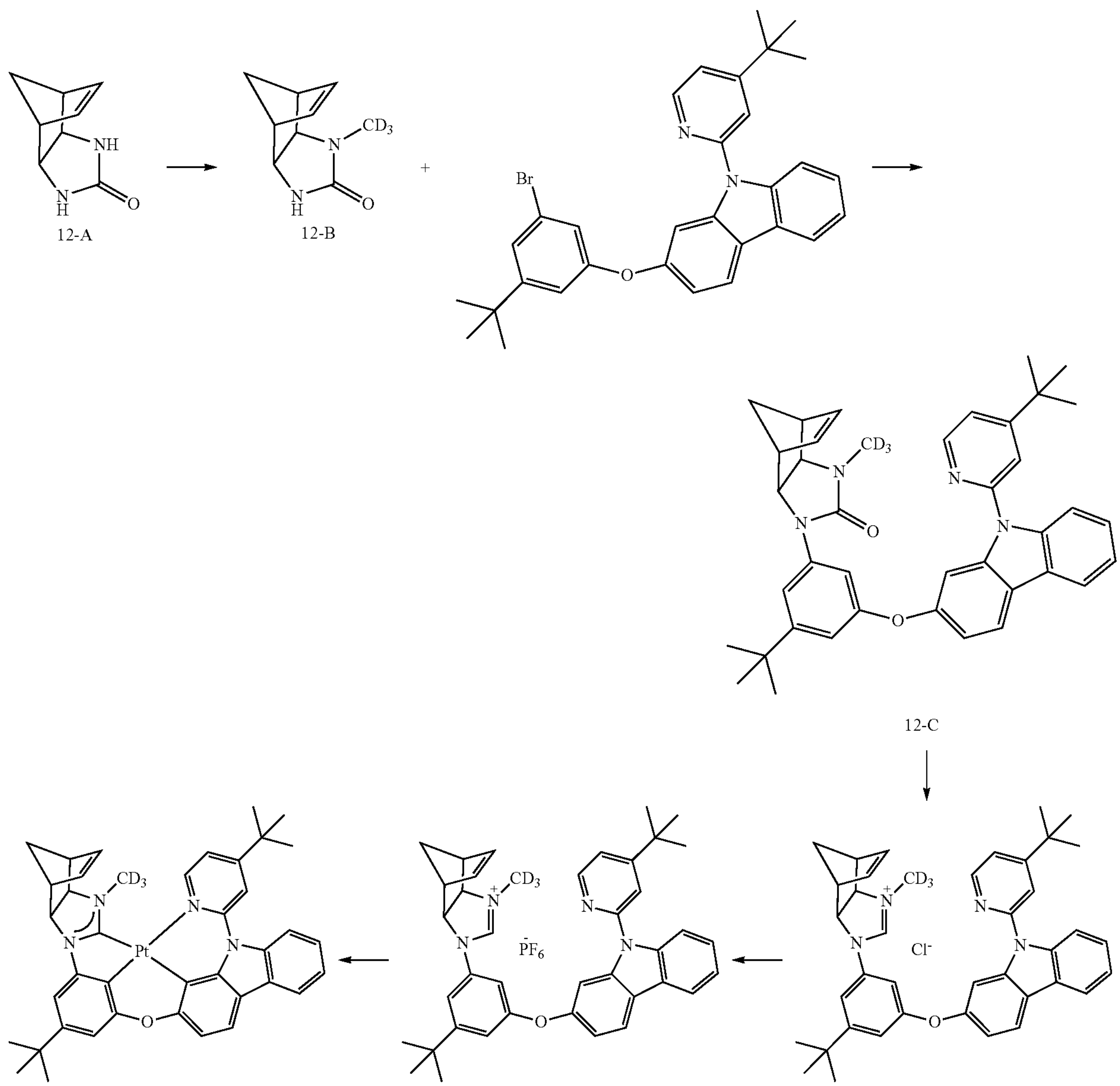

12-A, 12-B, 12-C, 12-D, 12-E, 12

Synthesis of Intermediate Compound 12-A 1,3-diacetylimidazolin-2-one (1.0 equiv.) and cyclopentadiene (1.0 mol, 10 equiv.) were dissolved in m-xylene and stirred at a temperature of 150° C. for 72 hours. After the pressure was reduced, n-hexane was added to the reaction mixture and the precipitate was removed therefrom by filtration. The filtered precipitate was dissolved in MeOH (250 ml) and 2 M HCl (250 ml), stirred at room temperature for 30 minutes, and then subjected to reduced pressure. The reaction mixture was extracted with water and dichloromethane to obtain an organic layer. The obtained organic layer was dried by utilizing anhydrous magnesium sulfate, and concentrated to synthesize an intermediate compound. The intermediate compound was dissolved in MeOH and dichloromethane and stirred at room temperature. After adding NaH (60% in mineral oil, 1.0 equiv.) at a temperature of 0° C., the resultant mixture was stirred for 4 hours at room temperature. After quenching with a $NH_4Cl$ solution at 0° C., an extraction process was performed utilizing water and dichloromethane. The obtained organic layer was dried utilizing anhydrous magnesium sulfate, concentrated, and recrystallized utilizing n-hexane to synthesize Intermediate compound 12-A (yield of 91%).

Synthesis of Intermediate Compound 12-B

Intermediate compound 12-A (1.0 eq), Iodomethane-d3 (3.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 12 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography was utilized to obtain Intermediate compound 12-B (yield: 80%).

Synthesis of Intermediate Compound 12-C

Intermediate compound 12-B (1.2 eq), 2-(3-bromo-5-(tert-butyl)phenoxy)-9-(4-(tert-butyl)pyridin-2-yl)-9H-carbazole (1.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 3 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography (ethyl acetate: hexane=1:9) was utilized to obtain Intermediate compound 12-C(yield: 78%).

Synthesis of Intermediate Compound 12-D

Intermediate compound 12-C (3.5 mmol) was dissolved in THF and then stirred at room temperature. $LiAlH_4$ (7.0 mmol) was added at a temperature of 0° C., followed by stirring for 2 hours at 50° C. After adding THF, a NaOH solution and $H_2O$ to the reaction mixture at a temperature of 0° C., the resultant mixture was stirred for 30 minutes at room temperature. The reaction mixture was filtered by celite/silica gel utilizing THF and EtOAc and subjected to reduced pressure. After the reaction mixture (1.0 eq) was dissolved in triethyl orthoformate (30 eq) at 80° C., 37% HCl (1.5 eq) was added thereto and stirred at a temperature of 80° C. for 12 hours. After cooling at room temperature, triethyl orthoformate (e.g., the triethyl orthoformate solution) was concentrated and extracted three times with dichloromethane and water to obtain an organic layer. The obtained organic layer was dried by utilizing anhydrous magnesium sulfate and concentrated, and column chromatography (MC, MC:5 vol % methanol) was utilized to obtain Intermediate compound 12-D (yield: 87%).

Synthesis of Intermediate Compound 12-E

Intermediate compound 12-D (1.0 eq) and ammonium hexafluorophosphate (3.0 eq) were dissolved in methanol (0.5 M), and then, distilled water was added thereto, and stirred at room temperature for 3 hours to 12 hours. After washing with distilled water and filtering to obtain a solid, an extraction process was performed thereon three times utilizing dichloromethane and water to obtain an organic layer. The obtained organic layer was dried by utilizing anhydrous magnesium sulfate, and concentrated to synthesize Intermediate compound 12-E (yield of 96%).

Synthesis of Compound 12

Intermediate compound 12-E (1.0 eq), dichloro(1,5-cyclooctadiene)platinum (II) (1.1 eq), and sodium acetate (3.0 eq) were dissolved in anhydrous 1,4-dioxane, and then, stirred in the nitrogen condition (e.g., stirred under a nitrogen inert atmosphere) at a temperature of 120° C. for 4 days. The reaction mixture was cooled at room temperature, and then subjected to an extraction process three times utilizing water to obtain an organic layer. The obtained organic layer was dried by utilizing anhydrous magnesium sulfate and concentrated, and column chromatography (MC:50 vol % hexane) was utilized to obtain Compound 12 (yield: 21%).

Synthesis Example 8: Synthesis of Compound 23

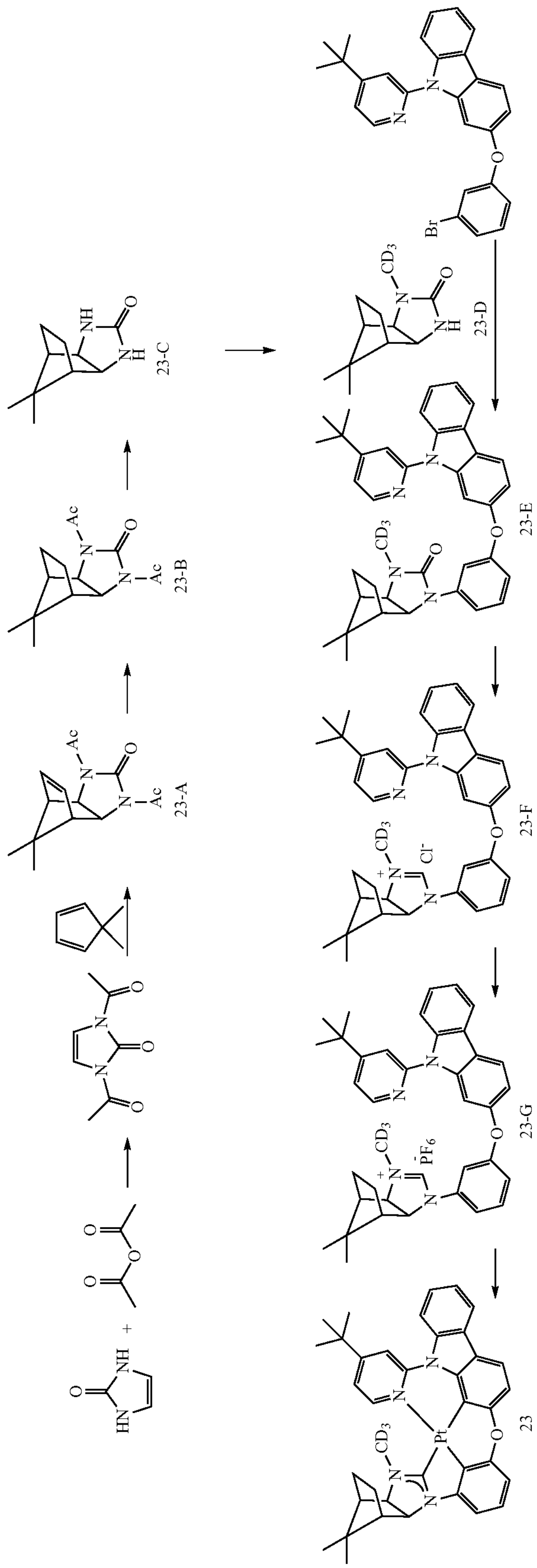
23-A
23-B
23-C
23-D
23-E
23-F
23-G
23

Synthesis of Intermediate Compound 23-A 1,3-diacetylimidazolin-2-one (1.0 equiv.) and 5,5-dimethylcyclopenta-1,3-diene (1.0 mol, 10 equiv.) were dissolved in m-xylene and stirred at a temperature of 150° C. for 72 hours. After the pressure was reduced, n-hexane was added to the reaction mixture and the precipitate was removed therefrom by filtration. The filtered precipitate was dissolved in MeOH (250 ml) and 2 M HCl (250 ml), stirred at room temperature for 30 minutes, and then subjected to reduced pressure. The reaction mixture was extracted with water and dichloromethane to obtain an organic layer. The obtained organic layer was dried by utilizing anhydrous magnesium sulfate, and concentrated to synthesize Intermediate compound 23-A (yield of 56%).

Synthesis of Intermediate Compound 23-B

A 20 ml EtOAc solution of 10% Pd/C (70 mg) was added to a solution in which Intermediate compound 23-A (15 mmol) was dissolved in EtOAc (10 ml) under the Ar condition (e.g., under the Ar inert atmosphere). After filling with the hydrogen gas, stirring was performed thereon at room temperature for 1 hour. The reaction mixture was washed with EtOAc and filtered utilizing Celite. The filtrate was concentrated to obtain synthesized Intermediate compound 23-B (yield of 99%).

Synthesis of Intermediate Compound 23-C

Intermediate compound 23-B (2.0 equiv.) was dissolved in methanol (MeOH) and dichloromethane and stirred at room temperature. After adding NaH (60% in mineral oil, 1.0 equiv.) at a temperature of 0° C., the resultant mixture was stirred for 4 hours at room temperature. After quenching with a $NH_4Cl$ solution at 0° C., an extraction process was performed utilizing water and dichloromethane. The obtained organic layer was dried utilizing anhydrous magnesium sulfate, concentrated, and recrystallized utilizing n-hexane to synthesize Intermediate compound 23-C (yield of 94%).

Synthesis of Intermediate Compound 23-D

Intermediate compound 23-C (1.0 eq), Iodomethane-d3 (3.0 eq), $Pd_2(dba)_3$ (2 mol %), Sphos (1 mol %), and sodium tert-butoxide (2.0 eq) were dissolved in toluene (0.1 M), and then, stirred at a temperature of 110° C. for 12 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography was utilized to obtain Intermediate compound 23-D (yield: 78%).

Synthesis of Intermediate Compound 23-E

Intermediate compound 23-D (1.2 eq), 2-(3-bromo-5-(tert-butyl)phenoxy)-9-(4-(tert-butyl)pyridin-2-yl)-9H-carbazole (1.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 3 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography (ethyl acetate: hexane=1:9) was utilized to obtain Intermediate compound 23-E (yield: 68%).

Synthesis of Intermediate Compound 23-F

Intermediate Compound 23-E (7.0 mmol) was dissolved in THF and then stirred at room temperature. $LiAlH_4$ (14 mmol) was added at a temperature of 0° C., followed by stirring for 2 hours at a temperature of 50° C. After adding THF, a NaOH solution and $H_2O$ to the reaction mixture at a temperature of 0° C., the resultant mixture was stirred for 30 minutes at room temperature. The reaction mixture was filtered by celite/silica gel utilizing THF and EtOAc and subjected to reduced pressure. After the reaction mixture (1.0 eq) was dissolved in triethyl orthoformate (30 eq) at 80° C., 37% HCl (1.5 eq) was added thereto and stirred at a temperature of 80° C. for 12 hours. After cooling at room temperature, triethyl orthoformate (e.g., the triethyl orthoformate solution) was concentrated and extracted three times with dichloromethane and water to obtain an organic layer. The obtained organic layer was dried by utilizing anhydrous magnesium sulfate and concentrated, and column chromatography (MC, MC:5 vol % methanol) was utilized to obtain Intermediate compound 23-F (yield: 85%).

Synthesis of Intermediate Compound 23-G

Intermediate compound 23-F (1.0 eq) and ammonium hexafluorophosphate (3.0 eq) were dissolved in methanol (0.5 M), and then, distilled water was added thereto, and stirred at room temperature for 3 hours to 12 hours. After washing with distilled water and filtering to obtain a solid, an extraction process was performed thereon three times utilizing dichloromethane and water to obtain an organic layer. The obtained organic layer was dried by utilizing anhydrous magnesium sulfate, and concentrated to synthesize Intermediate compound 23-G (yield of 97%).

Synthesis of Compound 23

Intermediate compound 23-G (1.0 eq), dichloro(1,5-cyclooctadiene)platinum (II) (1.1 eq), and sodium acetate (3.0 eq) were dissolved in anhydrous 1,4-dioxane, and then, stirred in the nitrogen condition (e.g., stirred under a nitrogen inert atmosphere) at a temperature of 120° C. for 4 days. The reaction mixture was cooled at room temperature, and then subjected to an extraction process three times utilizing water to obtain an organic layer. The obtained organic layer was dried by utilizing anhydrous magnesium sulfate and concentrated, and column chromatography (MC:50 vol % hexane) was utilized to obtain Compound 23 (yield: 22%).

Synthesis Example 9: Synthesis of Compound 35

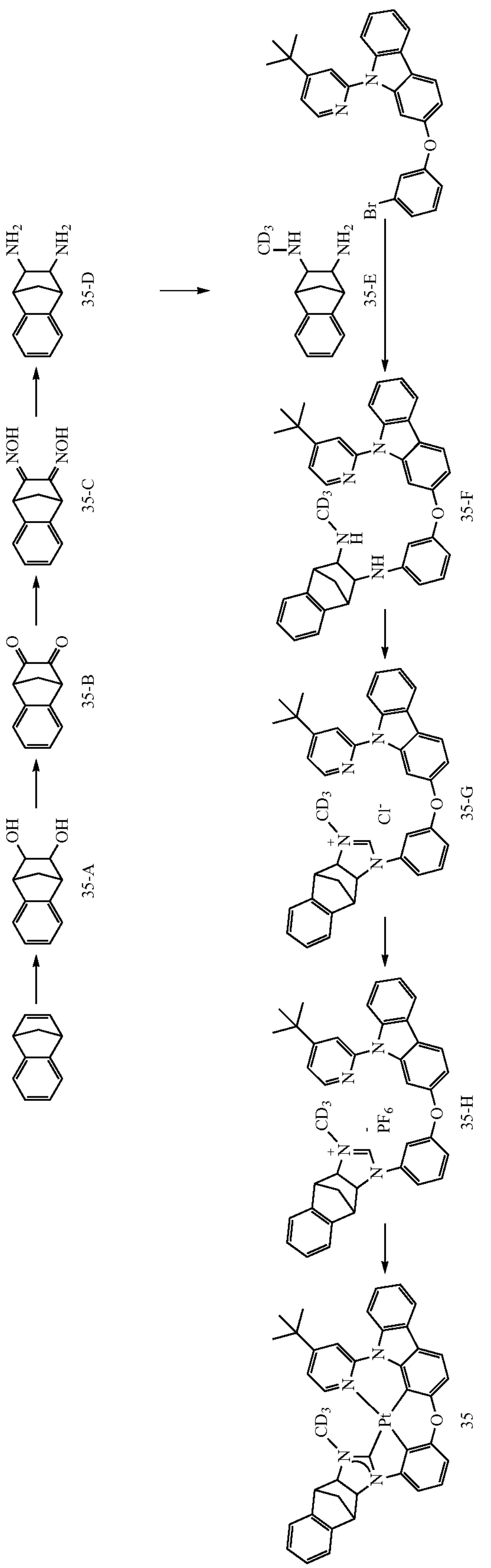
35-A
35-B
35-C
35-D
35-E
35-F
35-G
35-H
35

Synthesis of Intermediate Compound 35-A 1,4-dihydro-1,4-methanonaphthalene (1.00 g) was dissolved in tert-butanol (7.8 ml) and $H_2O$ (2.3 ml). N-methylmorpholine N-oxide solution (4.8 M in $H_2O$, 6.4 mL, 30.7 mmol) was added thereto, and after about 5 minutes, an $OsO_4$ solution (0.02 mL, 2 wt % in water) was added thereto and stirred at a temperature of 60° C. for 20 hours. After cooling the reaction mixture, the solvent was removed therefrom under reduced pressure, and extracted with water and ethyl acetate to obtain an organic layer. After washing with acetone, the resultant product was filtered to synthesize Intermediate compound 35-A (yield of 86%).

Synthesis of Intermediate Compound 35-B

Trifluoroacetic anhydride (0.62 mL, 4.50 mmol) was slowly added to dimethyl sulfoxide (DMSO), and then the solution was stirred at a temperature of −78° C. for 10 minutes. The resultant mixture was added to a solution in which Intermediate compound 35-A (264 mg, 1.50 mmol) was dissolved in THF (5 ml), and then, stirred at a temperature of −78° C. for 2 hours. After the addition of $Et_3N$ (1.11 mL), the resultant mixture was stirred at a temperature of −78° C. for 3 hours, and transferred to an ice bath and stirred therein at a temperature of 0° C. The result was quenched utilizing $NH_4Cl$ solution (10 ml), and then, extracted with water and $Et_2O$ to obtain an organic layer. The obtained organic layer was dried by utilizing anhydrous magnesium sulfate and concentrated, and column chromatography (30% EtOAc) was utilized to obtain Intermediate compound 35-B (yield: 96%).

Synthesis of Intermediate Compound 35-C

Intermediate Compound 35-B (400 mg, 1.98 mmol) was dissolved in 10 ml MeOH, and then, NaOAc (389 mg, 4.75 mmol) and $NH_2OH$ HCl (550 mg, 7.92 mmol) were added thereto, followed by stirring at room temperature for 4 hours. The reaction mixture was extracted with water and EtOAc to obtain an organic layer. The obtained organic layer was dried utilizing anhydrous magnesium sulfate, concentrated, and recrystallized utilizing hexane and EtOAc at the volume ratio of 1:1 to synthesize Intermediate compound 35-C (yield of 89%).

Synthesis of Intermediate Compound 35-D

Intermediate compound 35-C (1.75 mmol) was dissolved in MeOH, and then, $NiCl_2$ (3.50 mmol) was added thereto and stirred at room temperature for 10 minutes. $NaBH_4$ (17.5 mmol) was added thereto at a temperature of 0° C., and then, stirred at room temperature for 4 hours. The reaction mixture was subjected to reduced pressure, dissolved in dichloromethane, and filtered utilizing a celite pad. After extraction with 2 M HCl and dichloromethane, the pressure was reduced to obtain Intermediate compound 35-D (yield: 82%).

Synthesis of Intermediate Compound 35-E

Intermediate Compound 35-D (1.0 eq), Iodomethane-d3 (3.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 12 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography was utilized to obtain Intermediate compound 35-E (yield: 75%).

Synthesis of Intermediate Compound 35-F

Intermediate compound 35-E (1.2 eq), 2-(3-bromophenoxy)-9-(4-(tert-butyl)pyridin-2-yl)-9H-carbazole (1.0 eq), $Pd_2(dba)_3$ (5 mol %), Sphos (7 mol %), and sodium tert-butoxide (2.0 eq) were dissolved in toluene (0.1 M), and then, stirred at a temperature of 110° C. for 3 hours. The reaction mixture was cooled at room temperature, and then subjected to an extraction process three times utilizing water to obtain an organic layer. The obtained organic layer was dried by utilizing anhydrous magnesium sulfate and concentrated, and column chromatography (ethyl acetate: hexane=1:9) was utilized to obtain Intermediate compound 35-F (yield: 77%).

Synthesis of Intermediate Compound 35-G

After Intermediate compound 35-F (1.0 eq) was dissolved in triethyl orthoformate (30 eq) at 80° C., 37% HCl (1.5 eq) was added thereto and stirred at a temperature of 80° C. for 12 hours. After cooling at room temperature, triethyl orthoformate (e.g., the triethyl orthoformate solution) was concentrated and extracted three times with dichloromethane and water to obtain an organic layer. The obtained organic layer was dried by utilizing anhydrous magnesium sulfate and concentrated, and column chromatography (MC, MC:5 vol % methanol) was utilized to obtain Intermediate compound 35-G (yield: 37%).

Synthesis of Intermediate Compound 35-H

Intermediate compound 35-G (1.0 eq) and ammonium hexafluorophosphate (3.0 eq) were dissolved in methanol (0.5 M), and then, distilled water was added thereto, and stirred at room temperature for 3 hours to 12 hours. After washing with distilled water and filtering to obtain a solid, an extraction process was performed thereon three times utilizing dichloromethane and water to obtain an organic layer. The obtained organic layer was dried by utilizing anhydrous magnesium sulfate, and concentrated to synthesize Intermediate compound 35-H (yield of 94%).

Synthesis of Compound 35

Intermediate compound 35-H (1.0 eq), dichloro(1,5-cyclooctadiene)platinum (II) (1.1 eq), and sodium acetate (3.0 eq) were dissolved in anhydrous 1,4-dioxane, and then, stirred in the nitrogen condition (e.g., stirred under a nitrogen inert atmosphere) at a temperature of 120° C. for 4 days. The reaction mixture was cooled at room temperature, and then subjected to an extraction process three times utilizing water to obtain an organic layer. The obtained organic layer was dried by utilizing anhydrous magnesium sulfate and concentrated, and column chromatography (MC:50 vol % hexane) was utilized to obtain Compound 35 (yield: 23%).

Evaluation Example 1

The $^3$MLCT (%), simulation maximum emission wavelength ($\lambda_{max}^{sim}$), and $^3$MC energy level of each of the compounds of Synthesis Examples 1 to 9 and Comparative Example 1 were evaluated by quantum simulation. Actual maximum emission wavelength ($\lambda_{max}^{exp}$) for each was also measured. Results thereof are shown in Table 1.

In more detail, characteristics of Compounds 5 and 7 and Compound A as a comparative compound were evaluated, and the energy level value of $^3$MC state for each was evaluated utilizing a B3LYP functional method. The $^3$MLCT (%) value was measured by structural optimization at the level of B3LYP, 6-31 G(d,p) utilizing a density functional theory (DFT) calculation method of the Gaussian program.

TABLE 1

| | Compound | $^3$MLCT(%) | $\lambda_{max}^{sim}$ (nm) | $\lambda_{max}^{exp}$ (nm) | $^3$MC (Kcal/mol) |
|---|---|---|---|---|---|
| Synthesis Example 1 | 1 | 11.7 | 461.25 | 454 | 0.81 |
| Synthesis Example 2 | 2 | 11.3 | 464.38 | 455 | 0.81 |
| Synthesis Example 3 | 4 | 8.6 | 483.66 | 466 | 0.61 |
| Synthesis Example 4 | 5 | 8.6 | 480.30 | 461 | 0.75 |
| Synthesis Example 5 | 7 | 9.39 | 469.09 | 463 | 0.41 |
| Synthesis Example 6 | 8 | 9.63 | 461.60 | 460 | 0.41 |
| Synthesis Example 7 | 12 | 10.03 | 469.45 | 462 | 0.82 |
| Synthesis Example 8 | 23 | 9.63 | 461.60 | 459 | 0.65 |
| Synthesis Example 9 | 35 | 9.82 | 473.65 | 470 | 0.81 |
| Comparative Example 1 | A | 8.8 | 469.53 | 460 | 0.21 |

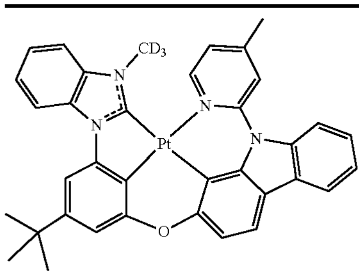

A

From Table 1, it can be seen that the $^3$MC values of Compounds 1, 2, 4, 5, 7, 8, 12, 23, and 35 were each significantly higher than the $^3$MC value of Compound A. Accordingly, each of Compounds 1, 2, 4, 5, 7, 8, 12, 23, and 35 may less likely transition from the $^3$MCLT state to the non-emission state, that is, the $^3$MC state. Therefore, the stability thereof in an excited state may be suitable (e.g., excellent), and the efficiency and lifespan of the organic light-emitting device including the organometallic compounds may be increased.

EXAMPLES

Example 1

As a substrate and an anode, a glass substrate with 15 Ω/cm$^2$ (1,200 Å) ITO thereon, which was manufactured by Corning Inc., was cut to a size of 50 mm×50 mm×0.7 mm, and the glass substrate was sonicated by utilizing isopropyl alcohol and pure water for 5 minutes each, and then ultraviolet (UV) light was irradiated for 30 minutes thereto and ozone was exposed thereto for cleaning. Then, the resultant glass substrate was loaded onto a vacuum deposition apparatus.

2-TNATA was vacuum-deposited on the ITO anode on the glass substrate to form a hole injection layer having a thickness of 600 Å, and then, NPB was vacuum-deposited on the hole injection layer to form a hole transport layer having a thickness of 300 Å.

Co-hosts bis(4-(9H-carbazol-9-yl)phenyl)diphenylsilane) (BCPDS) and (4-(1-(4-(diphenylamino)phenyl)cyclohexyl) phenyl)diphenyl-phosphine oxide (POPCPA) (the weight ratio of BCPDS to POPCPA was 1:1) and Compound 1, which is a dopant, were co-deposited on the hole transport layer at a co-host to dopant weight ratio of 90:10 to form an emission layer having a thickness of 300 Å.

Diphenyl(4-(triphenylsilyl)phenyl)-phosphine oxide (TSPO1) was deposited on the emission layer to form a hole blocking layer having a thickness of 50 Å, $Alq_3$ was deposited on the hole blocking layer to form an electron transport layer having a thickness of 300 Å, LiF was deposited on the electron transport layer to form an electron injection layer having a thickness of 10 Å, and Al was vacuum-deposited on the electron injection layer to form a cathode having a thickness of 3,000 Å, thereby completing the manufacture of an organic light-emitting device.

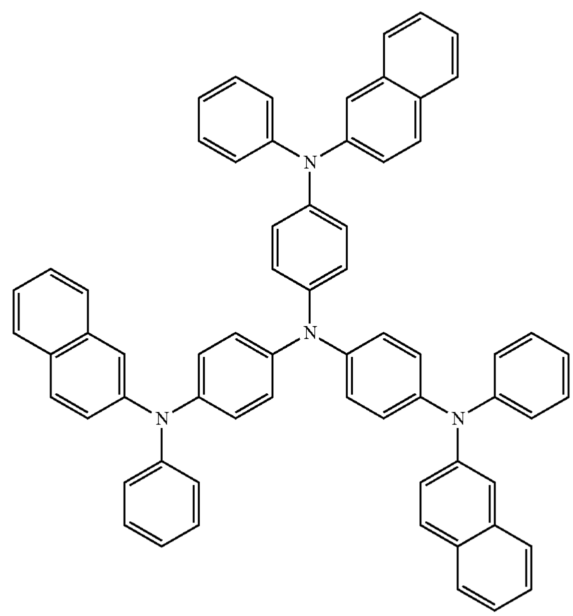

2-TNATA

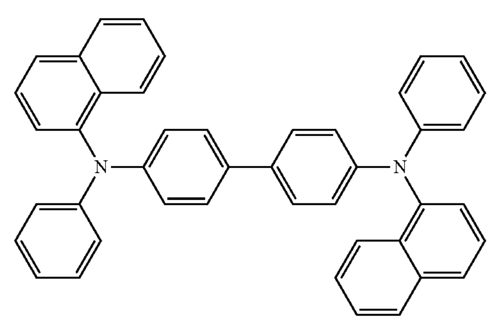

NPB

-continued

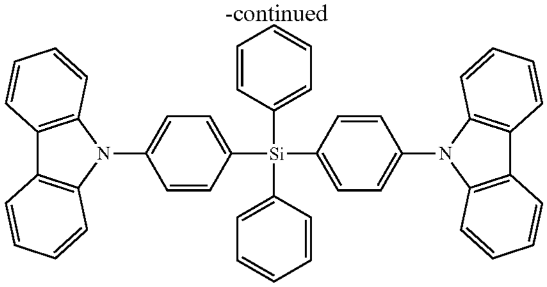

BCPDS

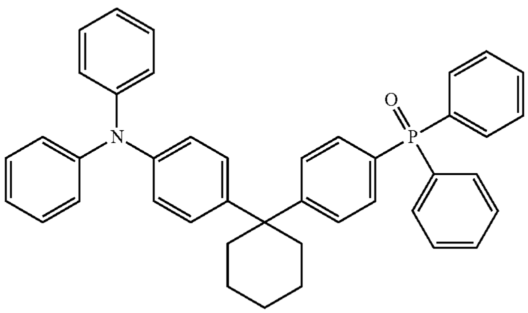

POPCPA

-continued

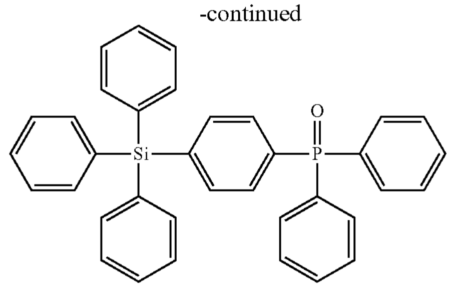

TSPO1

Examples 2 to 9 and Comparative Example 1

Organic light-emitting devices were manufactured in the same manner as in Example 1, except that in forming an emission layer, for usage as a dopant, corresponding compounds shown in Table 1 were utilized instead of Compound 1.

Evaluation Example 2

The driving voltage, current density, luminance, luminescence efficiency, emission color, and maximum emission wavelength of each of the organic light-emitting devices manufactured according to Examples 1 to 9, and Comparative Example 1 were measured by utilizing a Keithley SMU 236 and a luminance photometer PR650, and results thereof are shown in Table 2. PGP 54 TRE

TABLE 2

| | Emission layer | Driving density (V) | Current voltage (mA/cm$^2$) | Luminance (cd/m$^2$) | Efficiency (cd/A) | Emission color | Emission wavelength (nm) |
|---|---|---|---|---|---|---|---|
| Example 1 | 1 | 5.31 | 50 | 4260 | 8.40 | Blue | 454 |
| Example 2 | 2 | 5.31 | 49 | 3950 | 7.92 | Blue | 455 |
| Example 3 | 4 | 5.20 | 50 | 3990 | 7.93 | Blue | 466 |
| Example 4 | 5 | 5.35 | 50 | 4110 | 8.22 | Blue | 461 |
| Example 5 | 7 | 5.30 | 52 | 4137 | 8.28 | Blue | 463 |
| Example 6 | 8 | 5.28 | 48 | 4220 | 8.40 | Blue | 460 |
| Example 7 | 12 | 5.35 | 50 | 4160 | 8.29 | Blue | 462 |
| Example 8 | 23 | 5.37 | 49 | 3950 | 7.92 | Blue | 459 |
| Example 9 | 35 | 5.31 | 50 | 4100 | 8.21 | Blue | 470 |
| Comparative Example 1 | A | 5.32 | 50 | 3810 | 7.51 | Blue | 460 |

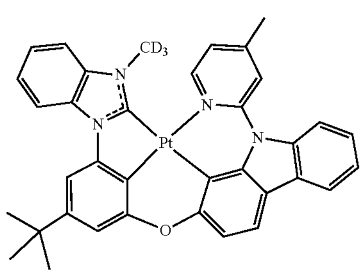

A

Referring to Table 2, it was confirmed that each of the organic light-emitting devices of Examples 1 to 9 had a higher level of luminance and a higher luminescence efficiency than the organic light-emitting device of Comparative Example 1.

According to the one or more embodiments, the organic light-emitting device including the organometallic compound may have high luminance, high efficiency, and long lifespan.

The use of "may" when describing embodiments of the present invention refers to "one or more embodiments of the present invention." Also, the term "exemplary" is intended to refer to an example or illustration.

As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a), and 35 U.S.C. § 132(a).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the following claims, and equivalents thereof.

What is claimed is:

1. An organic light-emitting device comprising:

a first electrode;

a second electrode; and an organic layer comprising an emission layer between the first electrode and the second electrode, wherein the organic light-emitting device comprises at least one organometallic compound represented by Formula 1:

Formula 1

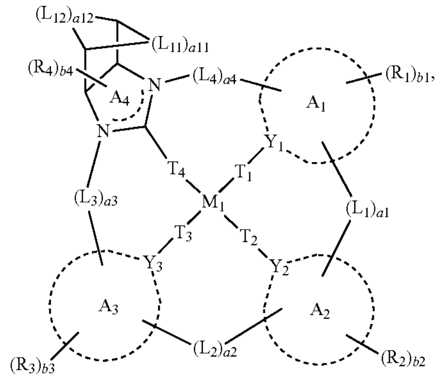

wherein, in Formula 1, $M_1$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), Terbium (Tb), and thulium (Tm), $Y_1$ to $Y_3$ are each independently N or C, $T_1$ to $T_4$ are each independently a chemical bond, O, S, B(R'), N(R'), P(R'), C(R')(R"), Si(R')(R"), Ge(R')(R"), C(=O), B(R')(R"), N(R')(R"), or P(R')(R"), when $T_1$ is a chemical bond, $Y_1$ and $M_1$ directly bond to each other, when $T_2$ is a chemical bond, $Y_2$ and $M_1$ directly bond to each other, when $T_3$ is a chemical bond, $Y_3$ and $M_1$ directly bond to each other, and when $T_4$ is a chemical bond, $A_4$ and $M_1$ directly bond to each other, two bonds selected from a bond between $M_1$ and $Y_1$ or $T_1$, a bond between $M_1$ and $Y_2$ or $T_2$, a bond between $M_1$ and $Y_3$ or $T_3$, and a bond between $M_1$ and C or $T_4$ are each a coordination bond, and the other two bonds are each a covalent bond, $A_1$ to $A_3$ are each independently selected from a $C_5$-$C_{60}$ carbocyclic group and a $C_1$-$C_{60}$ heterocyclic group, $L_1$ to $L_4$ are each independently selected from a single bond, a double bond, *—N($R_5$)—*, *—B($R_5$)—*, *—P($R_5$)—*, *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—, *—C(=S)—*', and *—C≡C—*', a1 to a4 are each independently an integer from 0 to 3, and, when a1 is 0, $A_1$ and $A_2$ are not linked to each other, when a2 is 0, $A_2$ and $A_3$ are not linked to each other, when a3 is 0, $A_3$ and $A_4$ are not linked to each other, and when a4 is 0, $A_4$ and $A_1$ are not linked to each other, $L_{11}$ and $L_{12}$ are each independently selected from *—C($R_{11}$)($R_{12}$)—*', *—C($R_{11}$)=*', *=C($R_{11}$)—*', and *—C($R_{11}$)=C($R_{12}$)—*', a11 and a12 are each independently an integer from 1 to 3, R', R", $R_1$ to $R_6$, and $R_{11}$ to $R_{12}$ are each independently selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), —P(═S)($Q_1$)($Q_2$), ═O, ═S, ═N($Q_1$), and ═C($Q_1$)($Q_2$), b1 to b3 are each independently an integer from 0 to 20, b4 is an integer from 0 to 6, neighboring groups of R', R", $R_1$(s) in the number of b1, $R_2$(s) in the number of b2, $R_3$(s) in the number of b3, $R_4$(s) in the number of b4, $R_5$, $R_6$, $R_{11}$, and $R_{12}$ are optionally linked to each other to form a substituted or unsubstituted $C_5$-$C_{60}$ carbocyclic group or a substituted or unsubstituted $C_1$-$C_{60}$ heterocyclic group,

* and *' each indicate a binding site to a neighboring atom, and at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, —Cl, —Br, —I, and a cyano group, a $C_6$-$C_{60}$ aryl group substituted with at least one selected from deuterium, —F, —Cl, —Br, —I, and a cyano group, a biphenyl group, and a terphenyl group, provided that when $M_1$ is Pt, a4 is 0, and $L_{11}$ and $L_{12}$ are each independently *—C($R_{11}$)($R_{12}$)—*', then:

b4 is 1 to 6; and the N connected to $L_4$ is substituted with a $C_1$-$C_{20}$ alkyl group substituted with at least one deuterium, a $C_6$-$C_{20}$ aryl group substituted with at least one deuterium, or a $C_6$-$C_{20}$ aryl group substituted with a $C_6$-$C_{20}$ aryl group that is substituted with at least one deuterium.

2. The organic light-emitting device of claim 1, wherein an energy level $E_{3MC}$ of $^3$MC state of the organometallic compound is about 0.41 kcal/mol or more.

3. The organic light-emitting device of claim 1, wherein the emission layer comprises the at least one organometallic compound.

4. The organic light-emitting device of claim 3, wherein the emission layer further comprises a host, and an amount of the at least one organometallic compound is from 0.1 parts by weight to 50 parts by weight based on 100 parts by weight of the emission layer.

5. The organic light-emitting device of claim 3, wherein the emission layer is to emit blue light having a maximum emission wavelength of about 440 nm to about 490 nm.

6. The organic light-emitting device of claim 1, wherein the first electrode is an anode, the second electrode is a cathode, the organic layer comprises the at least one organometallic compound, the organic layer further comprises a hole transport region between the first electrode and the emission layer and an electron transport region between the emission layer and the second electrode, the hole transport region comprises a hole injection layer, a hole transport layer, an emission auxiliary layer, and/or an electron blocking layer, and the electron transport region comprises a buffer layer, a hole blocking layer, an electron transport layer, and/or an electron injection layer.

7. An organometallic compound represented by Formula 1:

Formula 1

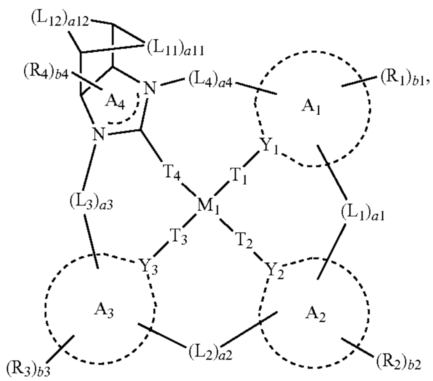

wherein, in Formula 1, $M_1$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), Terbium (Tb), and thulium (Tm), $Y_1$ to $Y_3$ are each independently N or C, $T_1$ to $T_4$ are each independently a chemical bond, O, S, B(R'), N(R'), P(R'), C(R')(R''), Si(R')(R''), Ge(R')(R''), C(=O), B(R')(R''), N(R')(R''), or P(R')(R''), when $T_1$ is a chemical bond, $Y_1$ and $M_1$ directly bond to each other, when $T_2$ is a chemical bond, $Y_2$ and $M_1$ directly bond to each other, when $T_3$ is a chemical bond, $Y_3$ and $M_1$ directly bond to each other, and when $T_4$ is a chemical bond, $A_4$ and $M_1$ directly bond to each other, two bonds selected from a bond between $M_1$ and $Y_1$ or $T_1$, a bond between $M_1$ and $Y_2$ or $T_2$, a bond between $M_1$ and $Y_3$ or $T_3$, and a bond between $M_1$ and $Y_4$ or C are each a coordination bond, and the other two bonds are each a covalent bond, $A_1$ to $A_3$ are each independently selected from a $C_5$-$C_{60}$ carbocyclic group and a $C_1$-$C_{60}$ heterocyclic group, $L_1$ to $L_4$ are each independently selected from a single bond, a double bond, *—N($R_5$)—*, *—B($R_5$)—*, *—P($R_5$)—*, *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—, *—C(=S)—*', and *—C≡C—*', a1 to a4 are each independently an integer from 0 to 3, and, when a1 is 0, $A_1$ and $A_2$ are not linked to each other, when a2 is 0, $A_2$ and $A_3$ are not linked to each other, when a3 is 0, $A_3$ and $A_4$ are not linked to each other, and when a4 is 0, $A_4$ and $A_1$ are not linked to each other, $L_{11}$ and $L_{12}$ are each independently selected from *—C($R_{11}$)($R_{12}$)—*', *—C($R_{11}$)=*', *=C($R_{11}$)—*', and *—C($R_{11}$)=C($R_{12}$)—*', a11 and a12 are each independently an integer from 1 to 3, R', R'', $R_1$ to $R_6$, and $R_{11}$ to $R_{12}$ are each independently selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), —P(=S)($Q_1$)($Q_2$), =O, =S, =N($Q_1$), and =C($Q_1$)($Q_2$), b1 to b3 are each independently an integer from 0 to 20, b4 is an integer from 0 to 6, neighboring groups of R', R'', $R_1$(s) in the number of b1, $R_2$(s) in the number of b2, $R_3$(s) in the number of b3, $R_4$(s) in the number of b4, $R_5$, $R_6$, $R_{11}$, and $R_{12}$ are optionally linked to each other to form a substituted or unsubstituted $C_5$-$C_{60}$ carbocyclic group or a substituted or unsubstituted $C_1$-$C_{60}$ heterocyclic group,

* and *' each indicate a binding site to a neighboring atom, at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, —Cl, —Br, —I, and a cyano group, a $C_6$-$C_{60}$ aryl group substituted with at least one selected from deuterium, —F, —Cl, —Br, —I, and a cyano group, a biphenyl group, and a terphenyl group, provided that when $M_1$ is Pt, a4 is 0, and $L_{11}$ and $L_{12}$ are each independently *—C($R_{11}$)($R_{12}$)—*', then:

b4 is 1 to 6; and the N connected to $L_4$ is substituted with a $C_1$-$C_{20}$ alkyl group substituted with at least one deuterium, a $C_6$-$C_{20}$ aryl group substituted with at least one deuterium, or a $C_6$-$C_{20}$ aryl group substituted with a $C_6$-$C_{20}$ aryl group that is substituted with at least one deuterium.

8. The organometallic compound of claim 7, wherein $M_1$ is selected from Pt, Pd, Cu, Ag, Au, Rh, Ir, Ru, and Os.

9. The organometallic compound of claim 7, wherein $T_1$ to $T_4$ are each a chemical bond, $Y_1$ is N, $Y_2$ is C, and at least one bond selected from a bond between $Y_1$ and $M_1$ and a bond between $Y_2$ and $M_1$ are each a coordination bond.

10. The organometallic compound of claim 7, wherein $A_1$ to $A_3$ are each independently selected from a benzene group, a naphthalene group, an anthracene group, a phenanthrene group, a triphenylene group, a pyrene group, a chrysene group, a cyclopentane group, a cyclopentadiene group, a cyclohexane group, a cyclohexene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 1,2,4-triazole group, a tetrazole group, a 2,3-dihydrotriazole group, an azasilole group, a diazasilole group, a triazasilole group, an oxazole group, an isooxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

11. The organometallic compound of claim 7, wherein i) $A_1$ is selected from a pyridine group, a pyrimidine group, a pyrazine group, a pyridazine group, and a triazine group, ii) $A_2$ is selected from an indole group, a carbazole group, an indolopyridine group, and an indolopyrimidine group, and/or iii) $A_3$ is selected from a benzene group, a naphthalene group, an anthracene group, and a phenanthrene group.

12. The organometallic compound of claim 7, wherein ia) $A_1$ is a group represented by one of Formulae 2A-1 to 2A-5, iia) $A_2$ is a group represented by one of Formulae 2B-1 to 2B-3, and/or iiia) $A_3$ is a group represented by Formula 2C-1:

2A-1

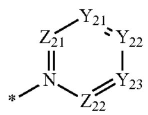

2A-2

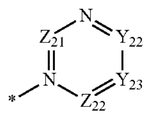

2A-3

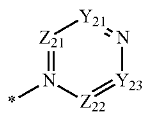

2A-4

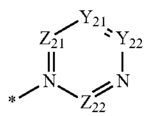

2A-5

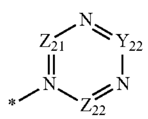

2B-1

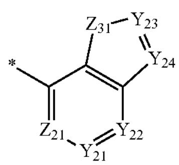

2B-2

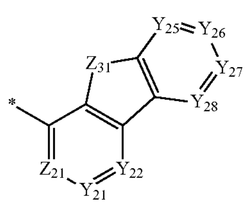

2B-3

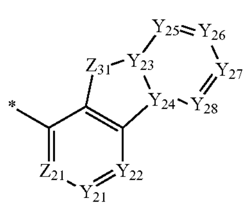

2C-1

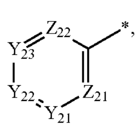

and wherein, in Formulae 2A-1 to 2A-5, Formulae 2B-1 to 2B-3, and Formula 2C-1, $Y_{21}$ is N or $C(R_{11a})$, $Y_{22}$ is N or $C(R_{12a})$, $Y_{23}$ is N or $C(R_{13a})$, $Y_{24}$ is N or $C(R_{14a})$, $Y_{25}$ is N or $C(R_{15a})$, $Y_{26}$ is N or $C(R_{16a})$, $Y_{27}$ is N or $C(R_{17a})$, and $Y_{28}$ is N or $C(R_{18a})$, $Z_{21}$ is *'—C, $C(R_{21a})$ or N, $Z_{22}$ is *'—C, $C(R_{22a})$, or N, $Z_{31}$ is *'—N or $N(R_{31a})$, $R_{11a}$ to $R_{18a}$, $R_{21a}$ to $R_{22a}$, and $R_{31a}$ are each independently the same as described in connection with $R_1$ in Formula 1, and

* indicates a binding site to a neighboring $T_1$, $T_2$, or $T_3$, and *' indicates a binding site to a neighboring $L_1$, $L_2$, $L_3$, or $L_4$.

13. The organometallic compound of claim 7, wherein a1 to a3 are each 1, a4 is 0, $L_1$ and $L_3$ are each a single bond, and $L_2$ is *—O—*'.

14. The organometallic compound of claim 7, wherein i) $L_{11}$ and $L_{12}$ are each *—$C(R_{11})(R_{12})$—*', a11 is 2, and a12 is 1, ii) $L_{11}$ is *—$C(R_{11})$═$C(R_{12})$—*', $L_{12}$ is *—$C(R_{11})(R_{12})$—*', and a11 and a12 are each 1, or iii) $L_{11}$ is *—$C(R_{11})(R_{12})$—*', $L_{12}$ is *—$C(R_{11})$═$C(R_{12})$—*', and a11 and a12 are each 1.

15. The organometallic compound of claim 7, wherein R', R", $R_1$ to $R_6$, $R_{11}$, and $R_{12}$ are each independently selected from:

hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a cyclopentyl group, a cyclohexyl group, a phenyl group, a naphthyl group, a pyridinyl group, a pyrimidinyl group, a pyrazinyl group, a pyridazinyl group, a pyrrolyl group, an indolyl group, an isoindolyl group, an indazolyl group, a quinolinyl group, an isoquinolinyl group, a quinoxalinyl group, a quinazolinyl group, a cinnolinyl group, and a triazinyl group;

a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —$Si(Q_{31})(Q_{32})(Q_{33})$, —$N(Q_{31})(Q_{32})$, —$B(Q_{31})(Q_{32})$, —C(═O)($Q_{31}$), —S(═O)$_2$($Q_{31}$), and —P(═O)($Q_{31}$)($Q_{32}$);

a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from a $C_1$-$C_{20}$ alkyl group, a $C_1$-$C_{20}$ alkoxy group, a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, and a triazinyl group, each substituted with at least one selected from a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$; and —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, —$P(=O)(Q_1)(Q_2)$, —$P(=S)(Q_1)(Q_2)$, =O, =S, =$N(Q_1)$, and =$C(Q_1)(Q_2)$, and wherein $Q_1$ to $Q_3$ and $Q_{31}$ to $Q_{33}$ are each independently selected from hydrogen, deuterium, —F, —Cl, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group.

16. The organometallic compound of claim 7, wherein the organometallic compound is represented by one of Formulae 1-1 to 1-6:

Formula 1-1

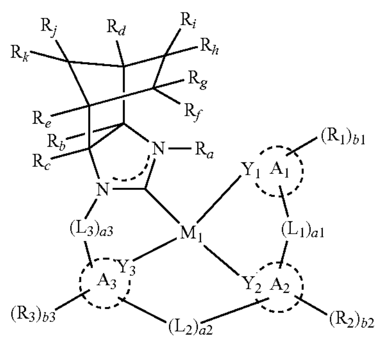

Formula 1-2

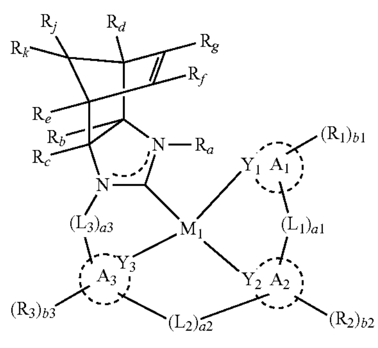

-continued

Formula 1-3

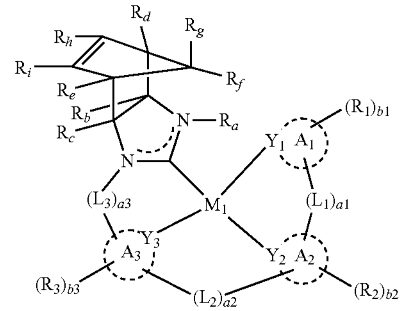

Formula 1-4

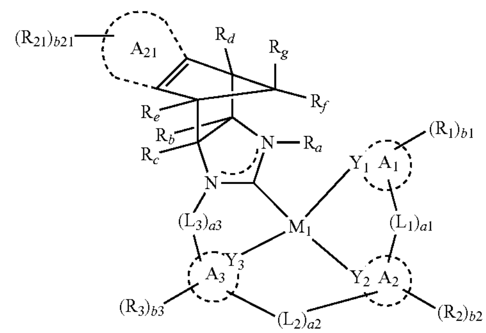

Formula 1-5

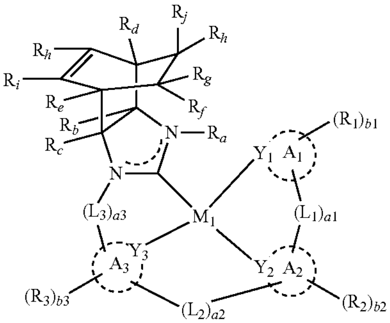

Formula 1-6

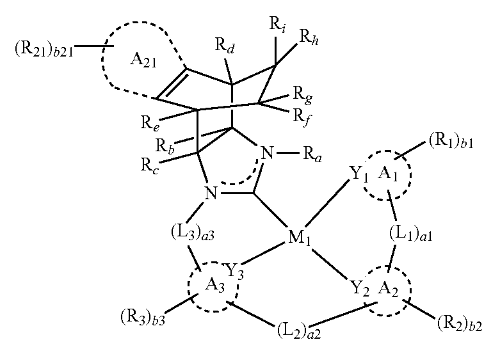

and wherein, in Formulae 1-1 to 1-6, $M_1$, $A_1$ to $A_3$, $Y_1$ to $Y_3$, $L_1$ to $L_3$, a1 to a3, $R_1$ to $R_3$, and b1 to b3 are each independently the same as respectively described in connection with Formula 1, $A_{21}$ is the same as described in connection with $A_1$ in in Formula 1, $R_a$ to $R_k$ and $R_{21}$ are each independently the same as described in connection with $R_1$ in Formula 1, and b21 is the same as described in connection with b1 in Formula 1, and wherein in Formula 1-1, provided that when $M_1$ is Pt, then $R_a$ is a $C_1$-$C_{20}$ alkyl group substituted with at least one deuterium, a $C_6$-$C_{20}$ aryl group substituted with at least one deuterium, or a $C_6$-$C_{20}$ aryl group substituted with a $C_6$-$C_{20}$ aryl group that is substituted with at least one deuterium.

17. The organometallic compound of claim 7, wherein the organometallic compound is represented by Formula 1A:

Formula 1A

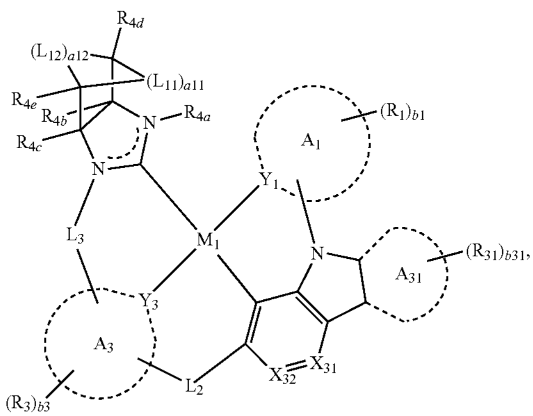

and wherein, in Formula 1A, $M_1$, $A_1$, $A_3$, $Y_1$, $Y_3$, $L_2$ to $L_3$, $L_{11}$ and $L_{12}$, a11 and a12, $R_1$, $R_3$, b1, and b3 are each independently the same as respectively described in connection with Formula 1, $X_{31}$ to $X_{32}$ are each independently N or $C(R_{32})$, $A_{31}$ is the same as described in connection with $A_1$ in Formula 1, $R_{4a}$ to $R_{4e}$, $R_{31}$, and $R_{32}$ are each independently the same as described in connection with $R_1$ in Formula 1, and b31 is the same as described in connection with b1 in Formula 1, and wherein in Formula 1A, provided that when $M_1$ is Pt, then $R_{4a}$ is a $C_1$-$C_{20}$ alkyl group substituted with at least one deuterium, a $C_6$-$C_{20}$ aryl group substituted with at least one deuterium, or a $C_6$-$C_{20}$ aryl group substituted with a $C_6$-$C_{20}$ aryl group that is substituted with at least one deuterium.

18. The organometallic compound of claim 7, wherein the organometallic compound represented by Formula 1 comprises one or more deuterium.

19. The organometallic compound of claim 7, wherein the organometallic compound represented by Formula 1 comprises at least one selected from a $C_1$-$C_{20}$ alkyl group substituted with at least one deuterium and a $C_6$-$C_{20}$ aryl group substituted with at least one deuterium.

20. The organometallic compound of claim 7, wherein the organometallic compound represented by Formula 1 is selected from Compounds 1 to 44:

1

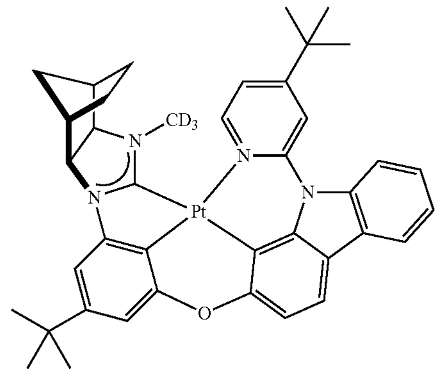

2

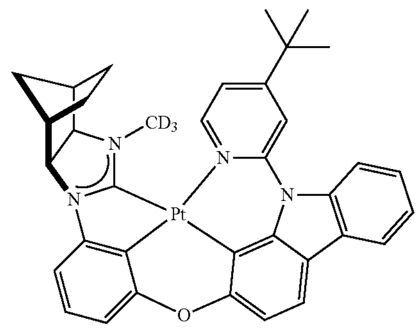

3

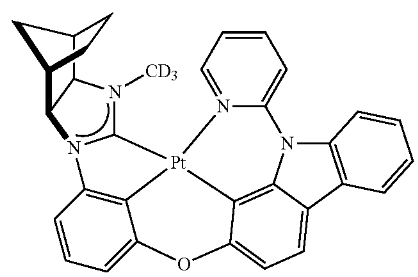

4

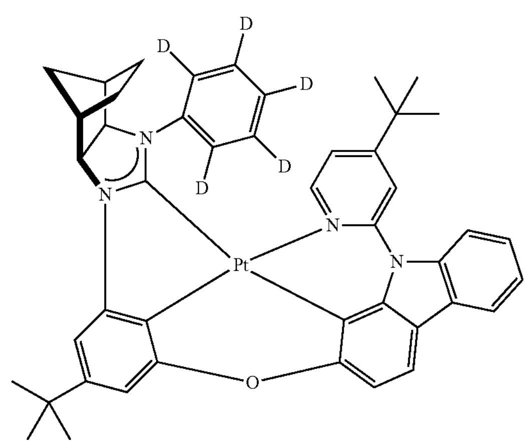

5
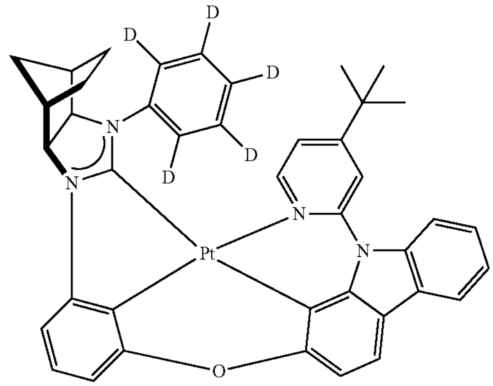
6
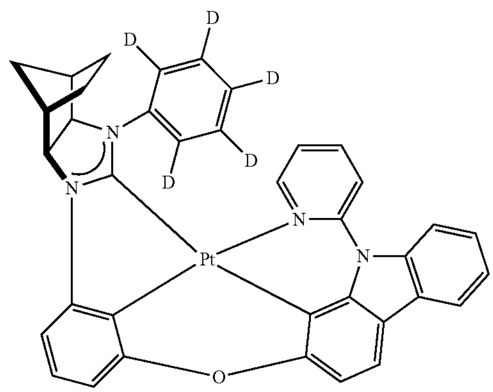
7
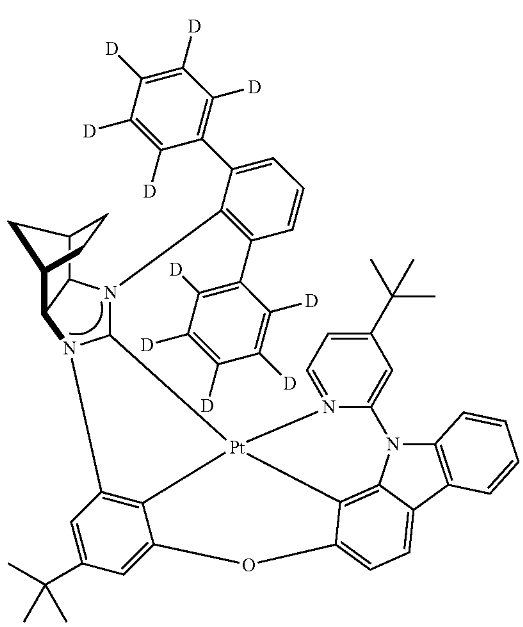
8
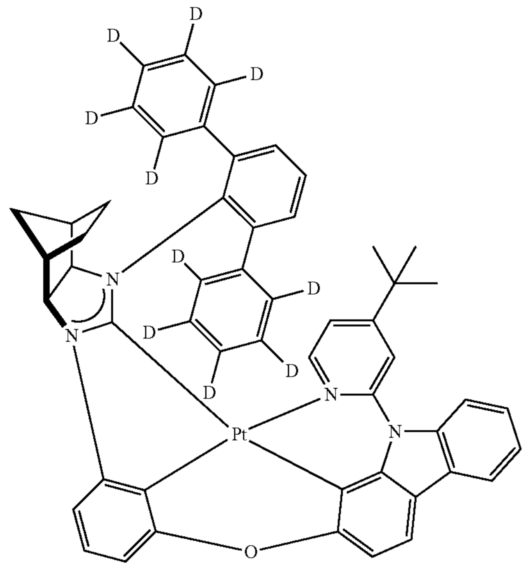
9
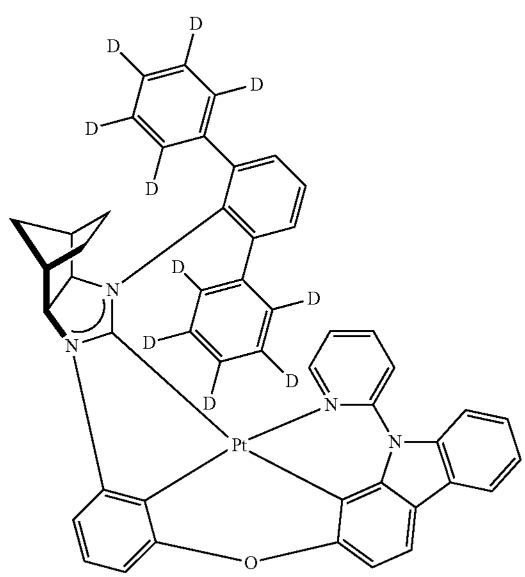

-continued
10
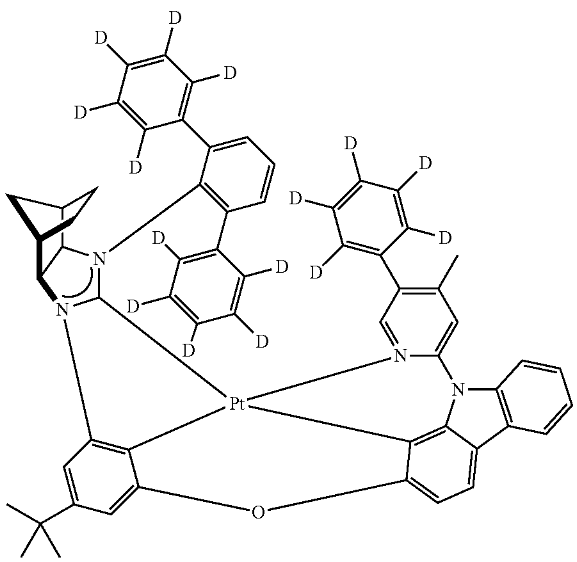
11
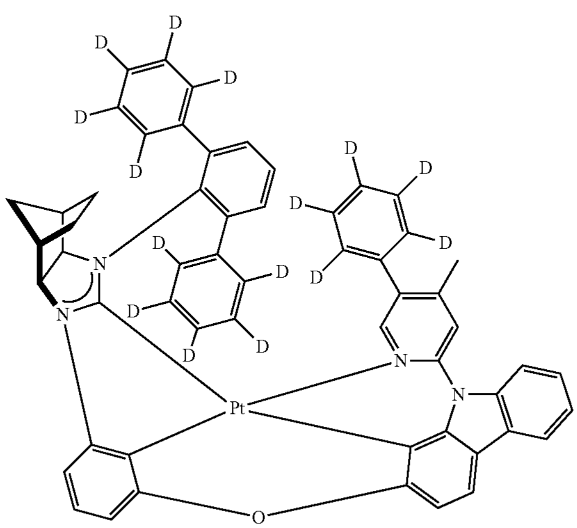
12
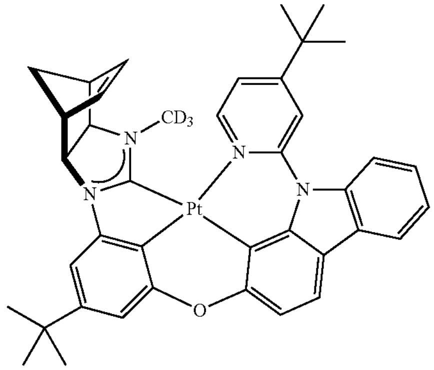
-continued
13
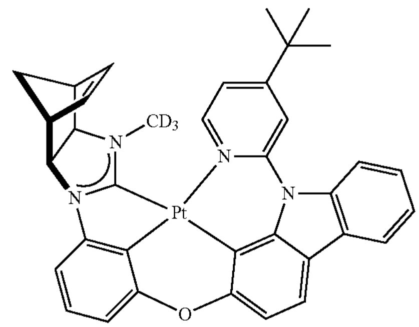
14
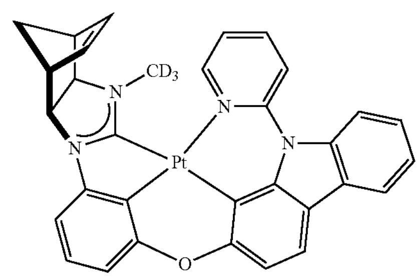
15
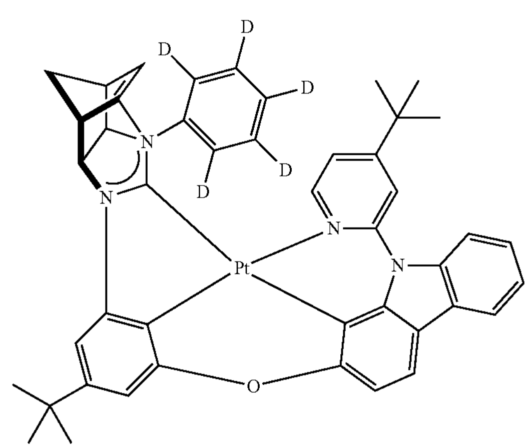
16
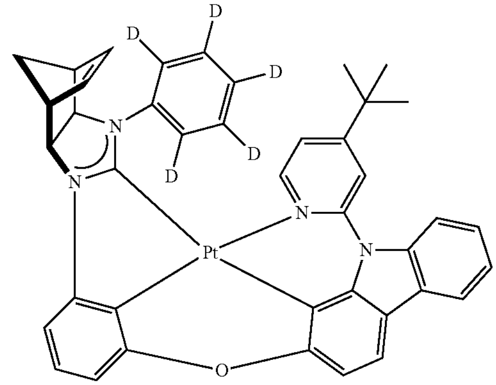

-continued
17
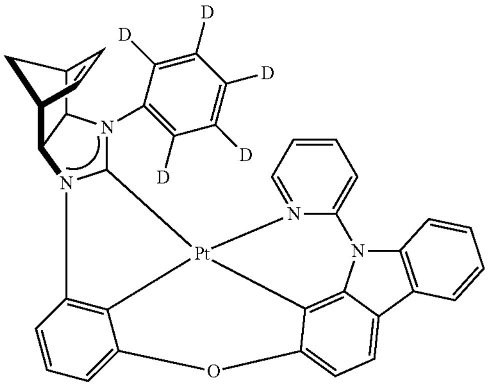
18
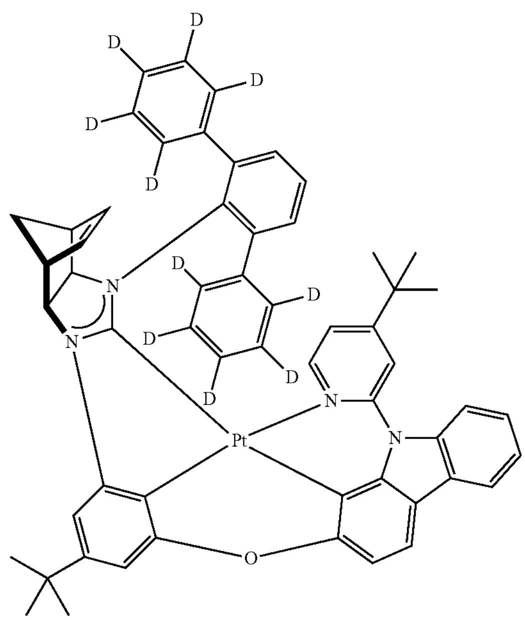
19
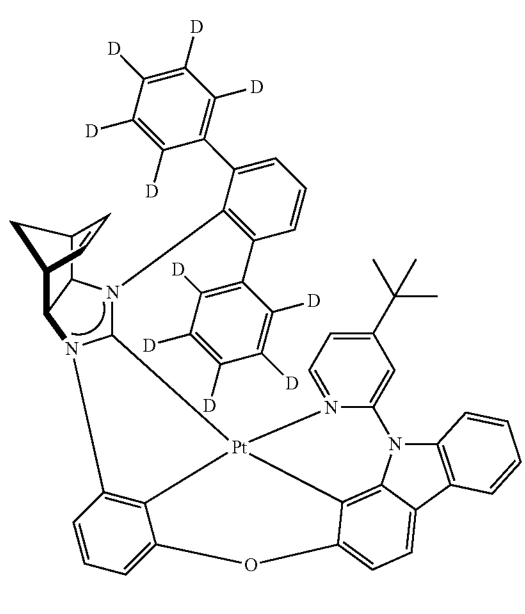
-continued
20
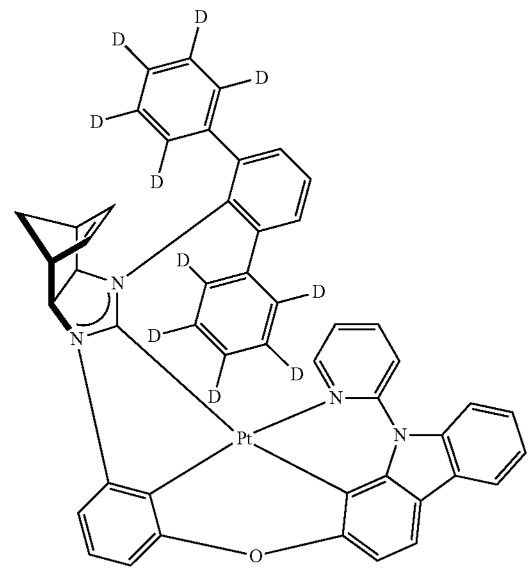
21
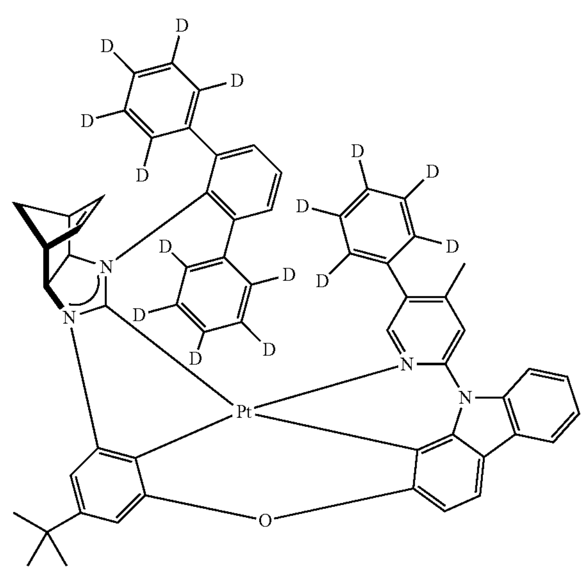

-continued
22
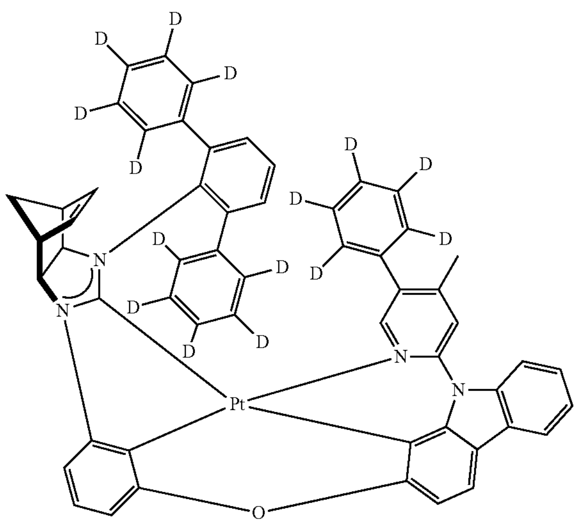
23
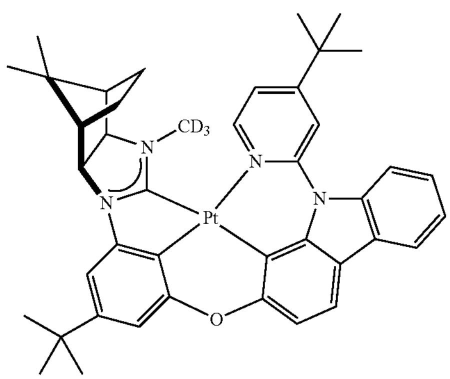
24
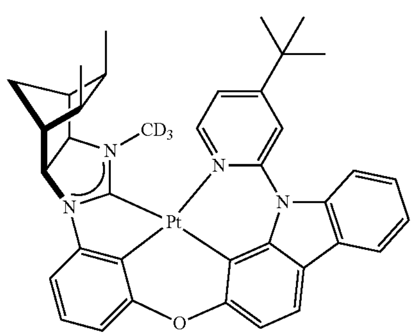
25
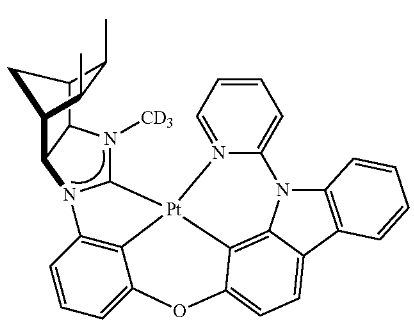
-continued
26
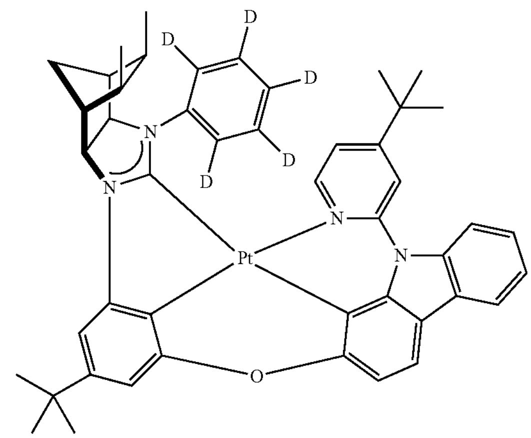
27
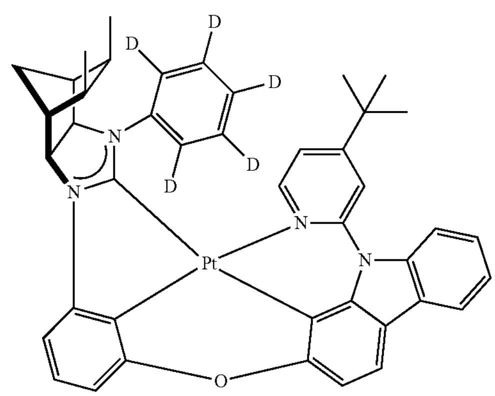
28
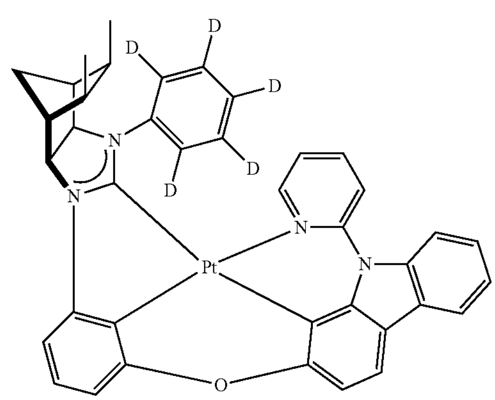

-continued
29
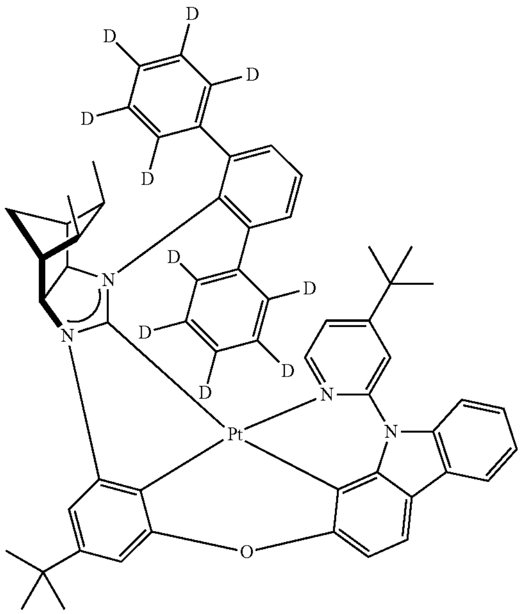
31
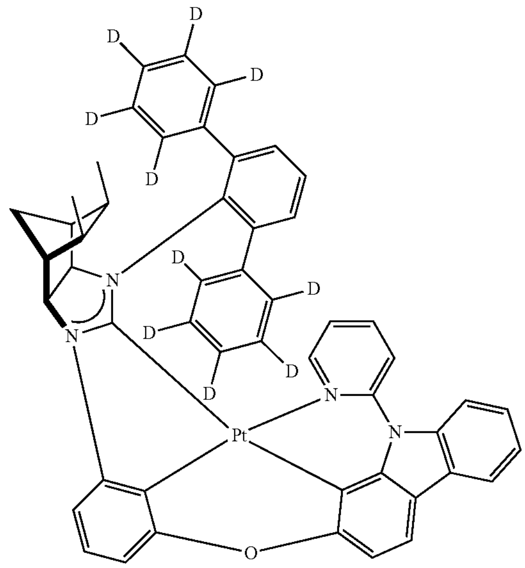
30
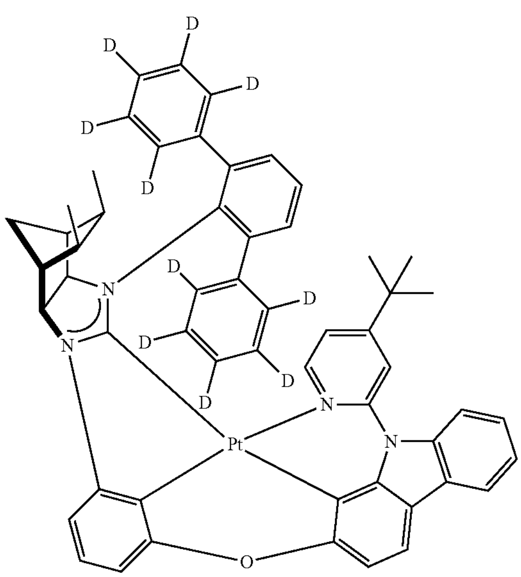
32
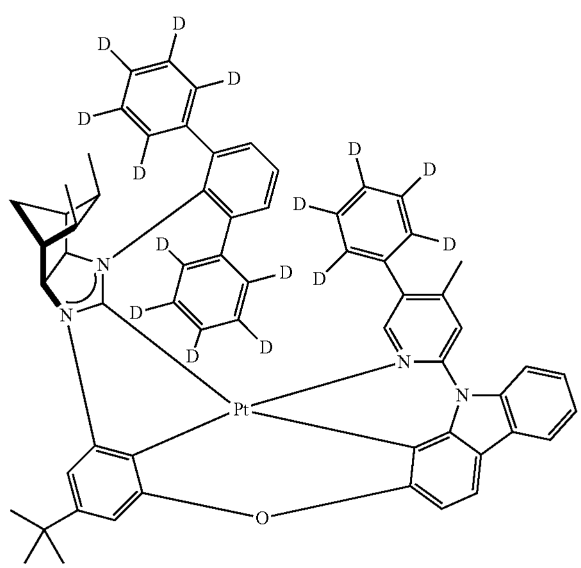

-continued
33
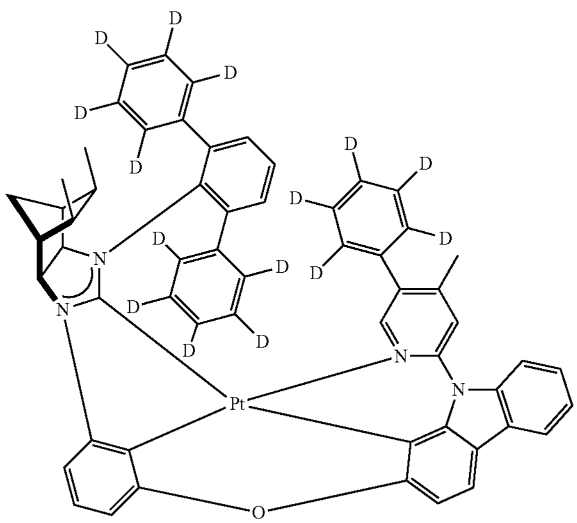
34
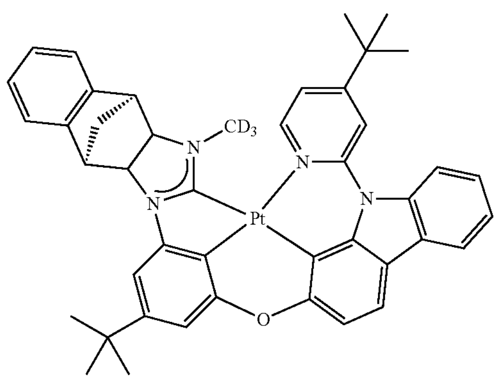
35
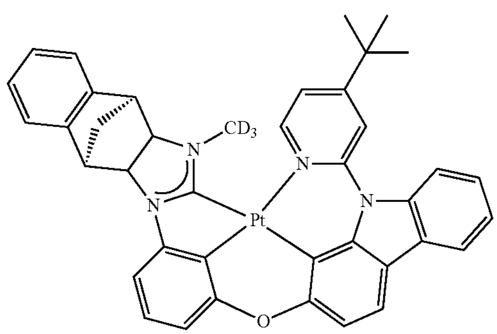
36
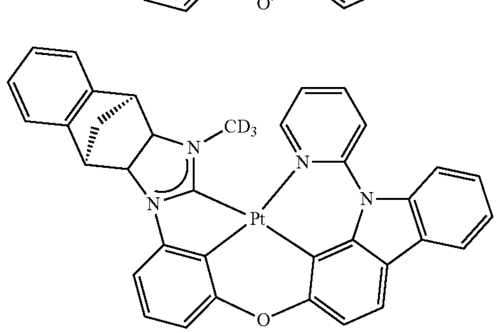
-continued
37
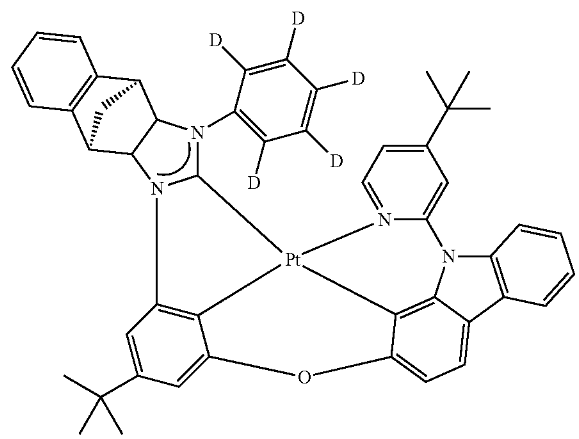
38
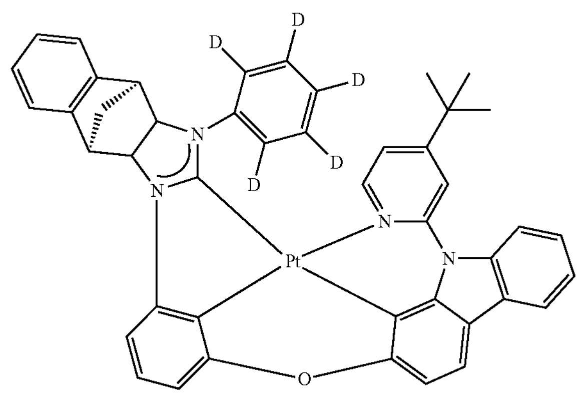
39
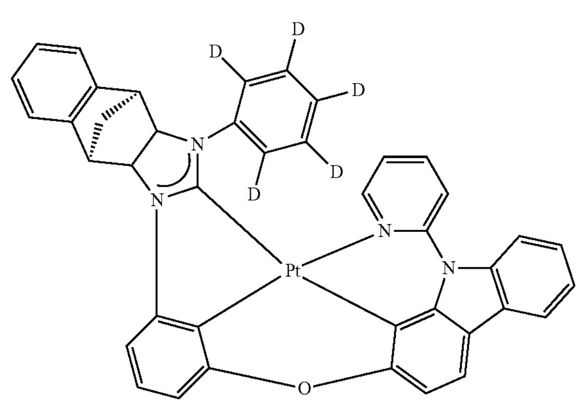

-continued
40
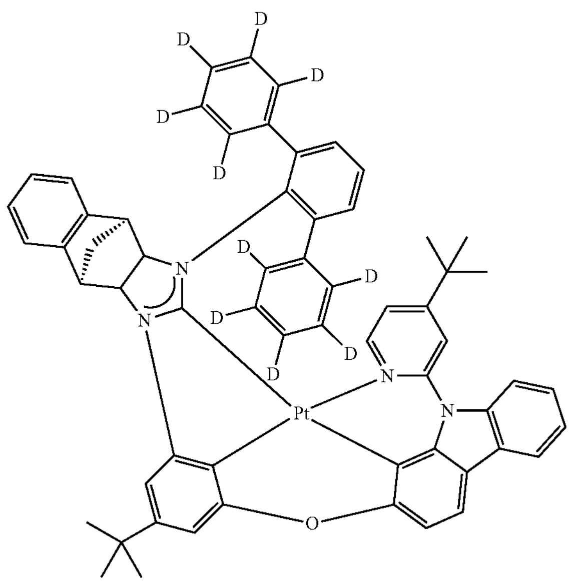
41
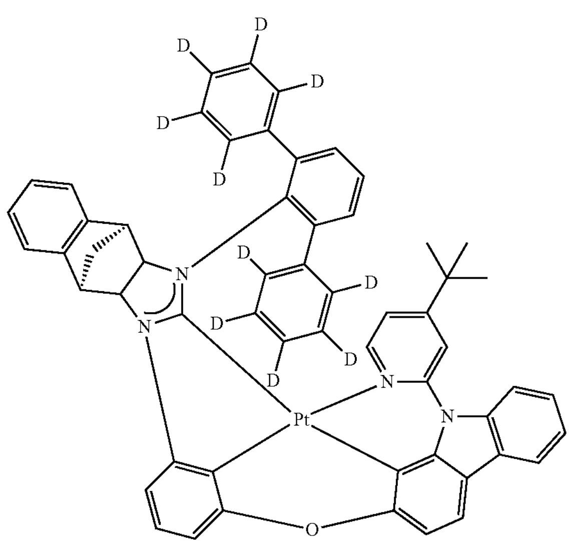
-continued
42
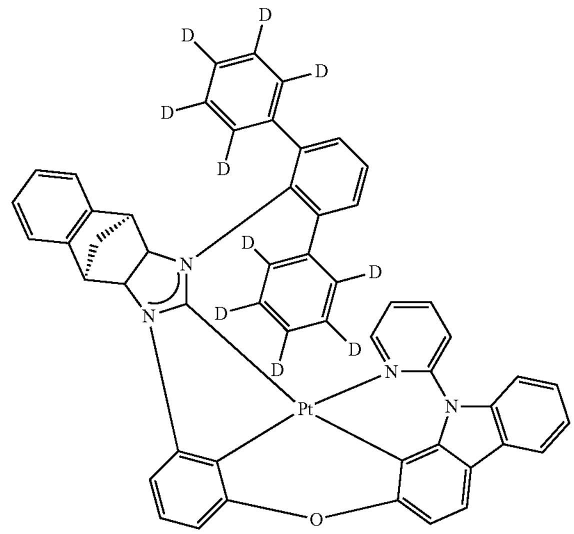
43
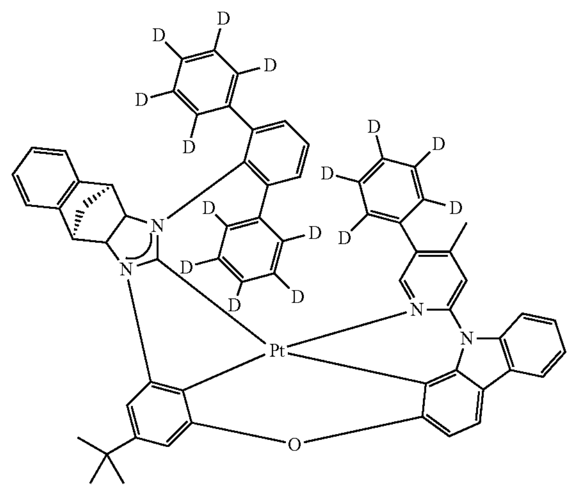
44
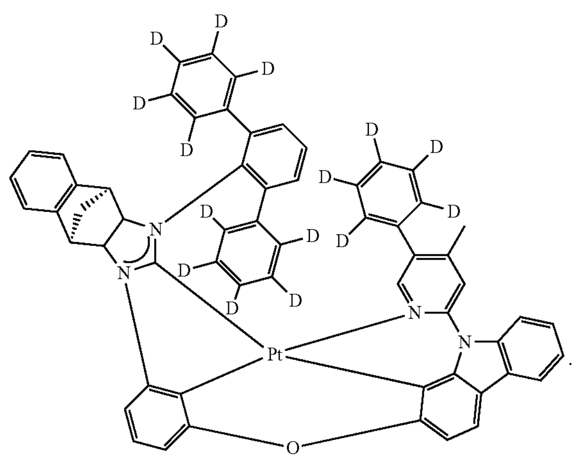
* * * * *